(12) United States Patent
Ito et al.

(10) Patent No.: US 12,154,929 B2
(45) Date of Patent: Nov. 26, 2024

(54) SEMICONDUCTOR ELEMENT

(71) Applicant: C/O SONY SEMICONDUCTOR SOLUTIONS CORPORATION, Kanagawa (JP)

(72) Inventors: Daisuke Ito, Kanagawa (JP); Kenichi Murata, Kanagawa (JP); Toshiko Hayashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 509 days.

(21) Appl. No.: 17/415,119

(22) PCT Filed: Nov. 22, 2019

(86) PCT No.: PCT/JP2019/045726
§ 371 (c)(1),
(2) Date: Jun. 17, 2021

(87) PCT Pub. No.: WO2020/137283
PCT Pub. Date: Jul. 2, 2020

(65) Prior Publication Data
US 2022/0052099 A1    Feb. 17, 2022

(30) Foreign Application Priority Data
Dec. 27, 2018  (JP) .................... 2018-245180

(51) Int. Cl.
*H01L 27/146* (2006.01)
*H01L 23/00* (2006.01)

(52) U.S. Cl.
CPC ........ *H01L 27/14634* (2013.01); *H01L 24/08* (2013.01); *H01L 24/80* (2013.01);
(Continued)

(58) Field of Classification Search
CPC ... H01L 24/08; H01L 24/80; H01L 27/14623; H01L 27/14627; H01L 27/14634; H01L 27/14636; H01L 27/14649; H01L 27/469
See application file for complete search history.

(56) References Cited

U.S. PATENT DOCUMENTS

2003/0034497 A1\*  2/2003  Yamazaki .............. H10K 71/00
                                                              257/86
2008/0067622 A1    3/2008  Bui et al.
(Continued)

FOREIGN PATENT DOCUMENTS

CN        102637712 A     8/2012
CN        102779824 A     11/2012
(Continued)

OTHER PUBLICATIONS

International Search Report and Written Opinion of PCT Application No. PCT/JP2019/045726, issued on Feb. 10, 2020, 09 pages of ISRWO.

*Primary Examiner* — Brook Kebede
(74) *Attorney, Agent, or Firm* — CHIP LAW GROUP

(57) ABSTRACT

A first semiconductor element according to one embodiment of the present disclosure includes an element substrate including an element region, a peripheral region, a readout circuit substrate, a first electrode, a second electrode, and an insulating layer. A wiring layer and a first semiconductor layer including a compound semiconductor material are provided as a stack in the element region. The peripheral region is outside the element region. The readout circuit substrate is opposed to the first semiconductor layer with the wiring layer interposed therebetween, and is electrically coupled to the first semiconductor layer with the wiring layer interposed therebetween. The first electrode is provided in the wiring layer and is electrically coupled to the first semiconductor layer. The second electrode is opposed to (Continued)

the first electrode with the first semiconductor layer interposed therebetween. The insulating layer is provided on the second electrode and has a non-reducing property.

19 Claims, 47 Drawing Sheets

(52) U.S. Cl.
CPC .. *H01L 27/14623* (2013.01); *H01L 27/14627* (2013.01); *H01L 27/14636* (2013.01); *H01L 27/14649* (2013.01); *H01L 27/1469* (2013.01); *H01L 2224/08145* (2013.01); *H01L 2224/80006* (2013.01); *H01L 2224/80895* (2013.01); *H01L 2224/80896* (2013.01)

(56) References Cited

U.S. PATENT DOCUMENTS

| | | | | |
|---|---|---|---|---|
| 2011/0102657 | A1* | 5/2011 | Takahashi | H01L 21/76898 |
| | | | | 257/E27.122 |
| 2018/0114807 | A1* | 4/2018 | Yamagishi | H01L 23/5286 |

FOREIGN PATENT DOCUMENTS

| | | | |
|---|---|---|---|
| JP | 2014-521216 A | 8/2014 | |
| JP | 2017-022313 A | 1/2017 | |
| TW | 201218363 A | 5/2012 | |
| TW | 201304064 A | 1/2013 | |
| WO | WO-2018194030 A1 * | 10/2018 | ............. H01L 21/74 |

* cited by examiner

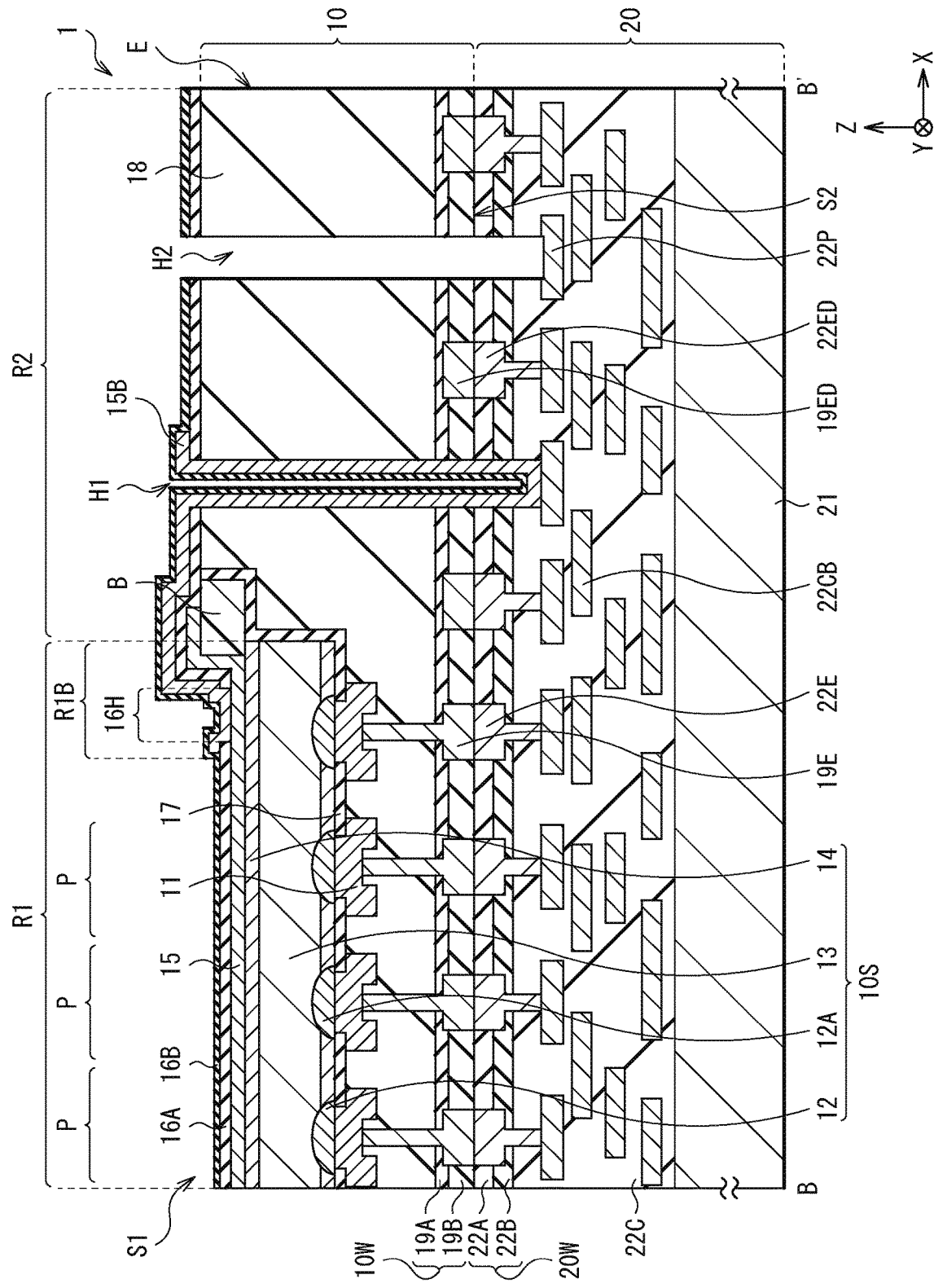
[FIG. 1]

[FIG. 2]
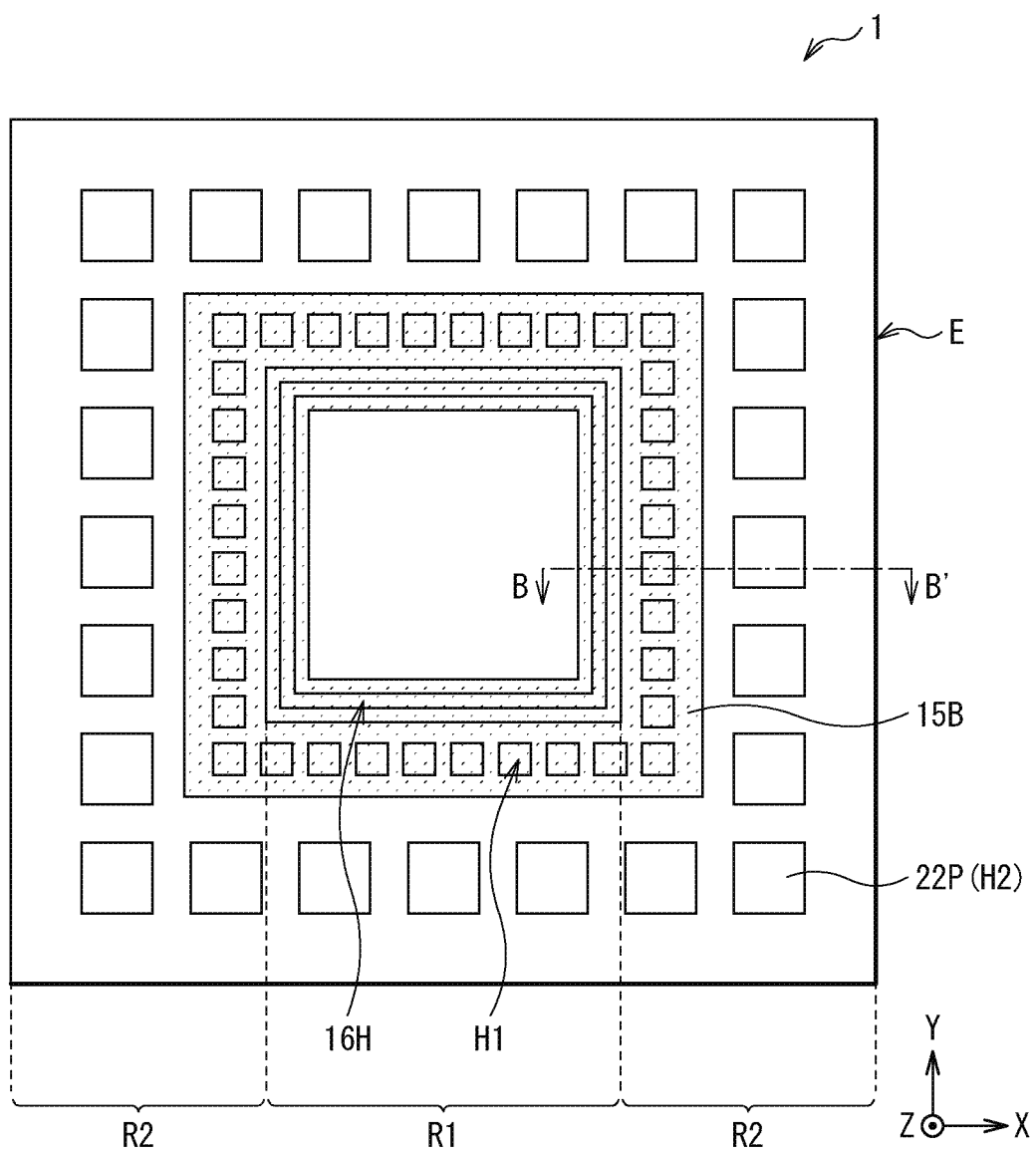

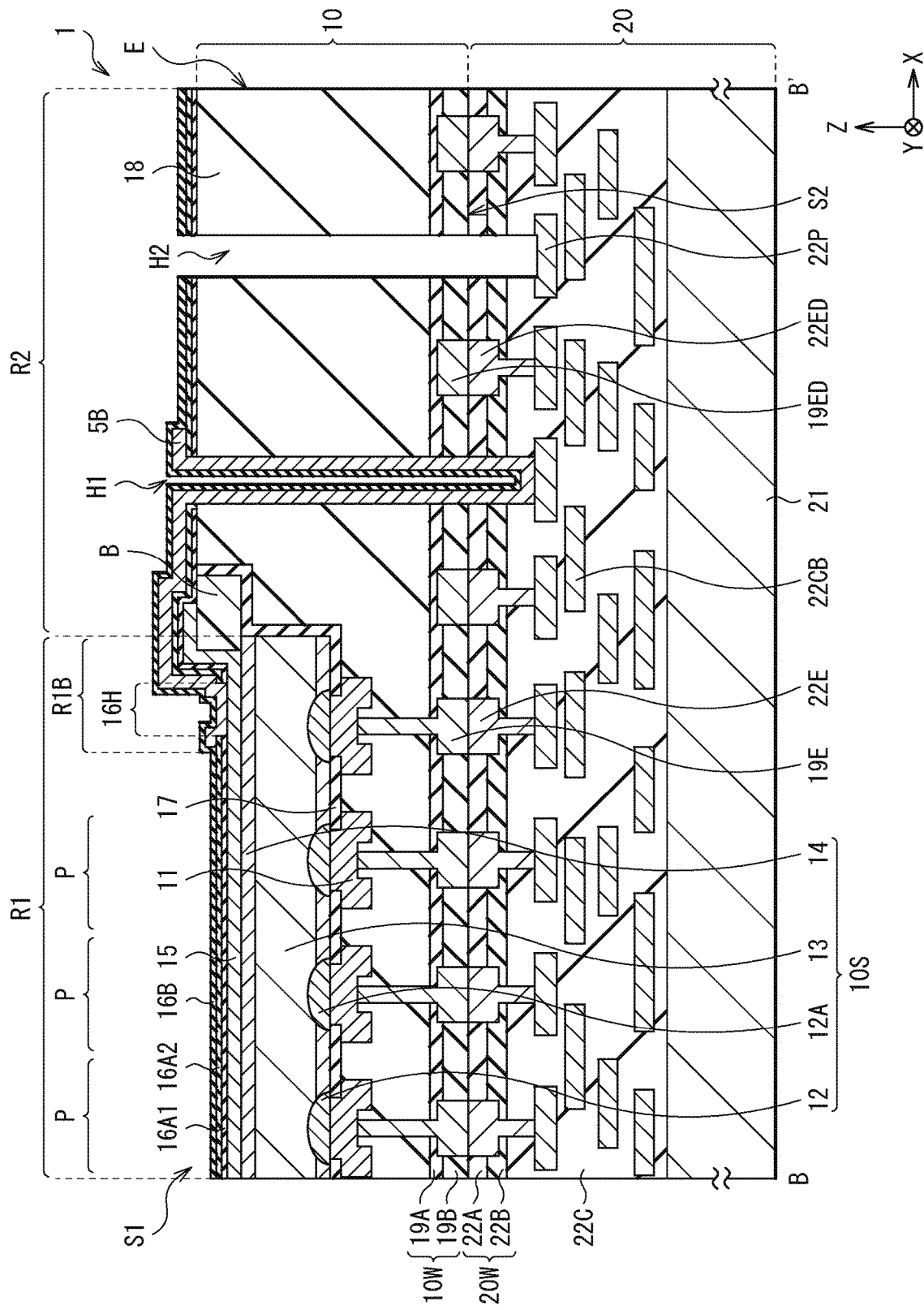
[FIG. 3]

[FIG. 4]
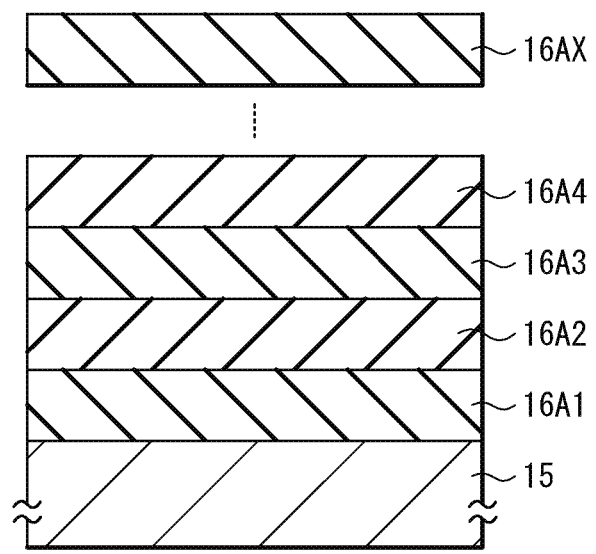

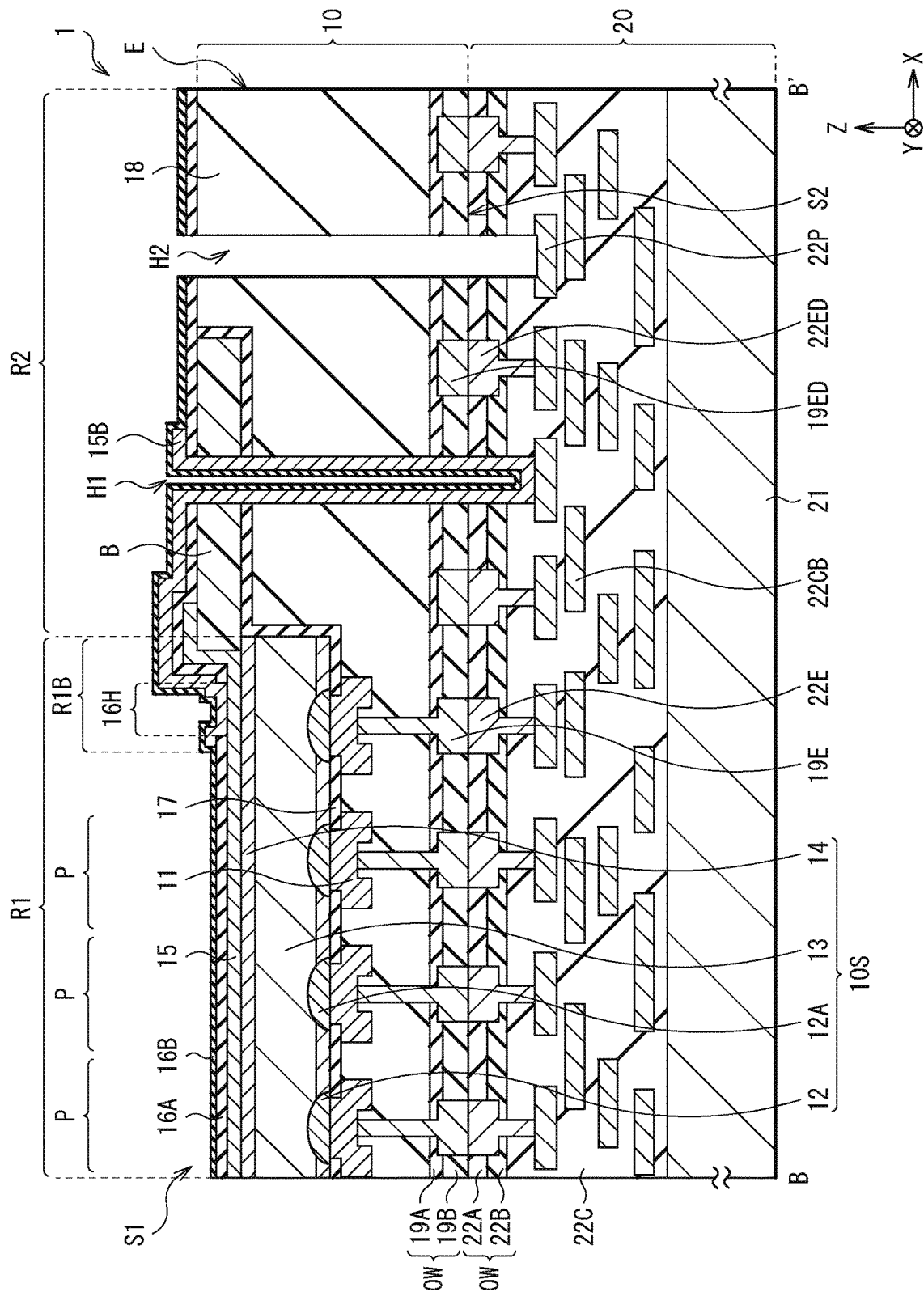
[FIG. 5]

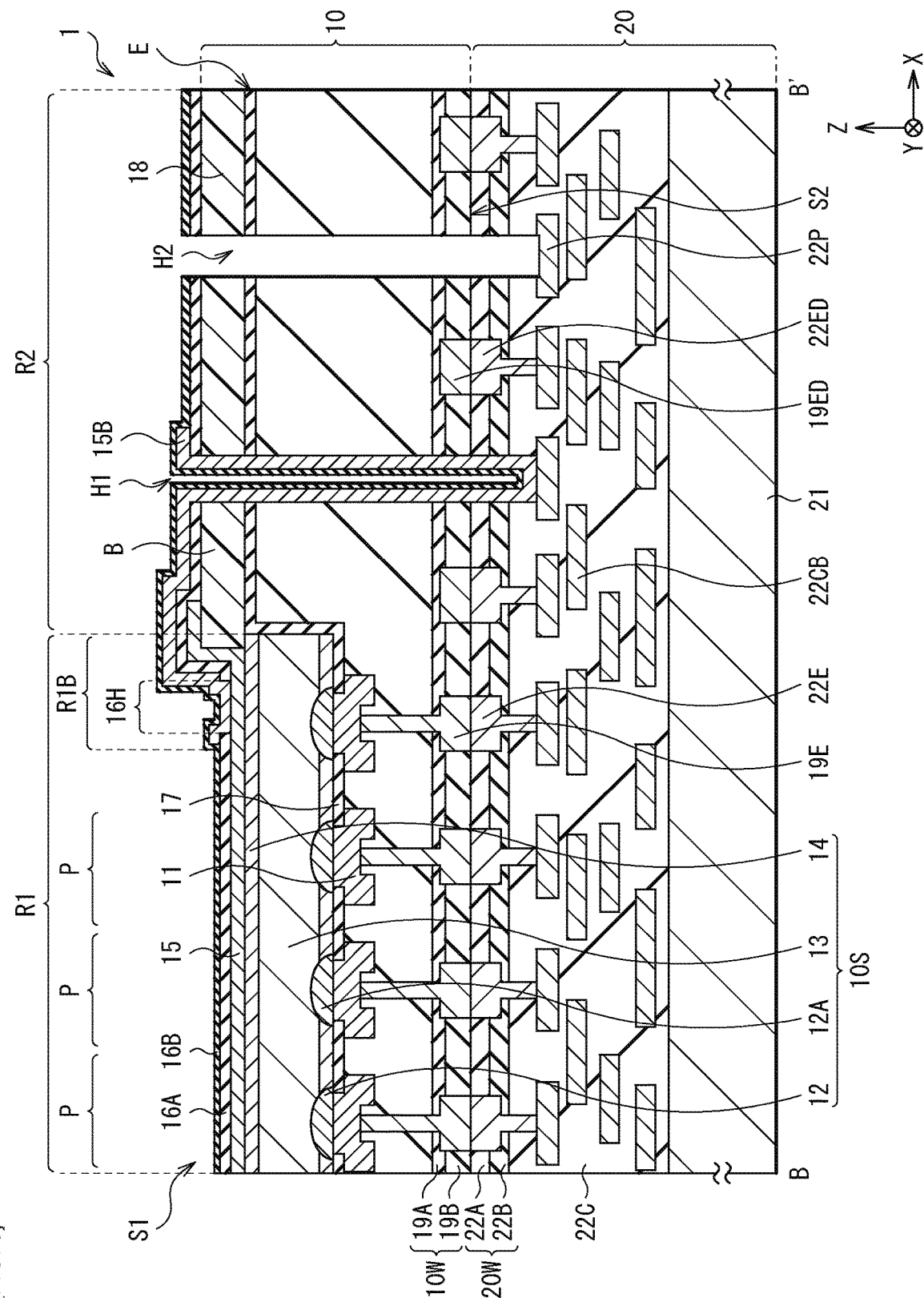

[FIG. 7A]
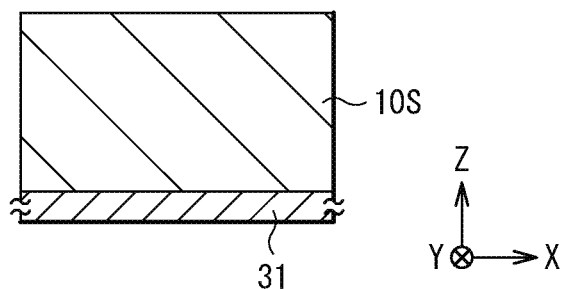
[FIG. 7B]
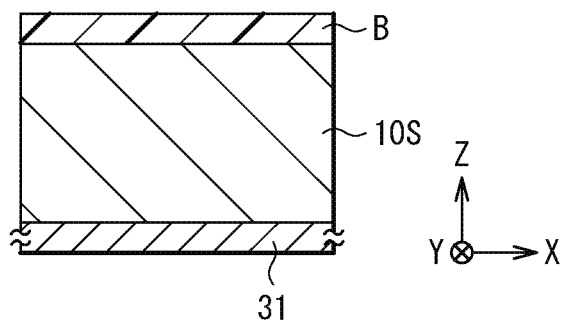
[FIG. 7C]
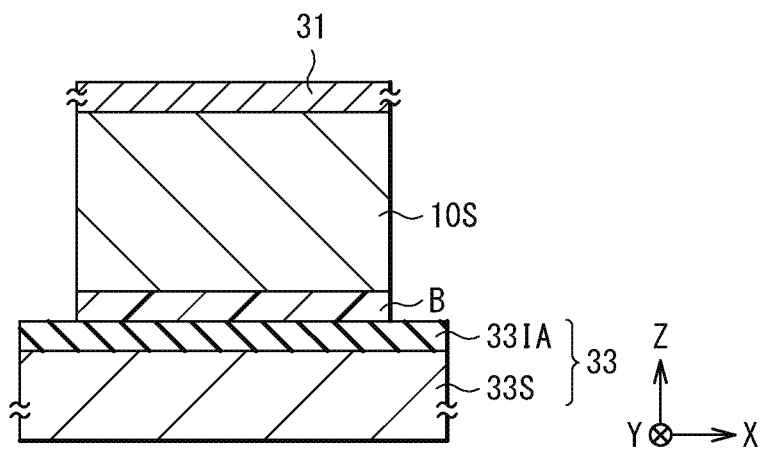

[FIG. 8]
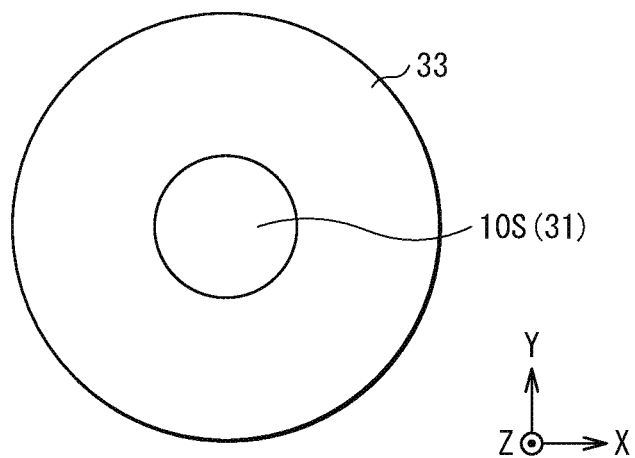
[FIG. 9]
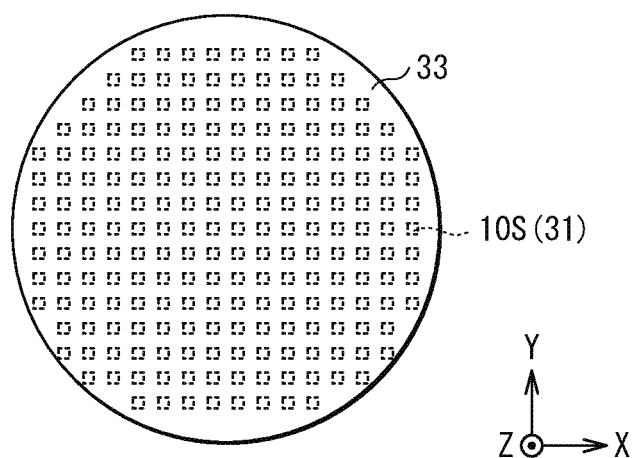

[FIG. 10A]
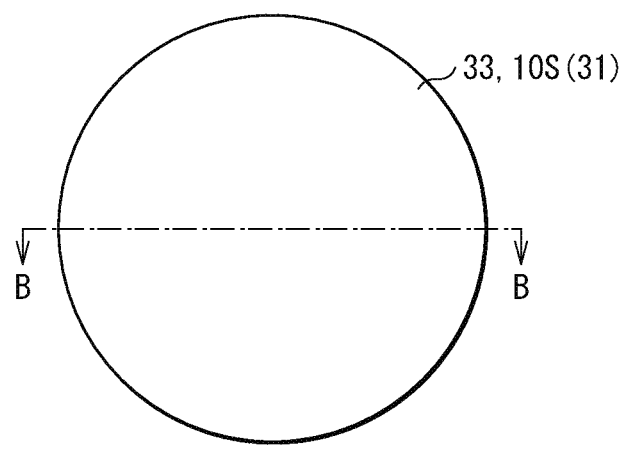
[FIG. 10B]
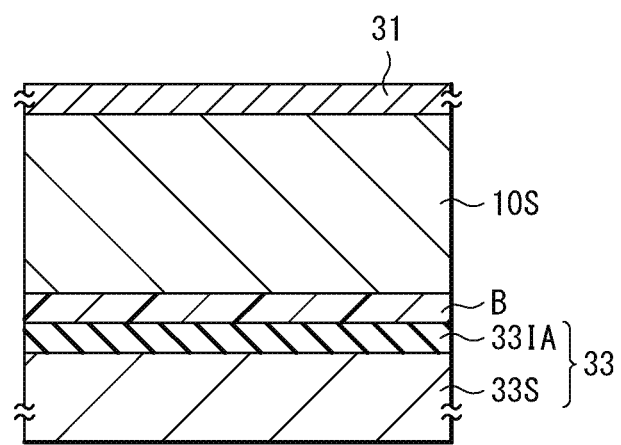

[FIG. 11A]
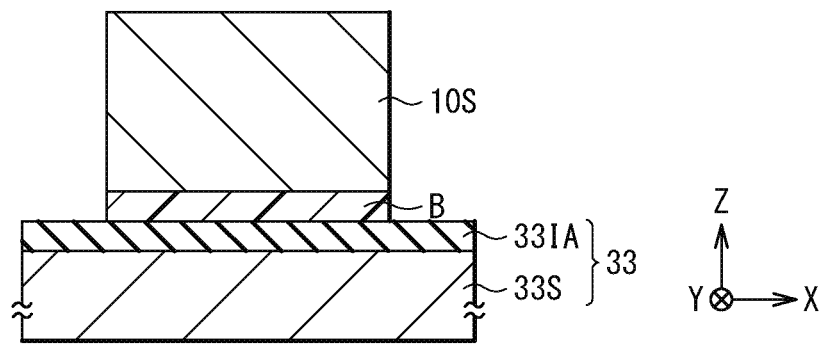
[FIG. 11B]
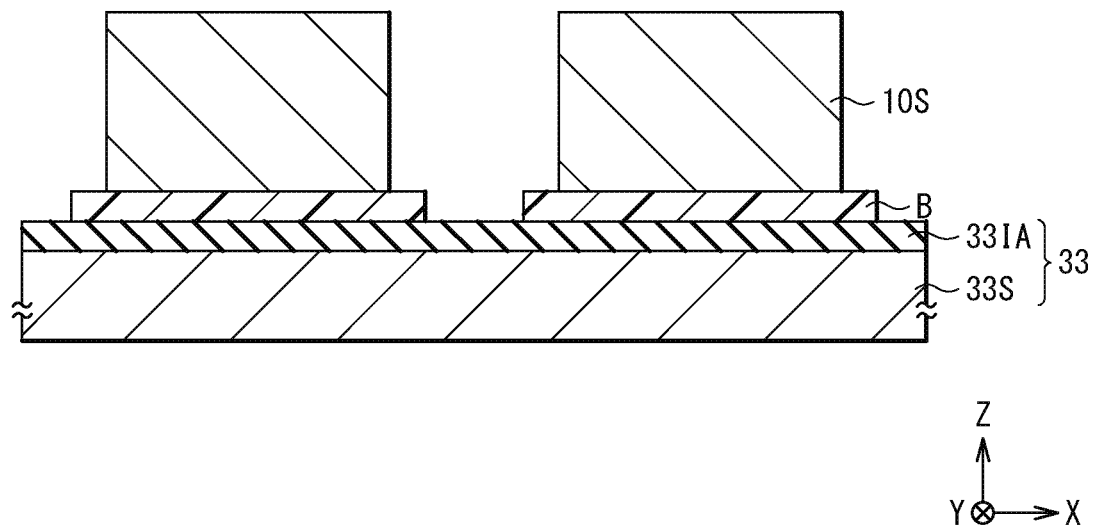

[FIG. 12A]
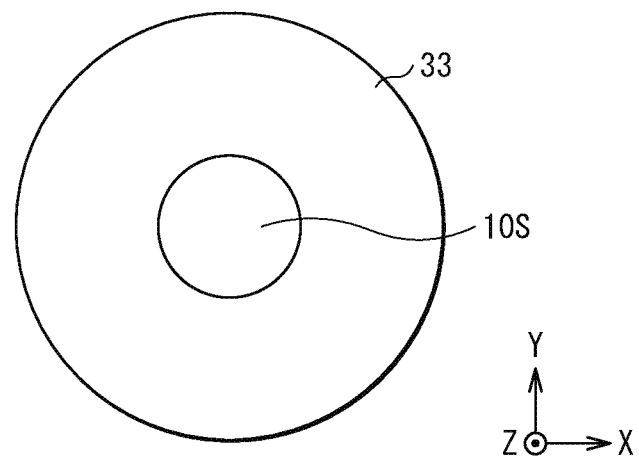
[FIG. 12B]
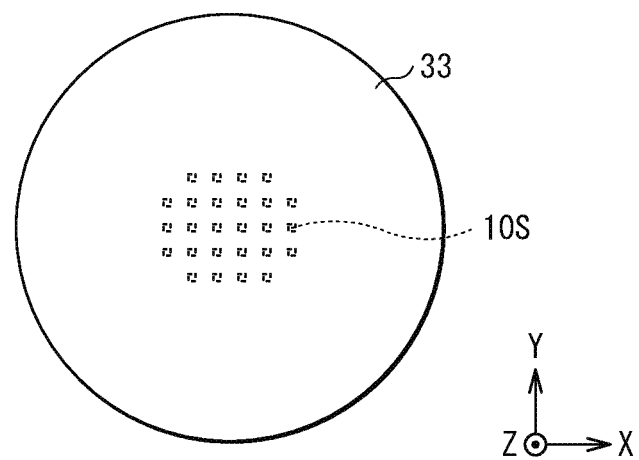

[FIG. 13A]
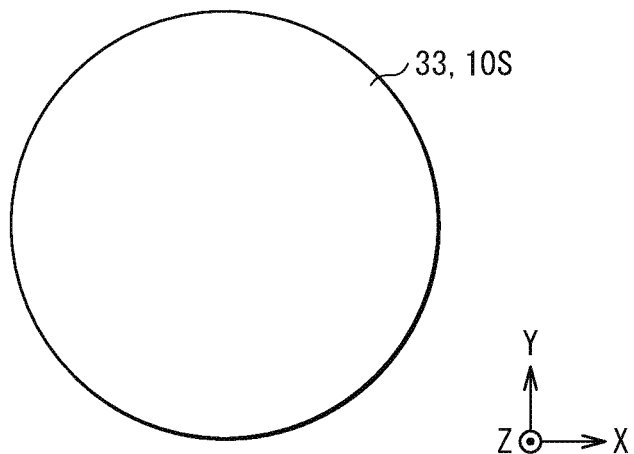
[FIG. 13B]
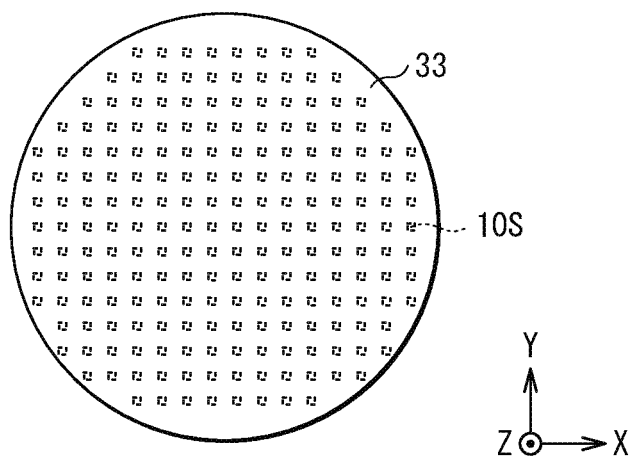

[FIG. 14A]
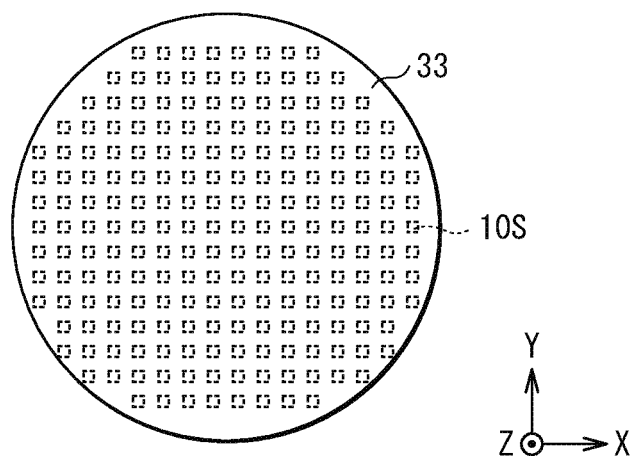
[FIG. 14B]
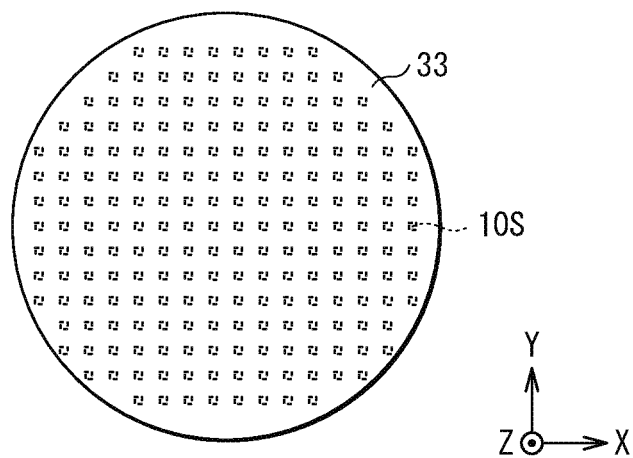

[FIG. 15]
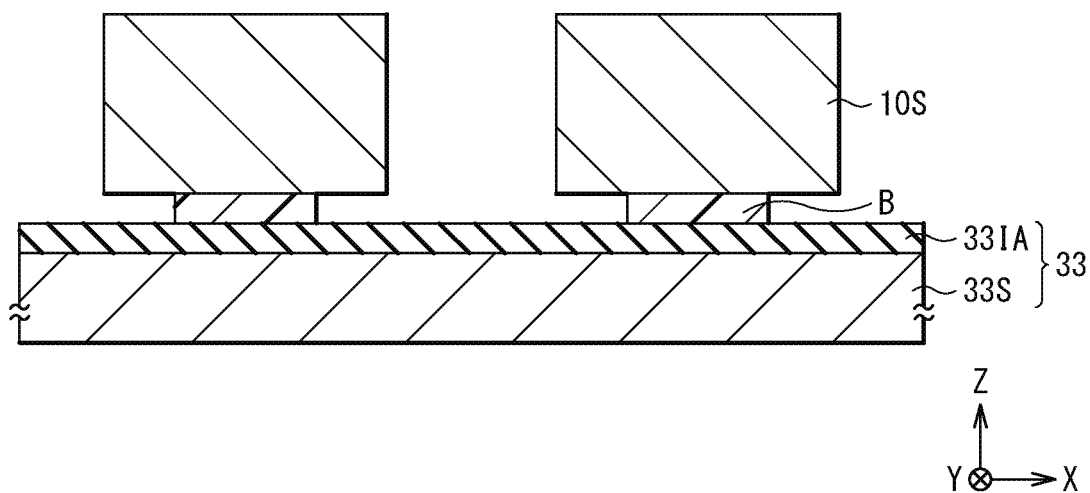
[FIG. 16]
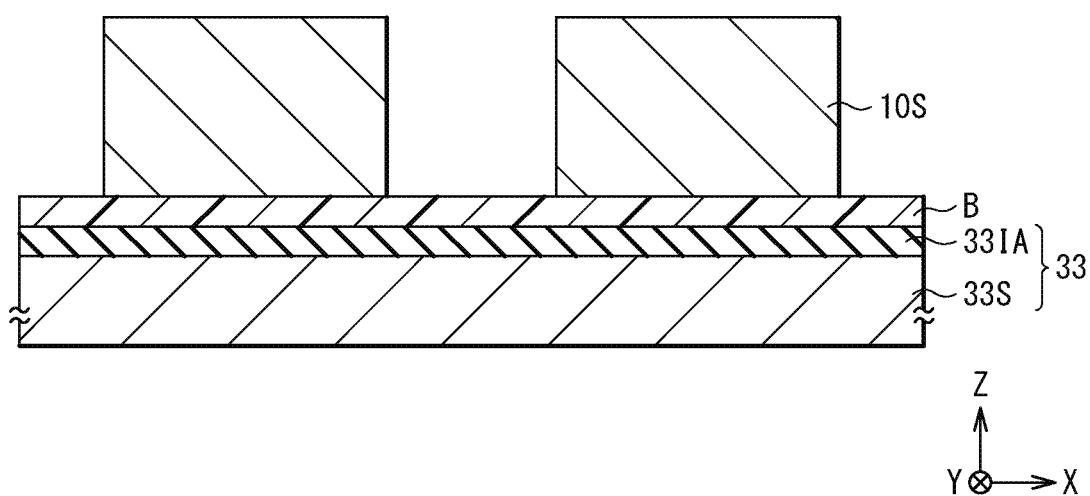

[FIG. 17A]
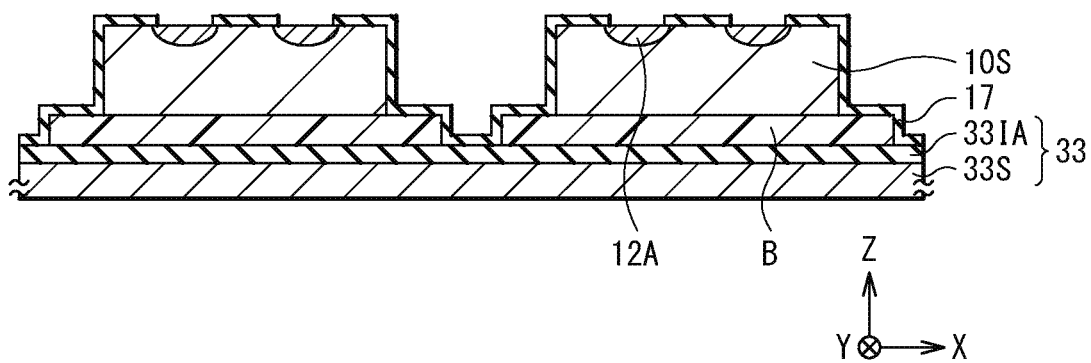
[FIG. 17B]
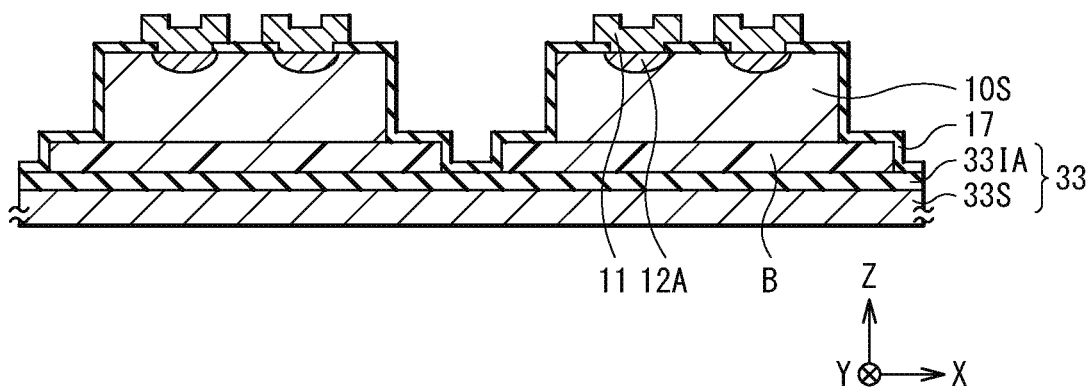

[FIG. 17C]
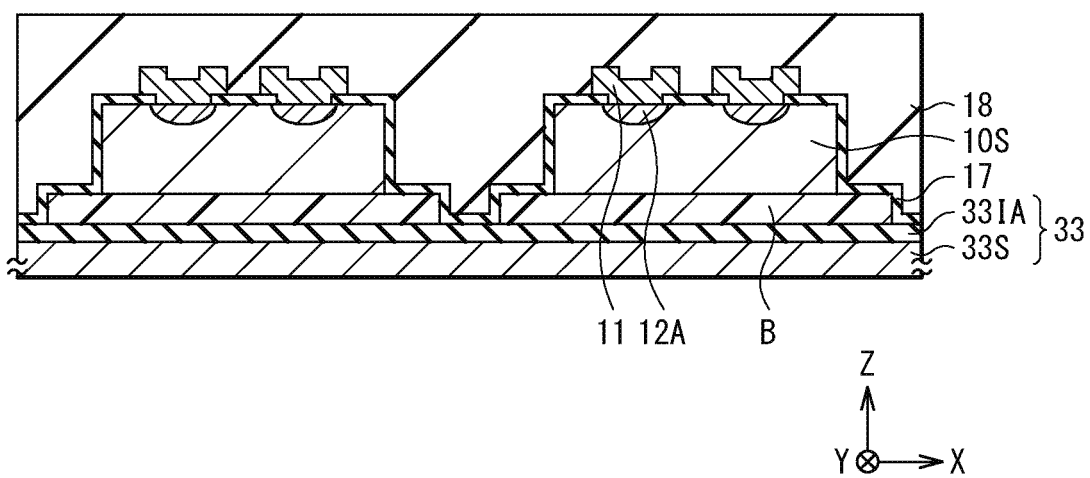
[FIG. 17D]
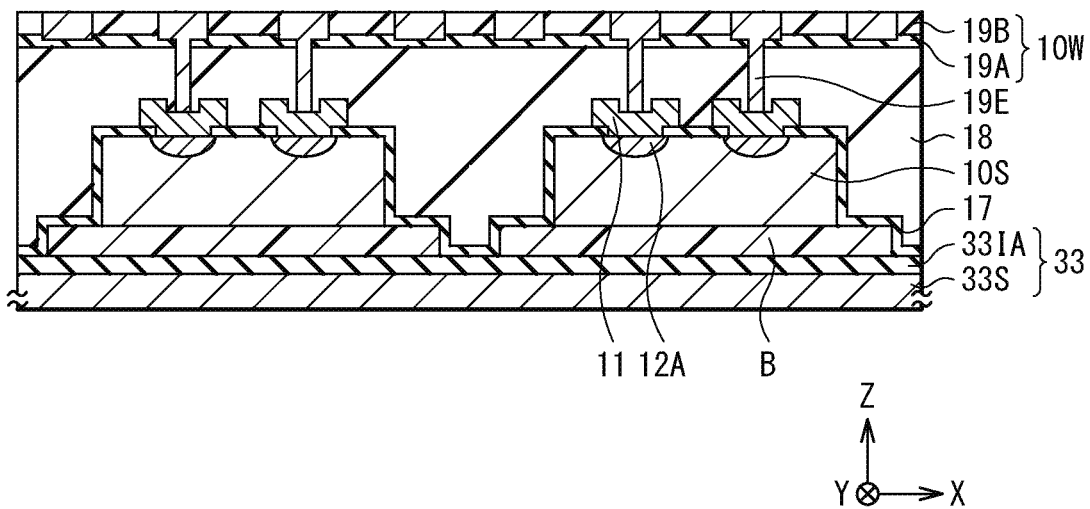

[FIG. 17E]
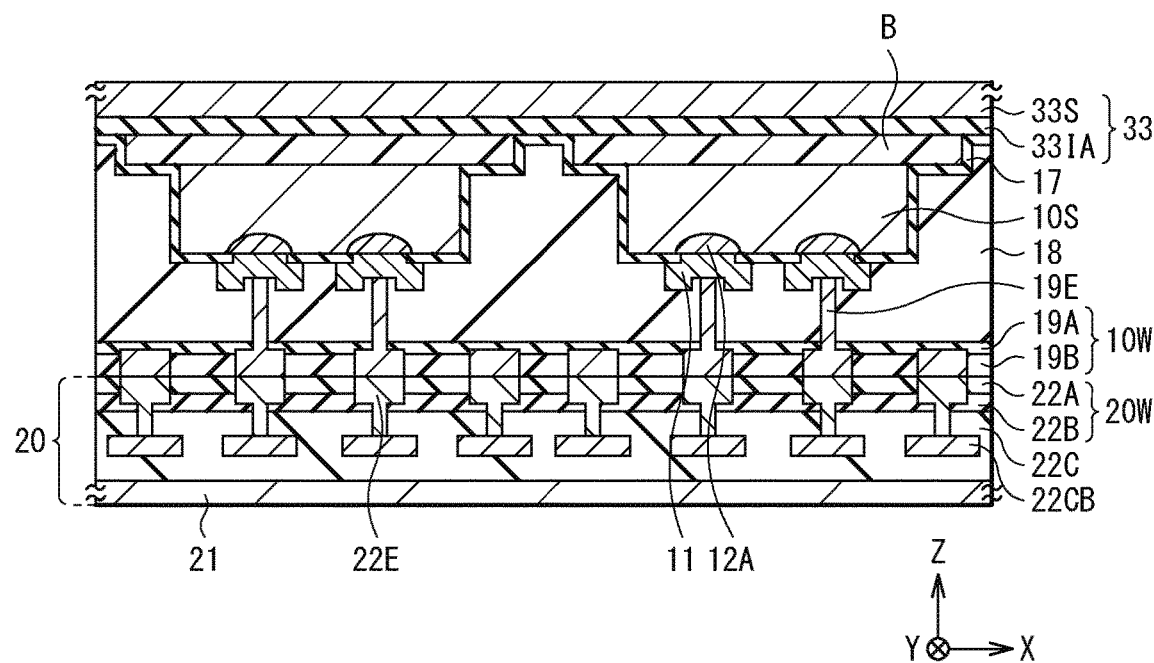
[FIG. 17F]
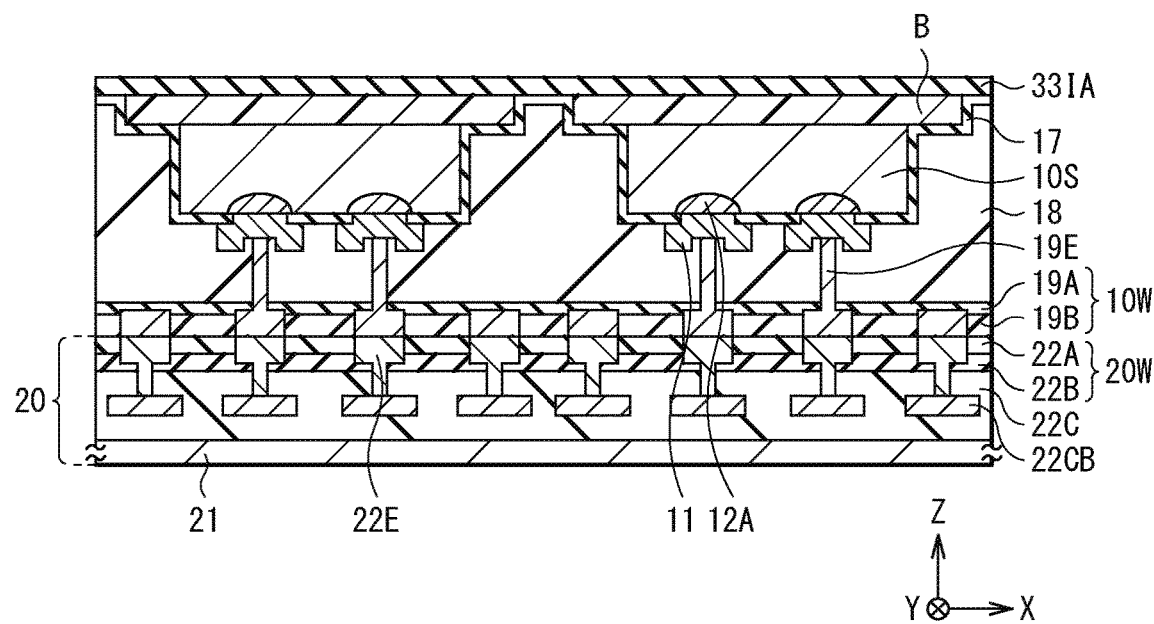

[FIG. 17G]
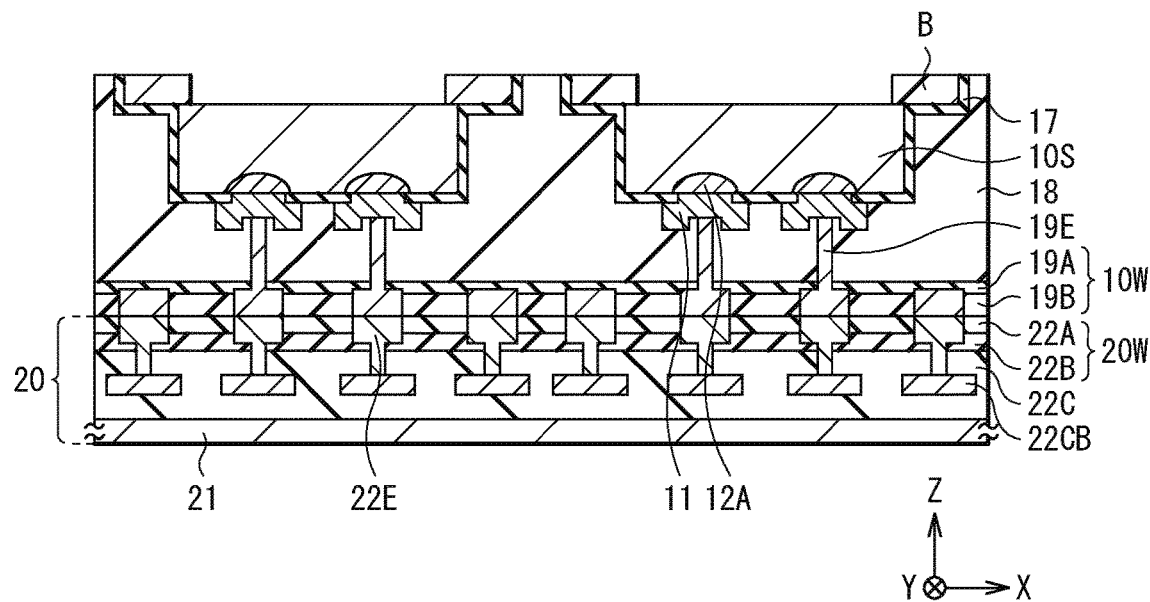
[FIG. 17H]
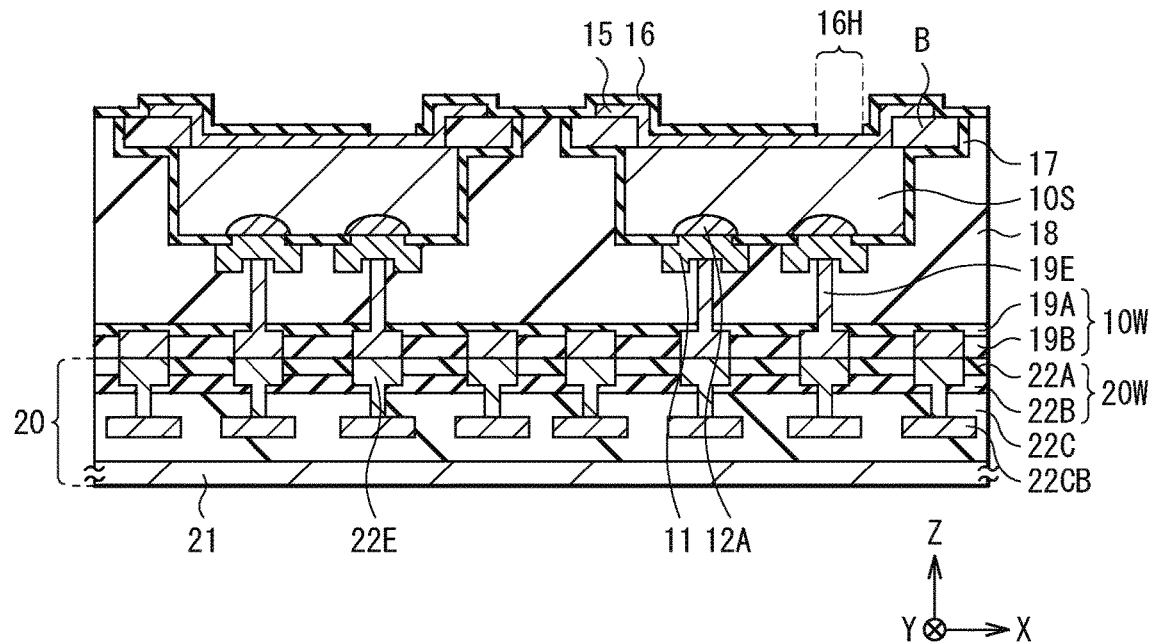

[FIG. 17I]
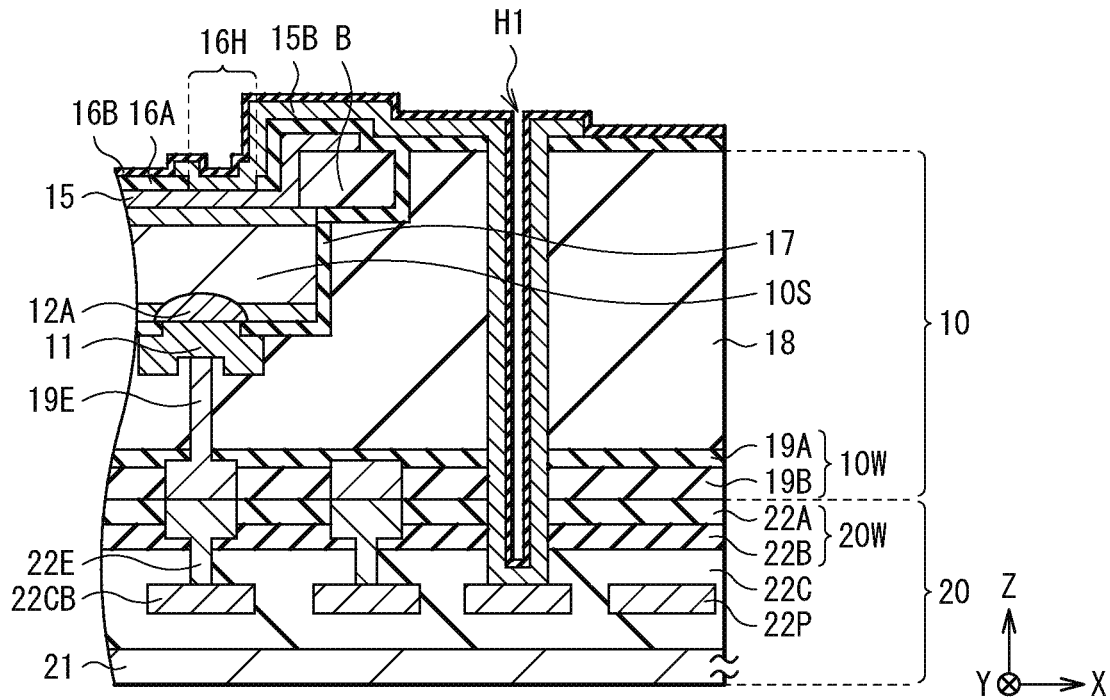
[FIG. 17J]
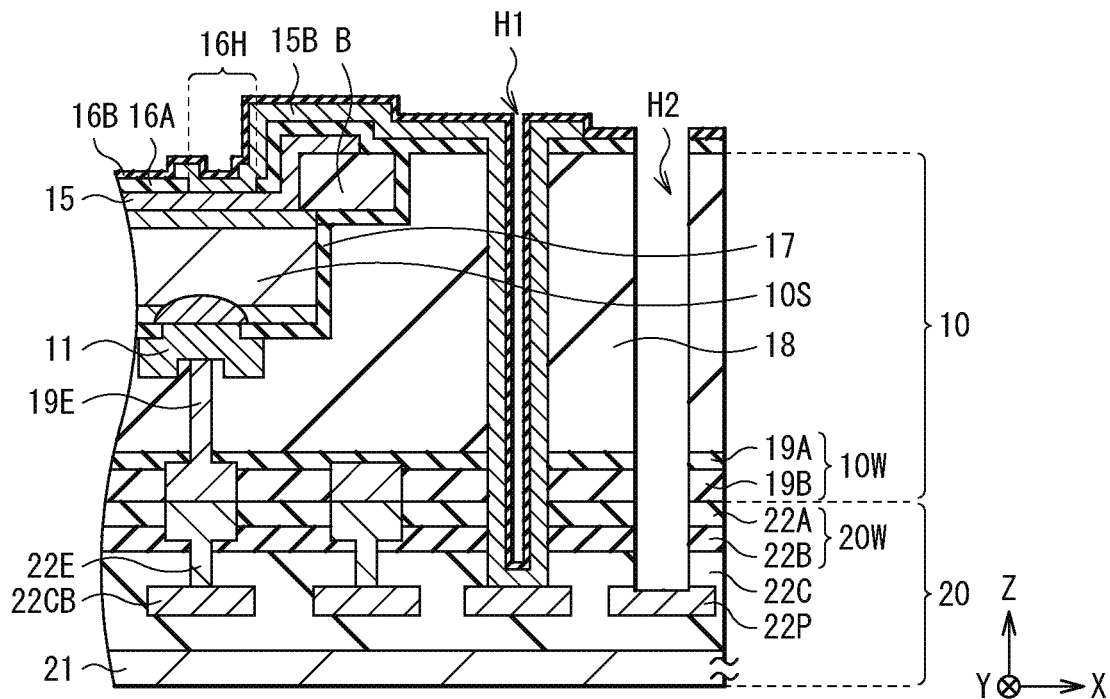

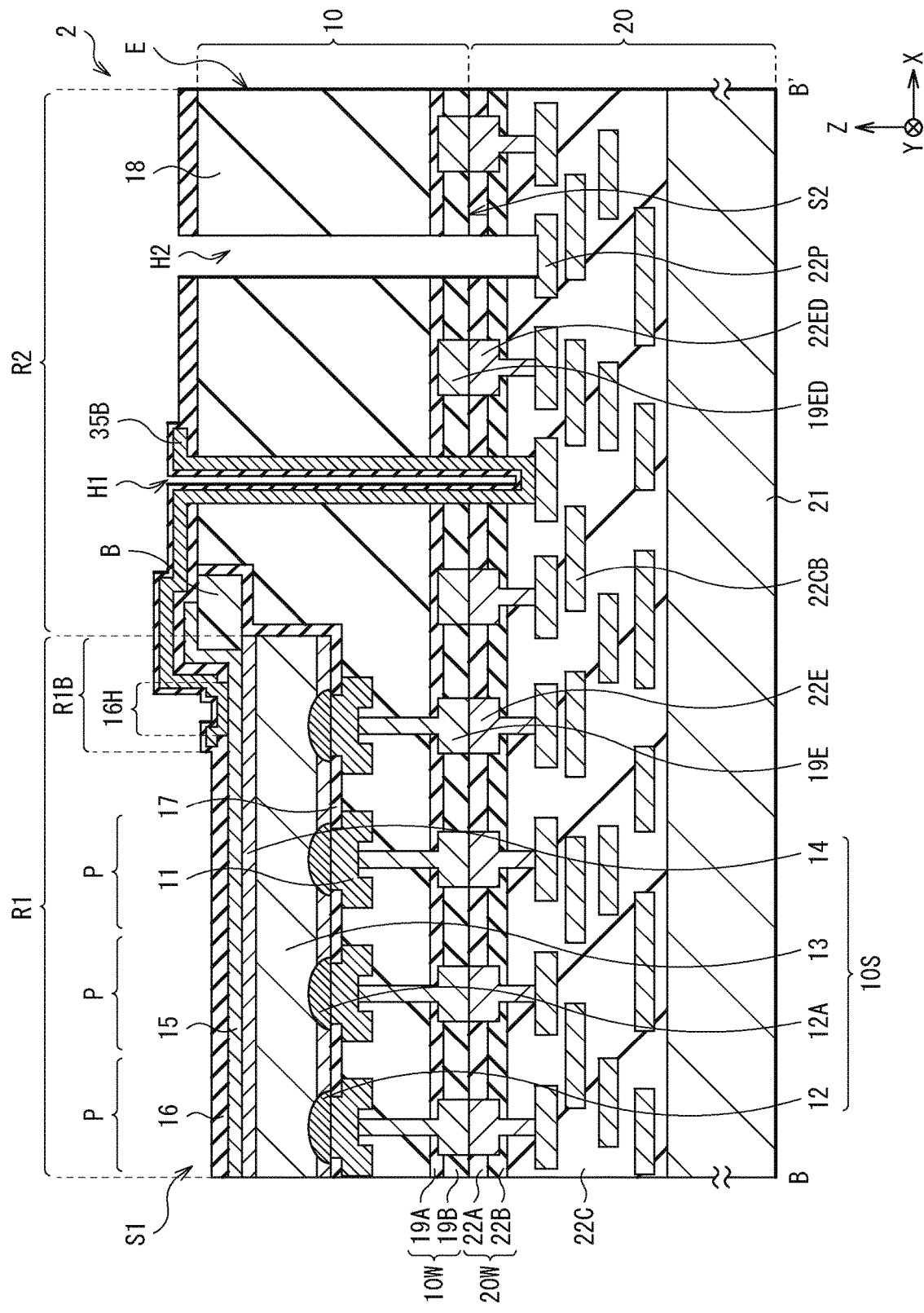
[FIG. 18]

[FIG. 19]
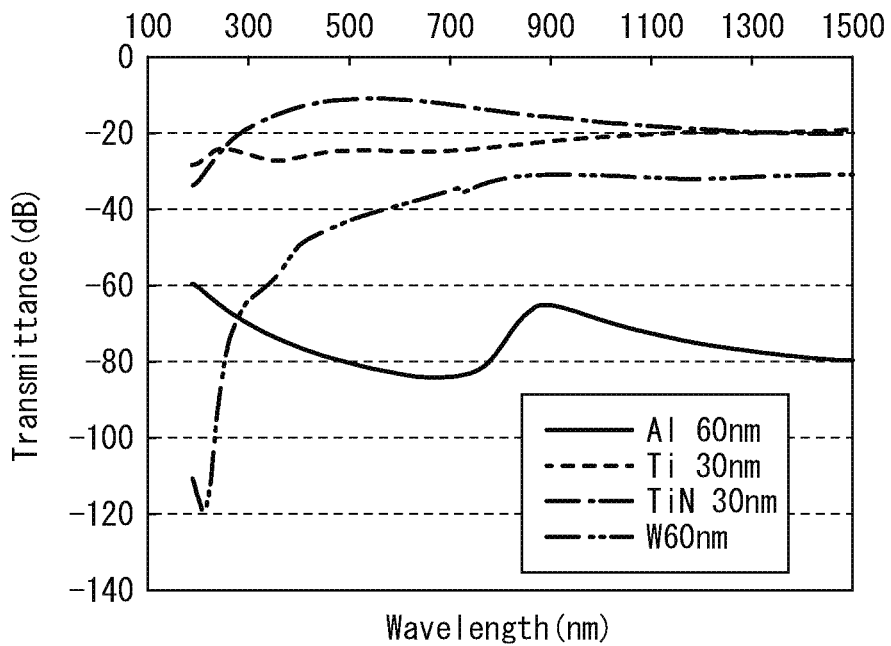
[FIG. 20]
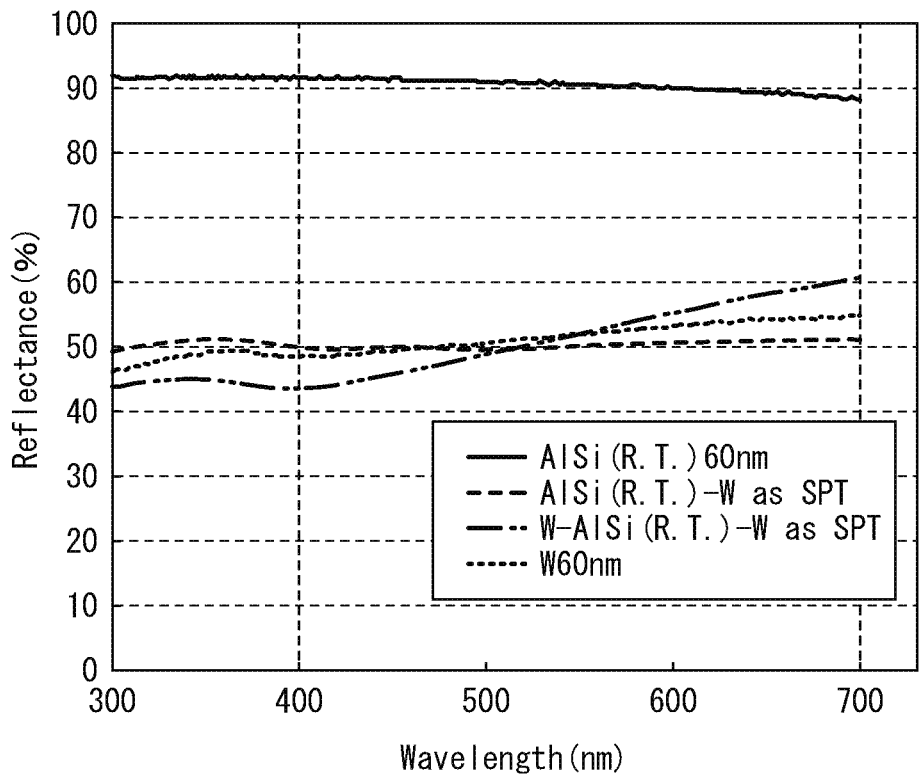

[FIG. 21]
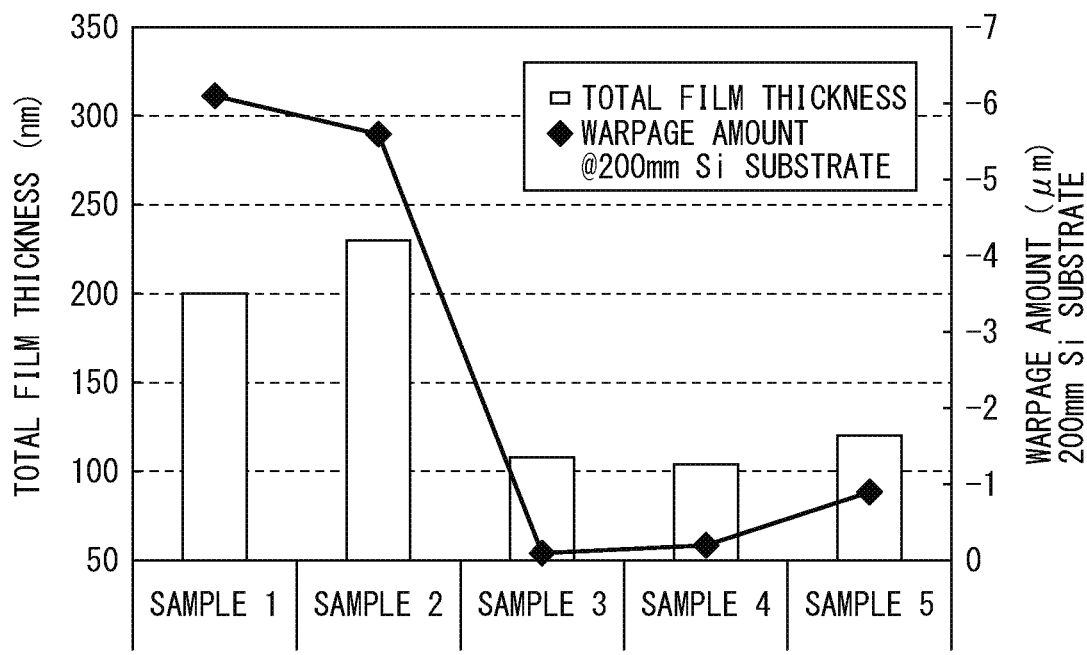

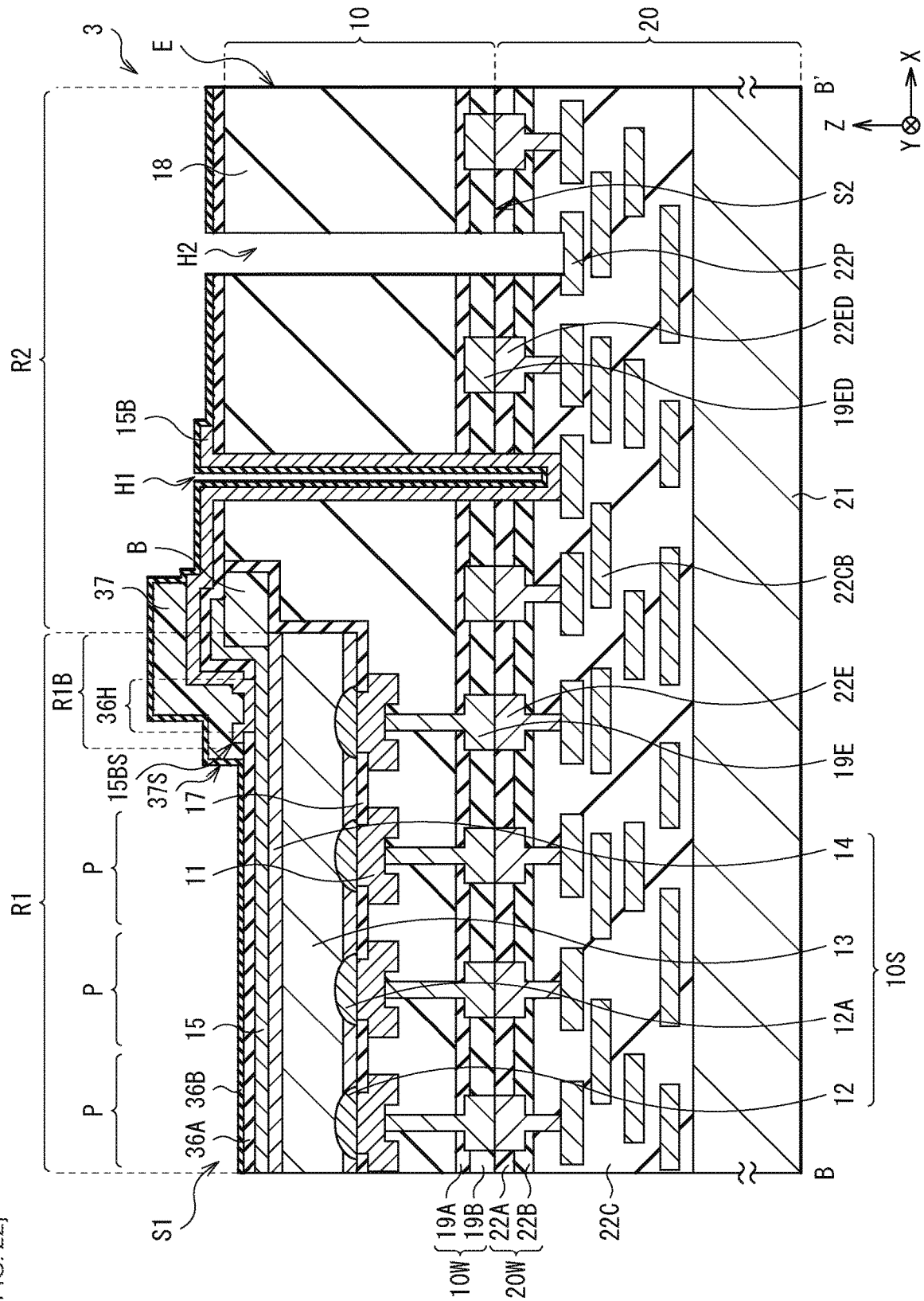
[FIG. 22]

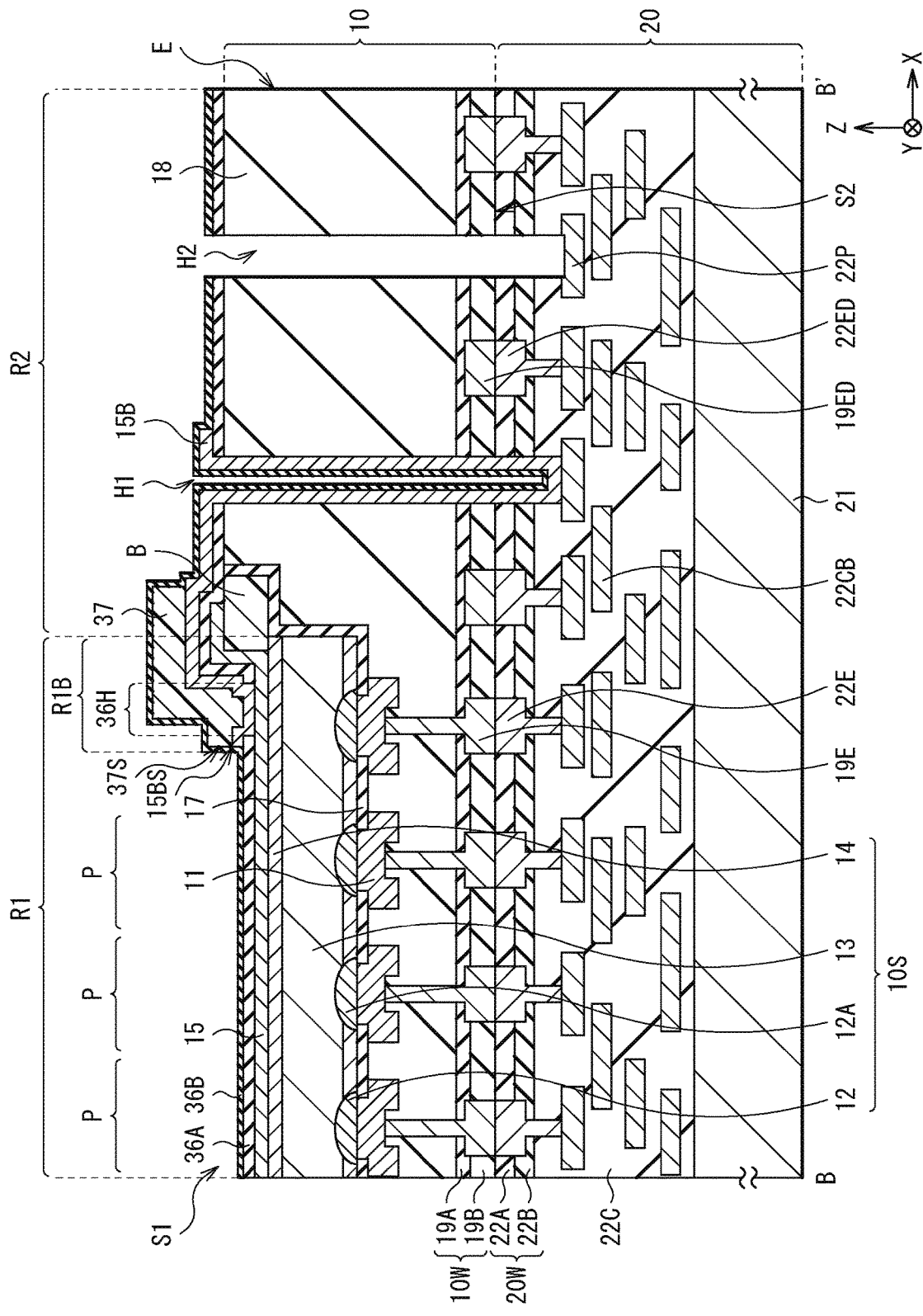
[FIG. 23]

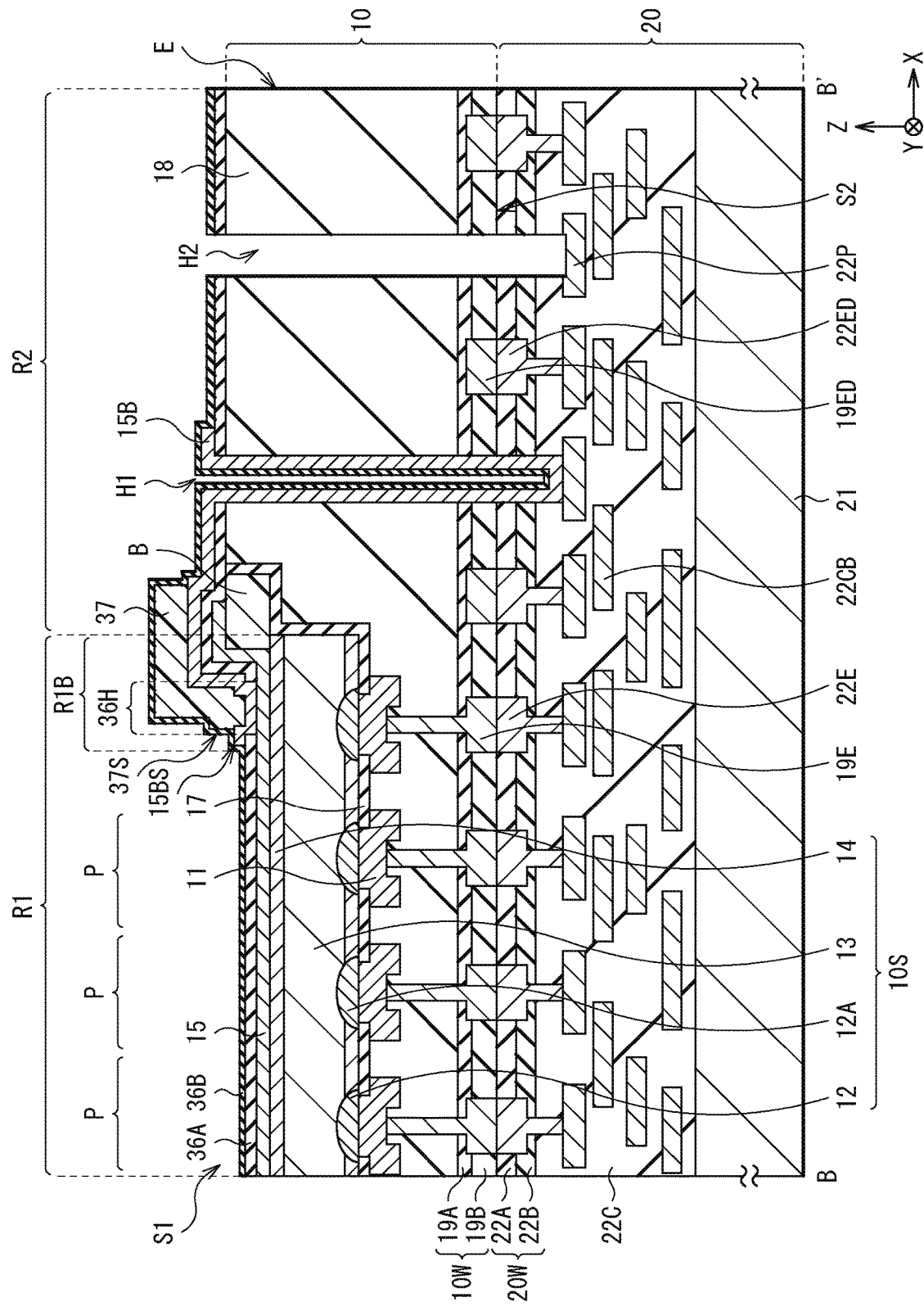
[FIG. 24]

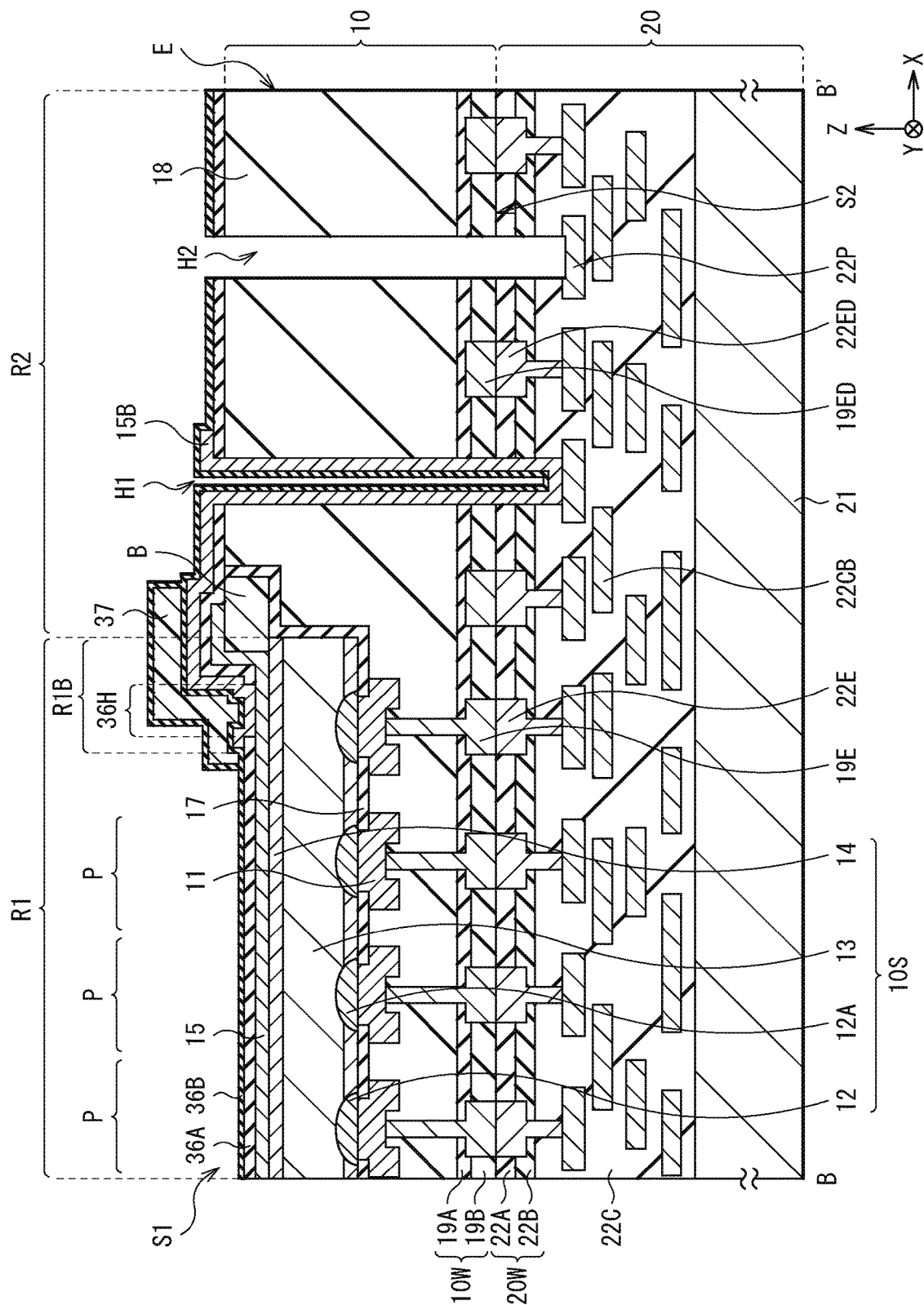
[FIG. 25]

[FIG. 26]
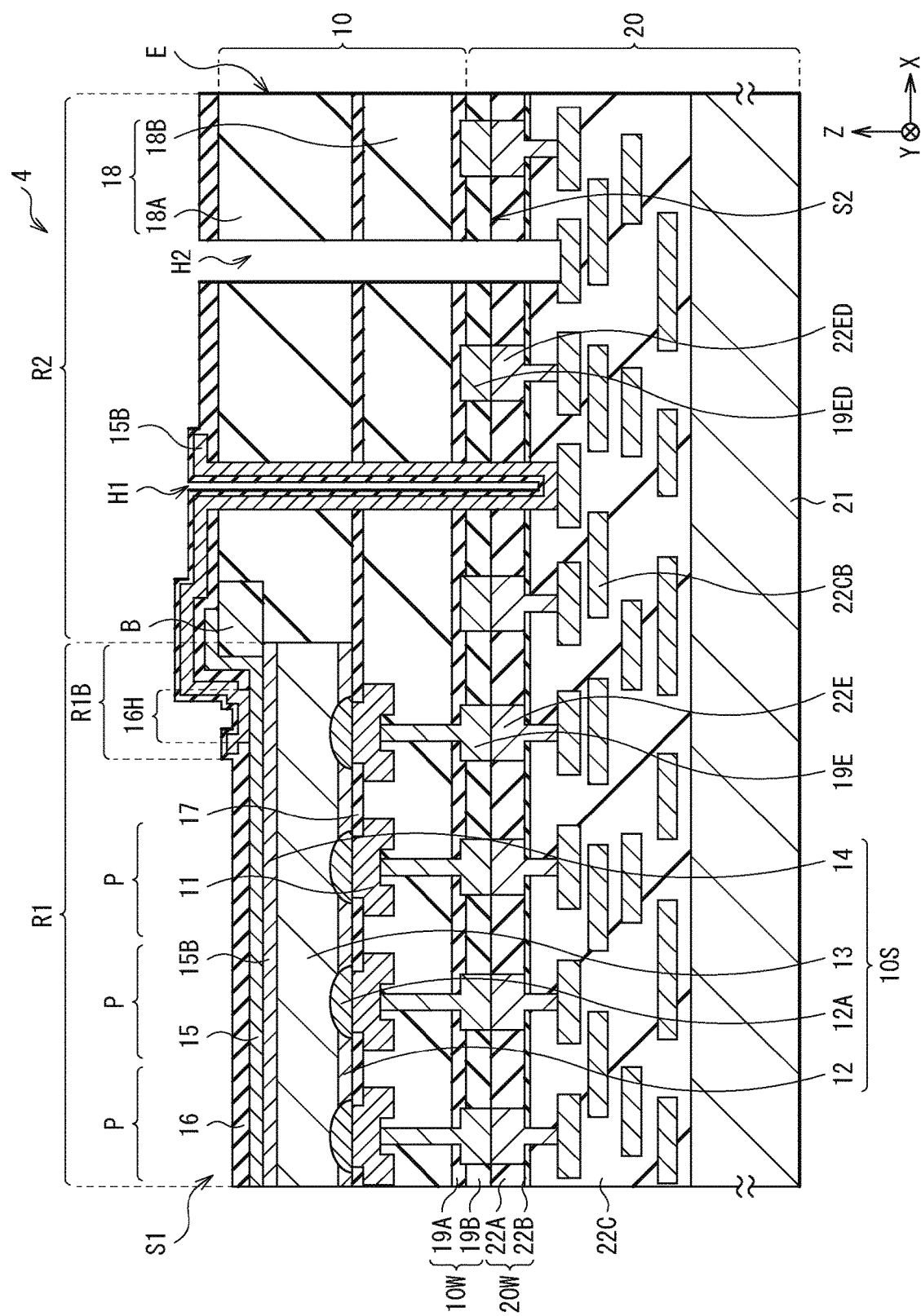

[FIG. 27A]
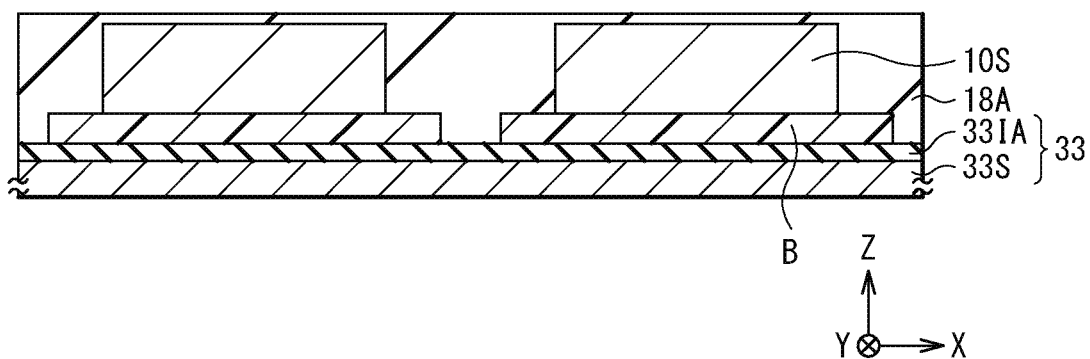
[FIG. 27B]
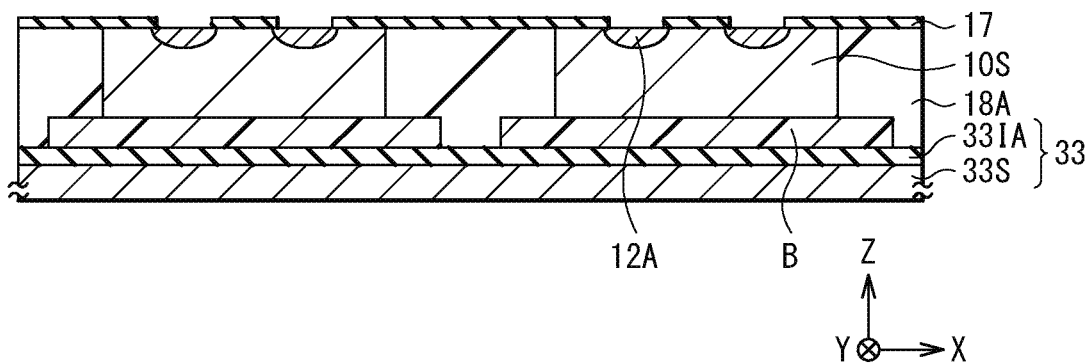

[FIG. 28]
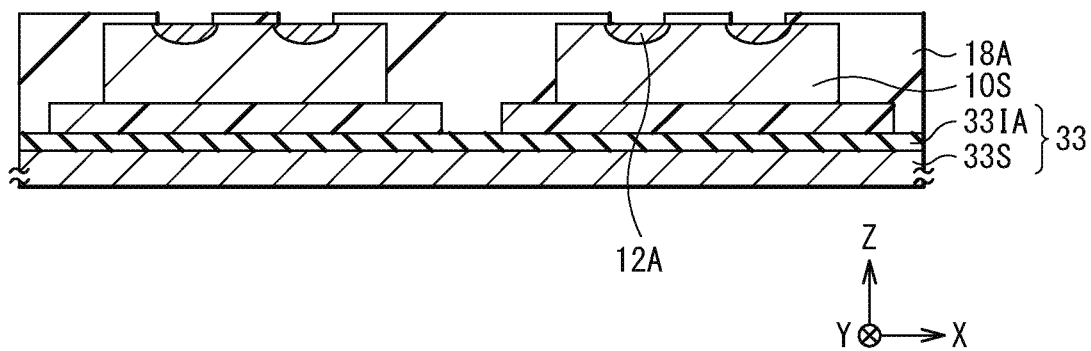
[FIG. 29]
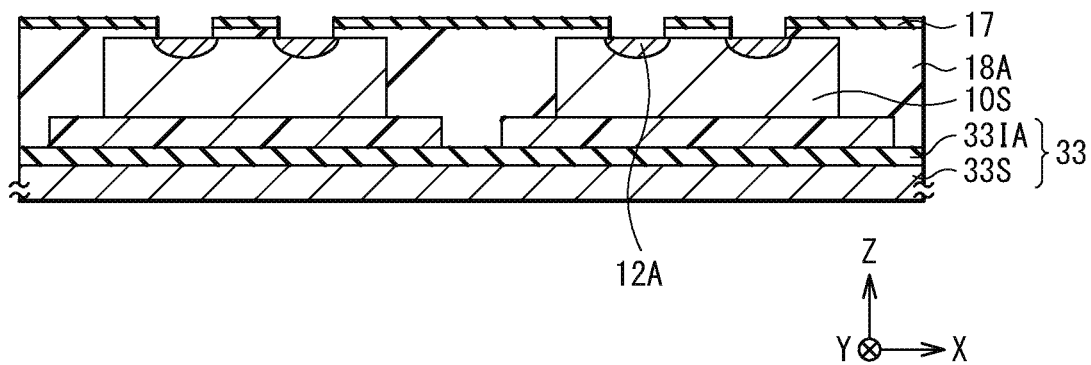

[FIG. 30A]
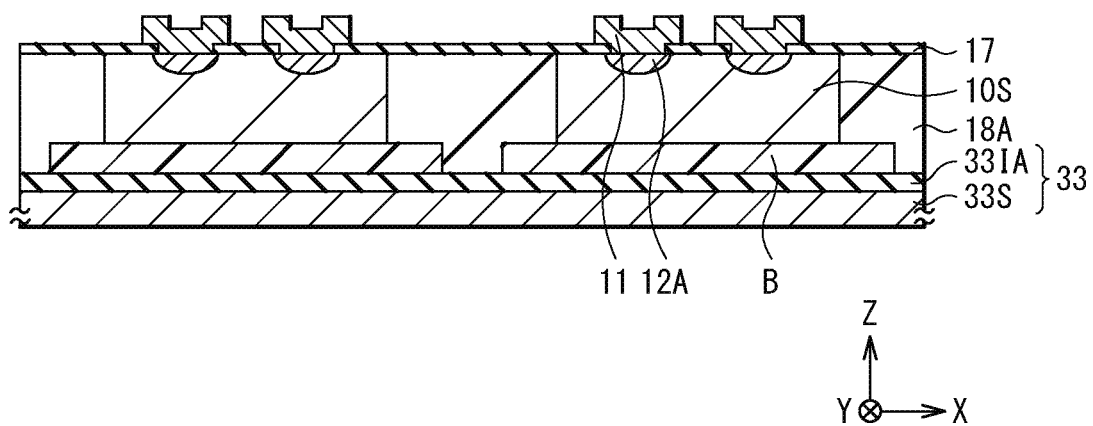
[FIG. 30B]
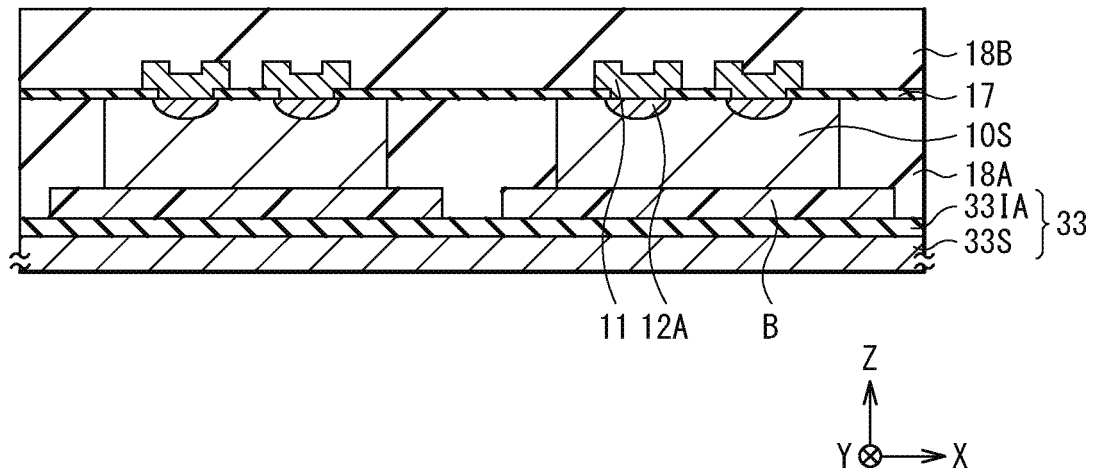

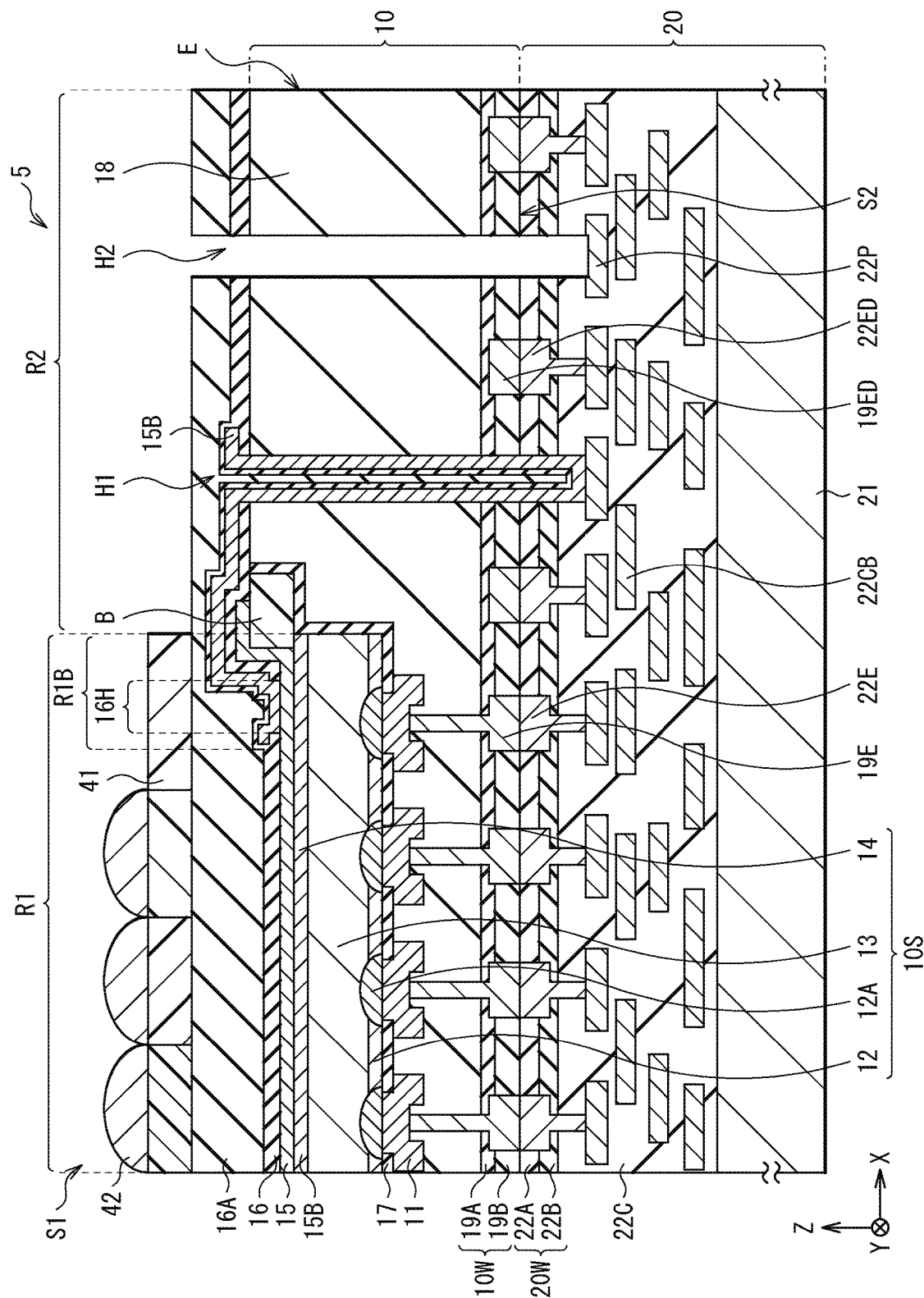
[FIG. 31]

[FIG. 32A]
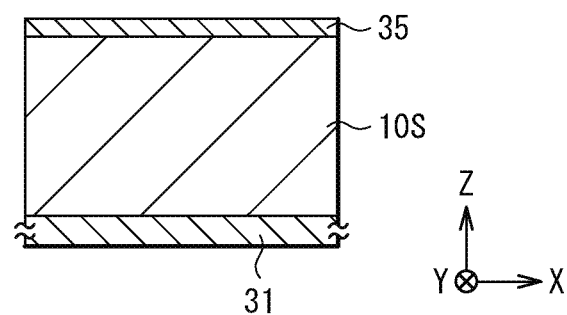
[FIG. 32B]
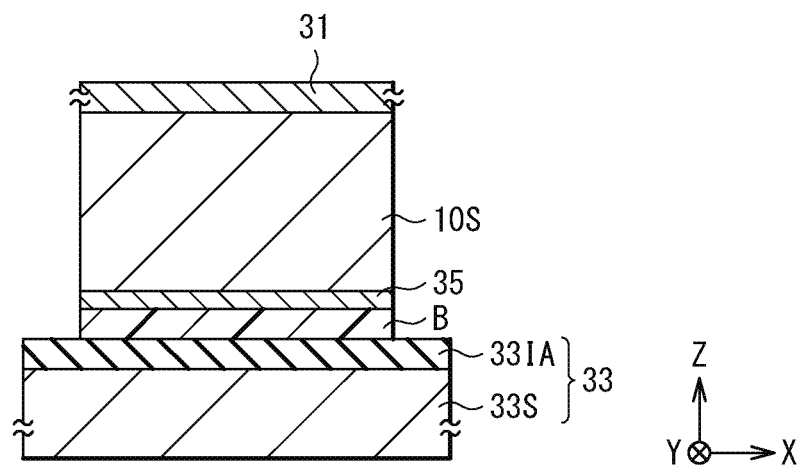

[FIG. 32C]
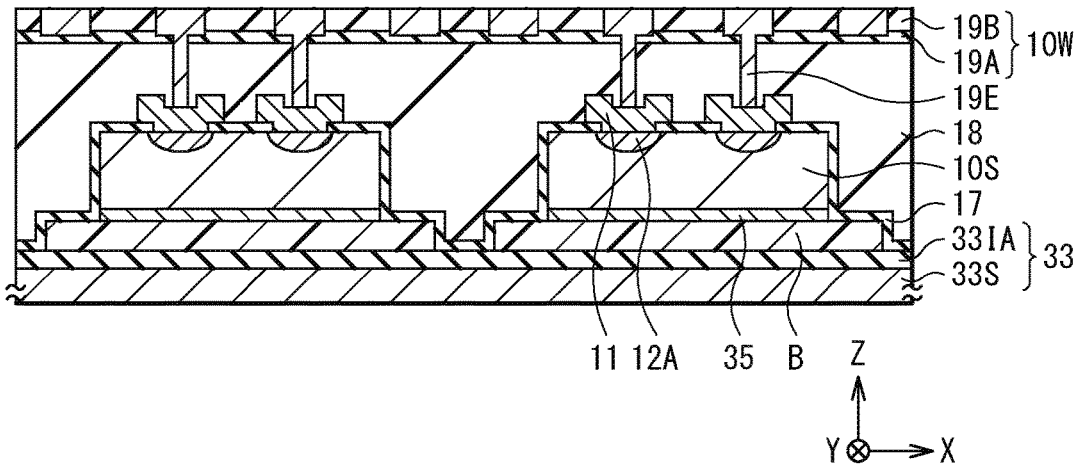
[FIG. 32D]
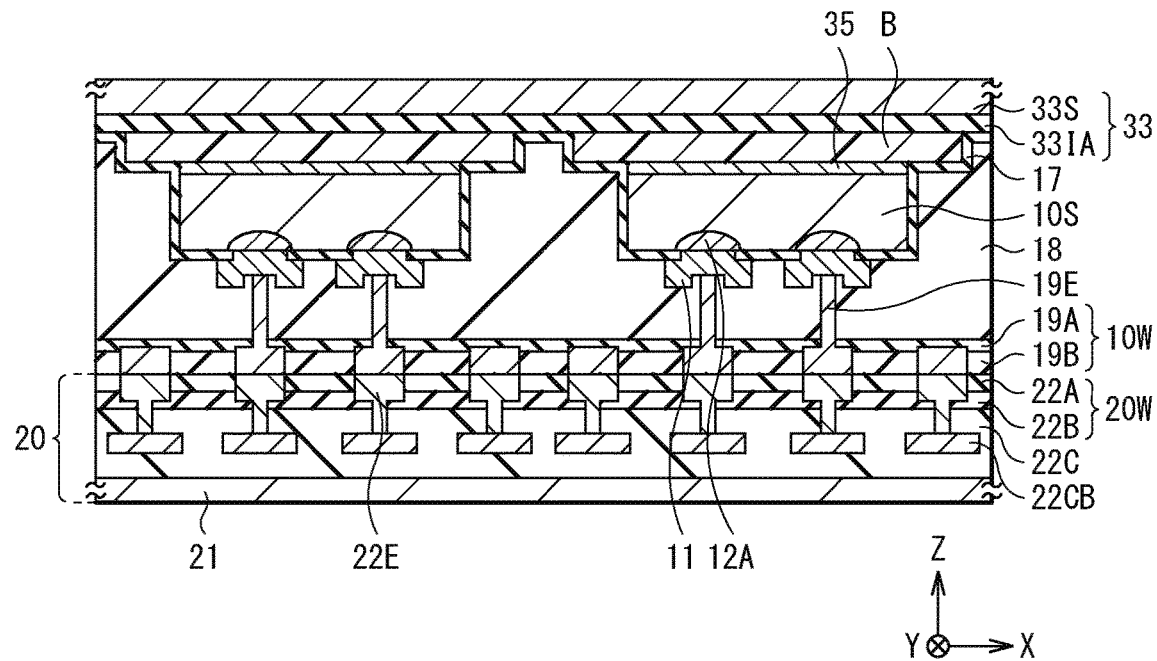

[FIG. 32E]
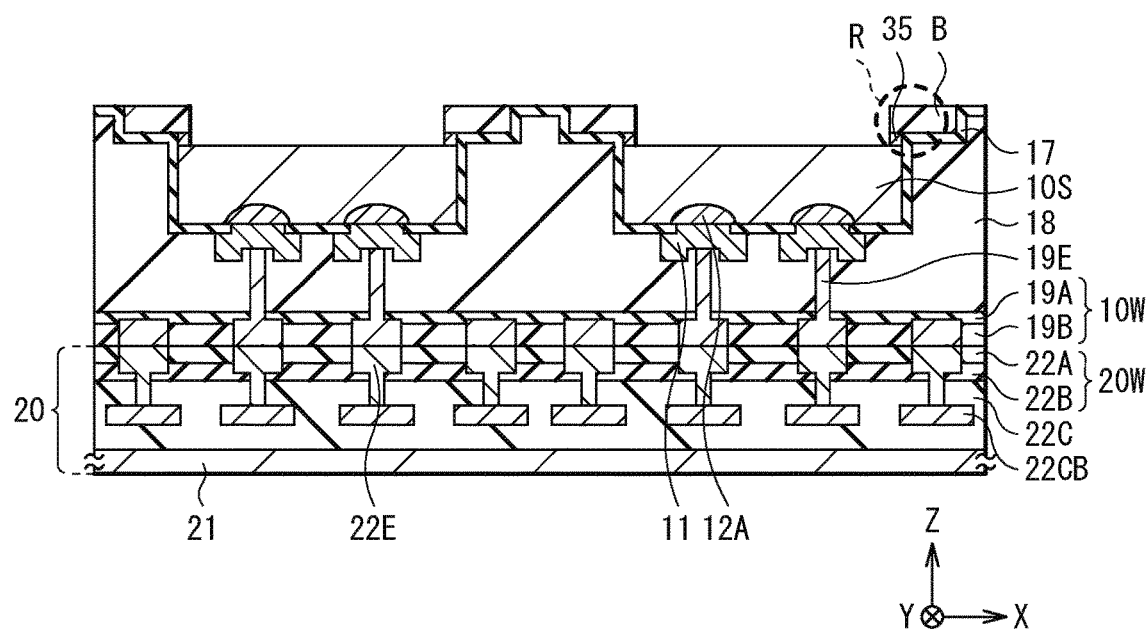

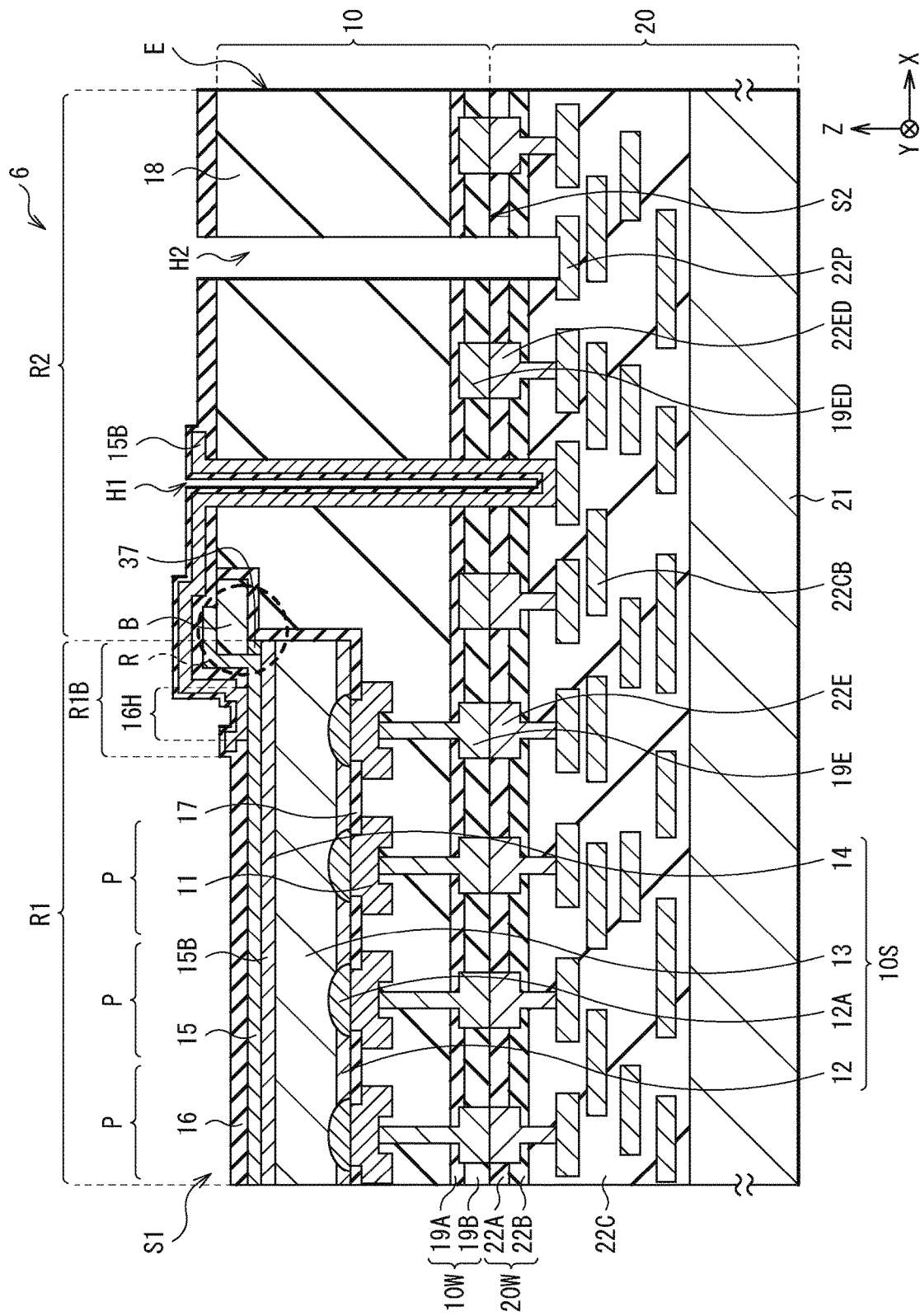
[FIG. 33]

[FIG. 34A]
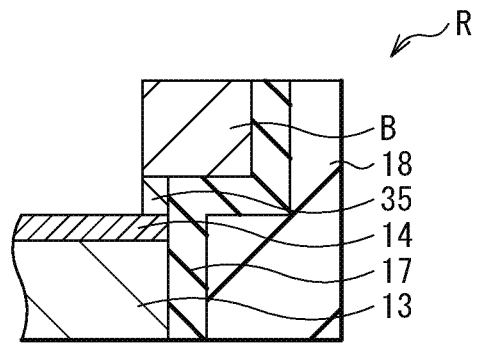
[FIG. 34B]
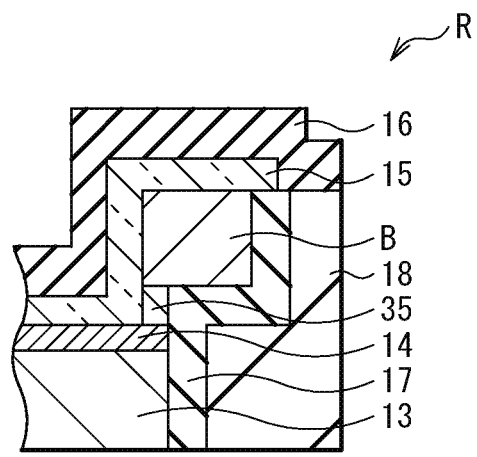
[FIG. 34C]
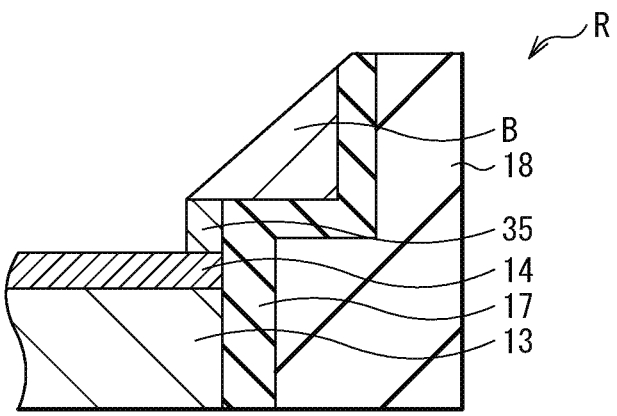

[FIG. 35A]
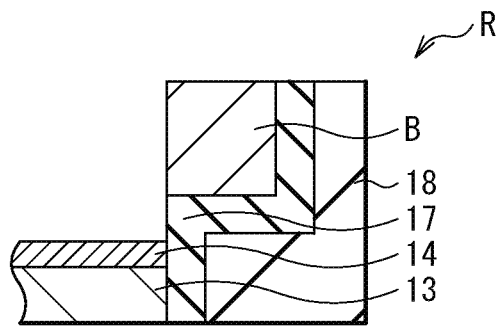
[FIG. 35B]
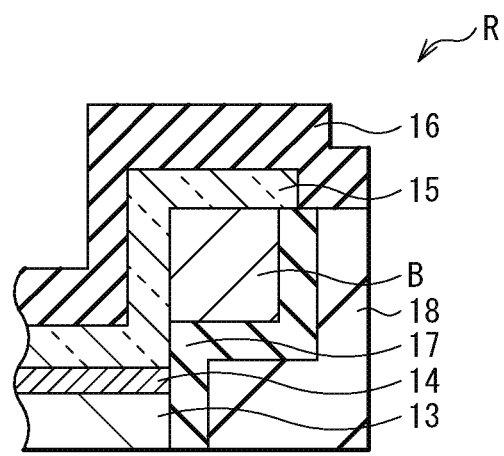
[FIG. 35C]
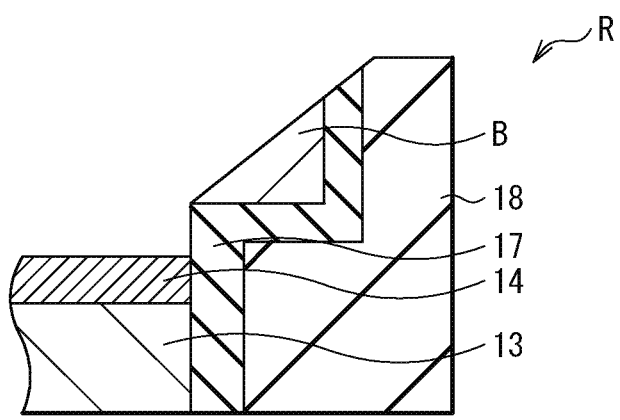

[FIG. 36A]
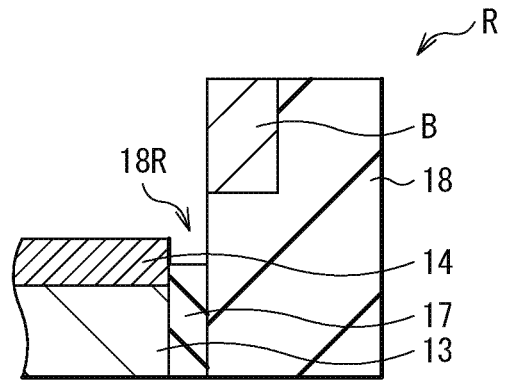
[FIG. 36B]
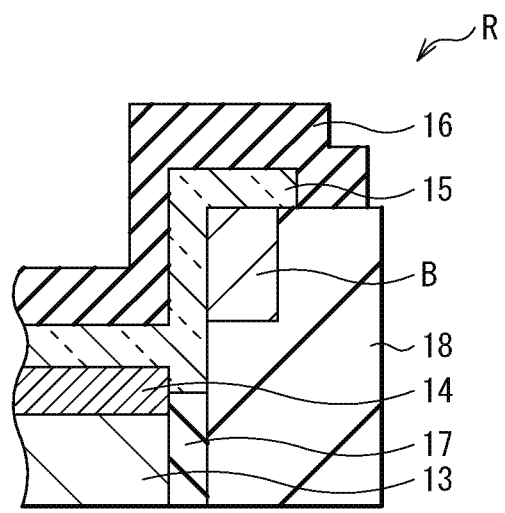
[FIG. 36C]
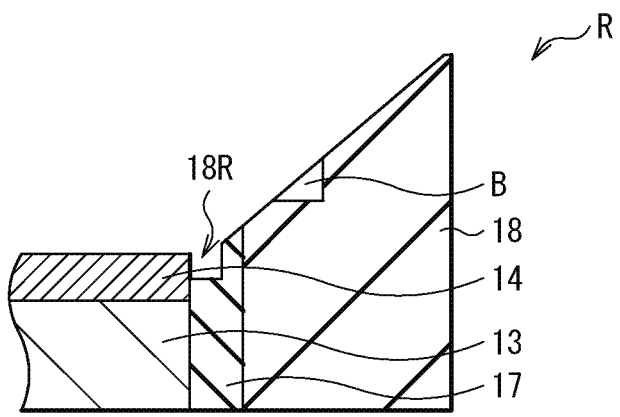

[FIG. 36D]
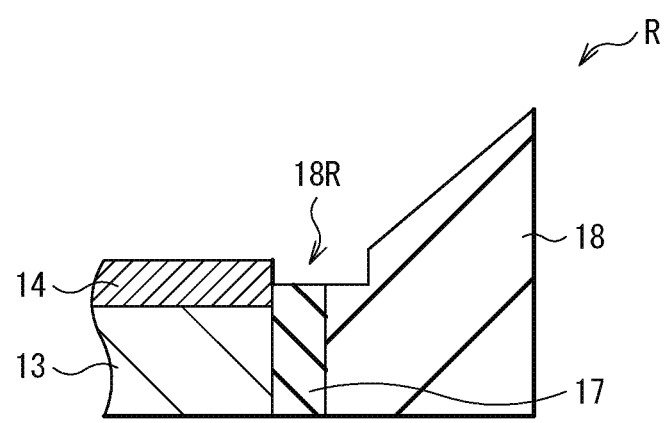

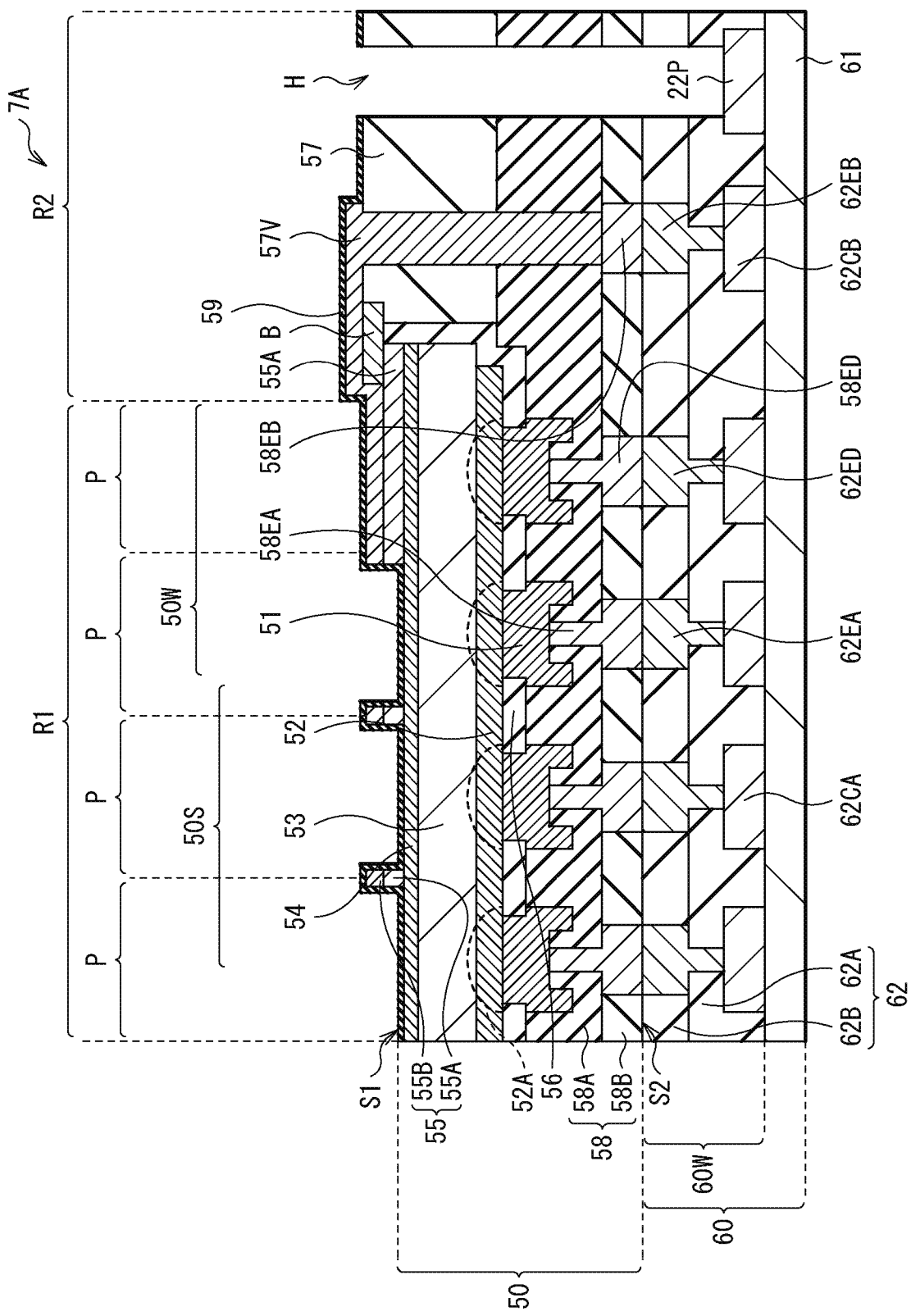
[FIG. 37]

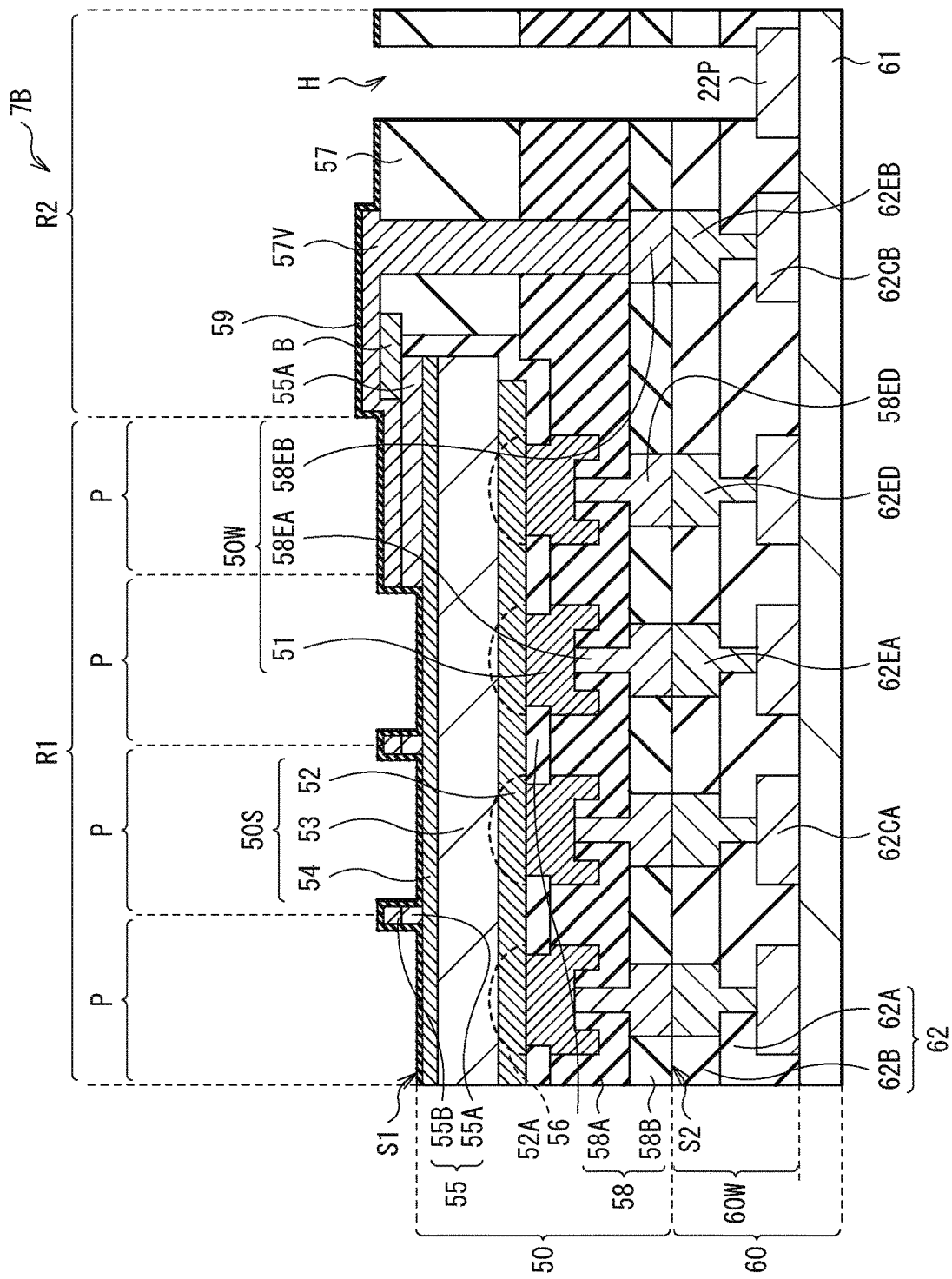
[FIG. 38]

[FIG. 39]
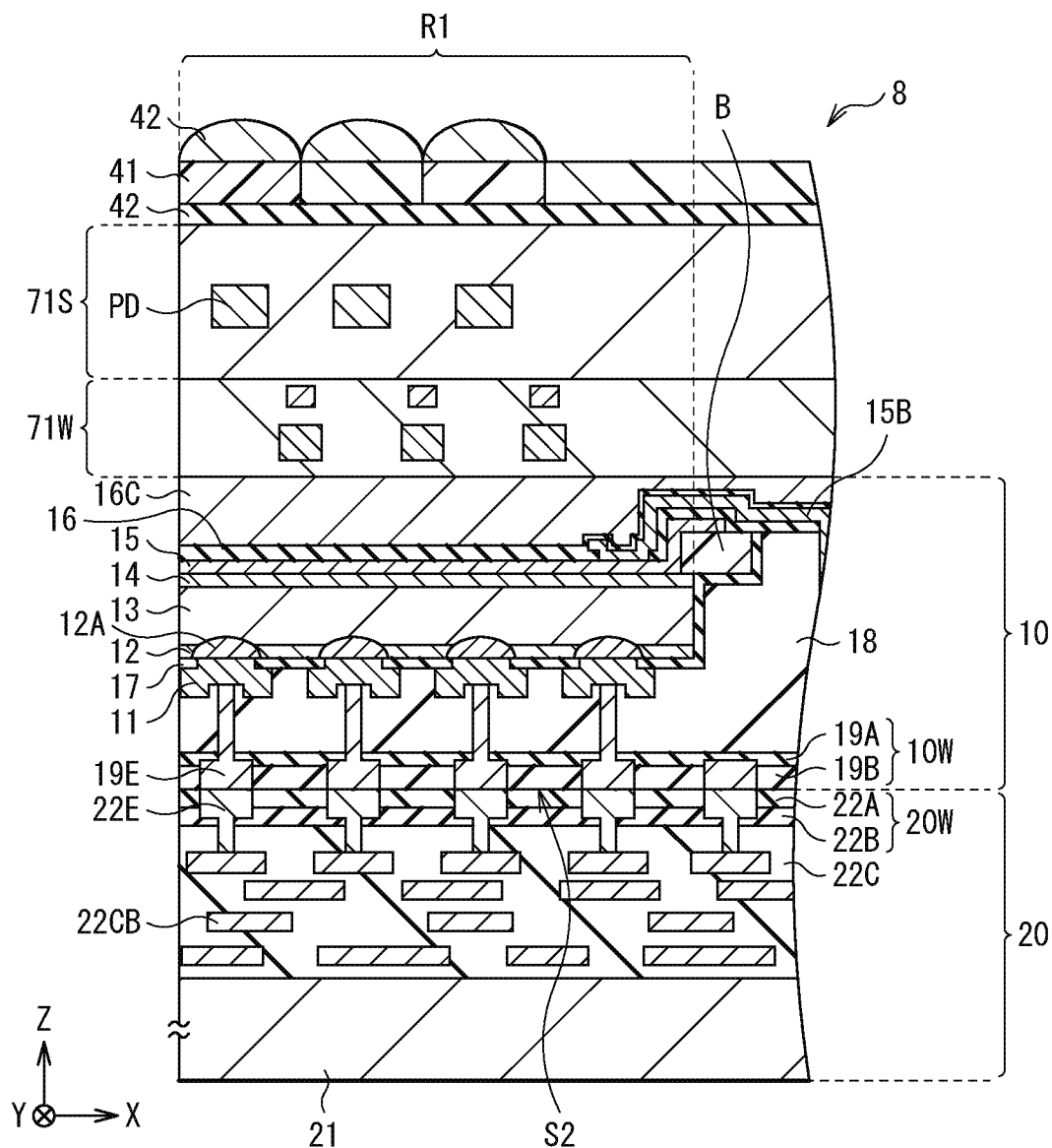

[FIG. 40]
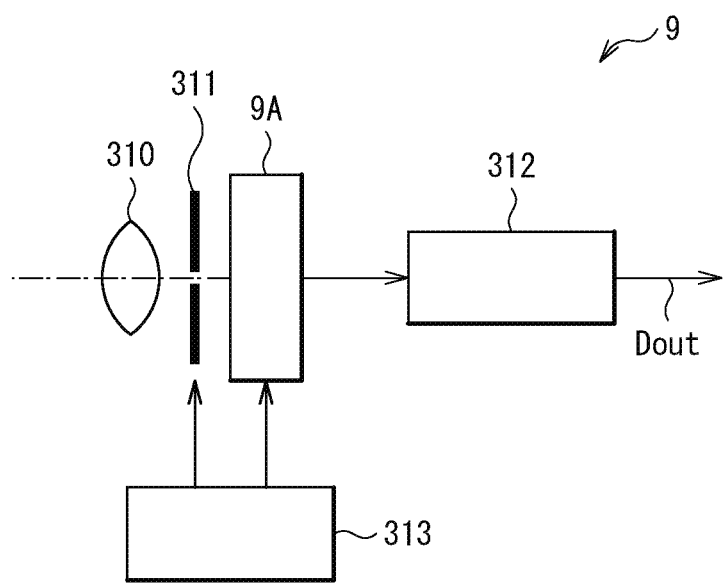

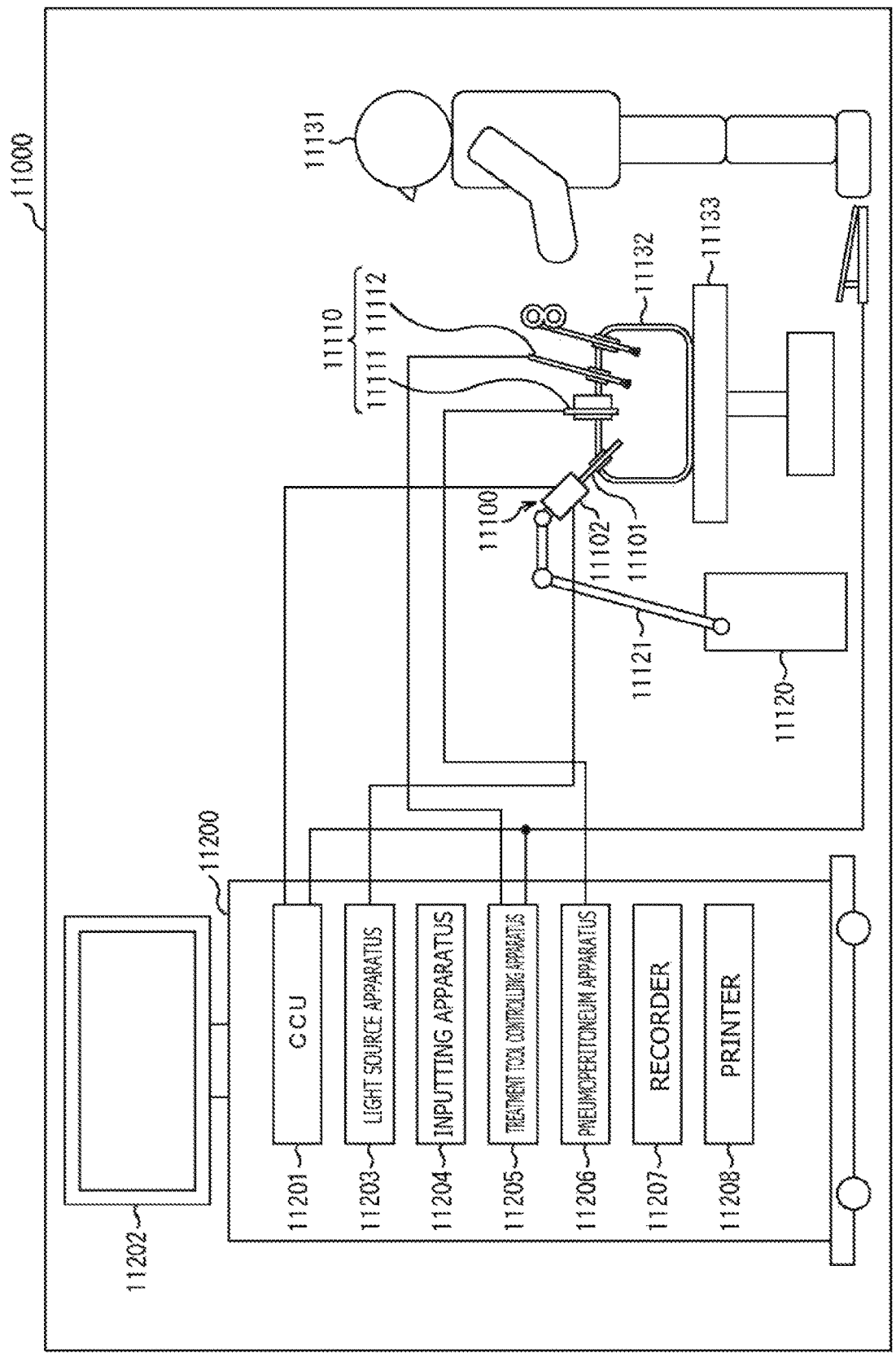
[FIG. 41]

[FIG. 42]
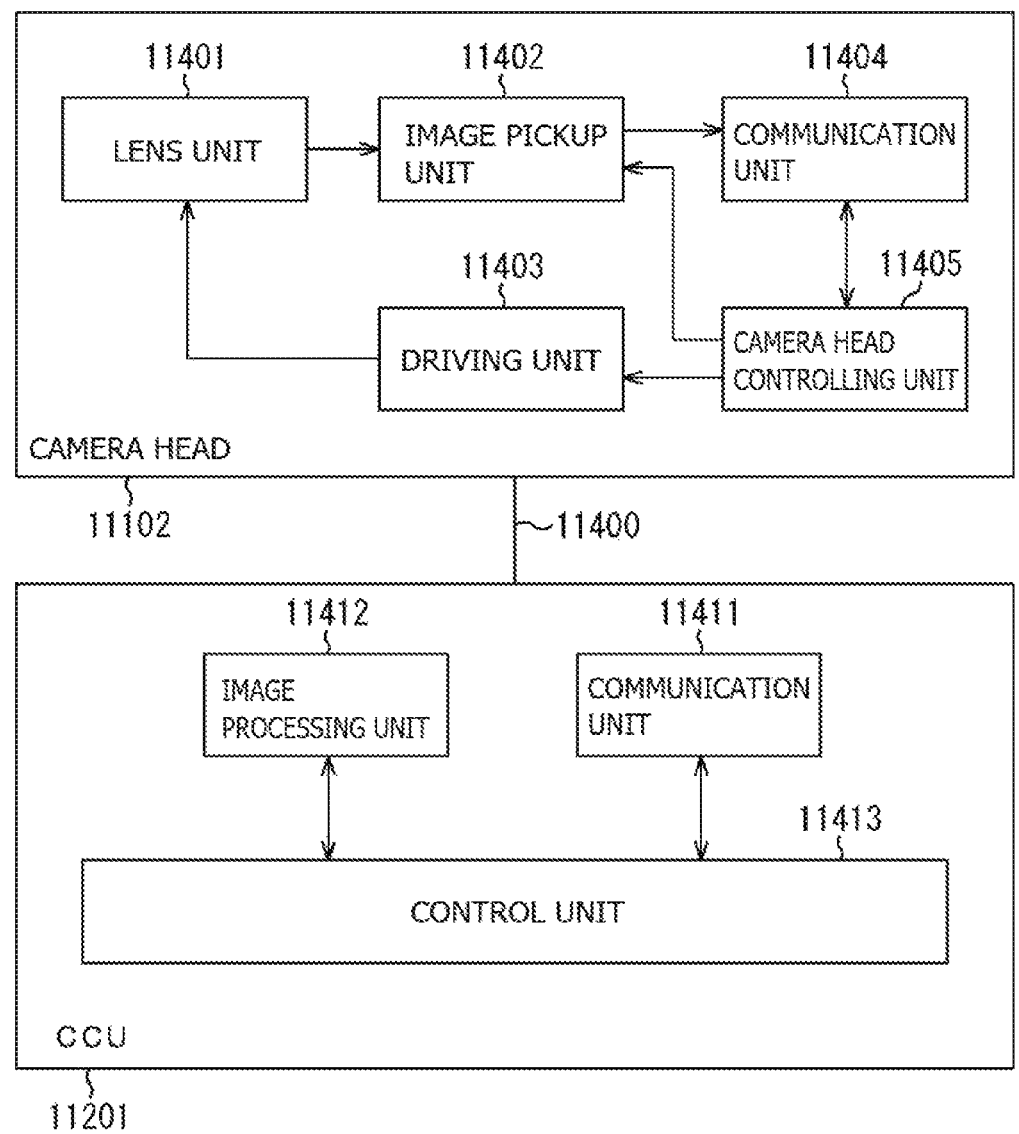

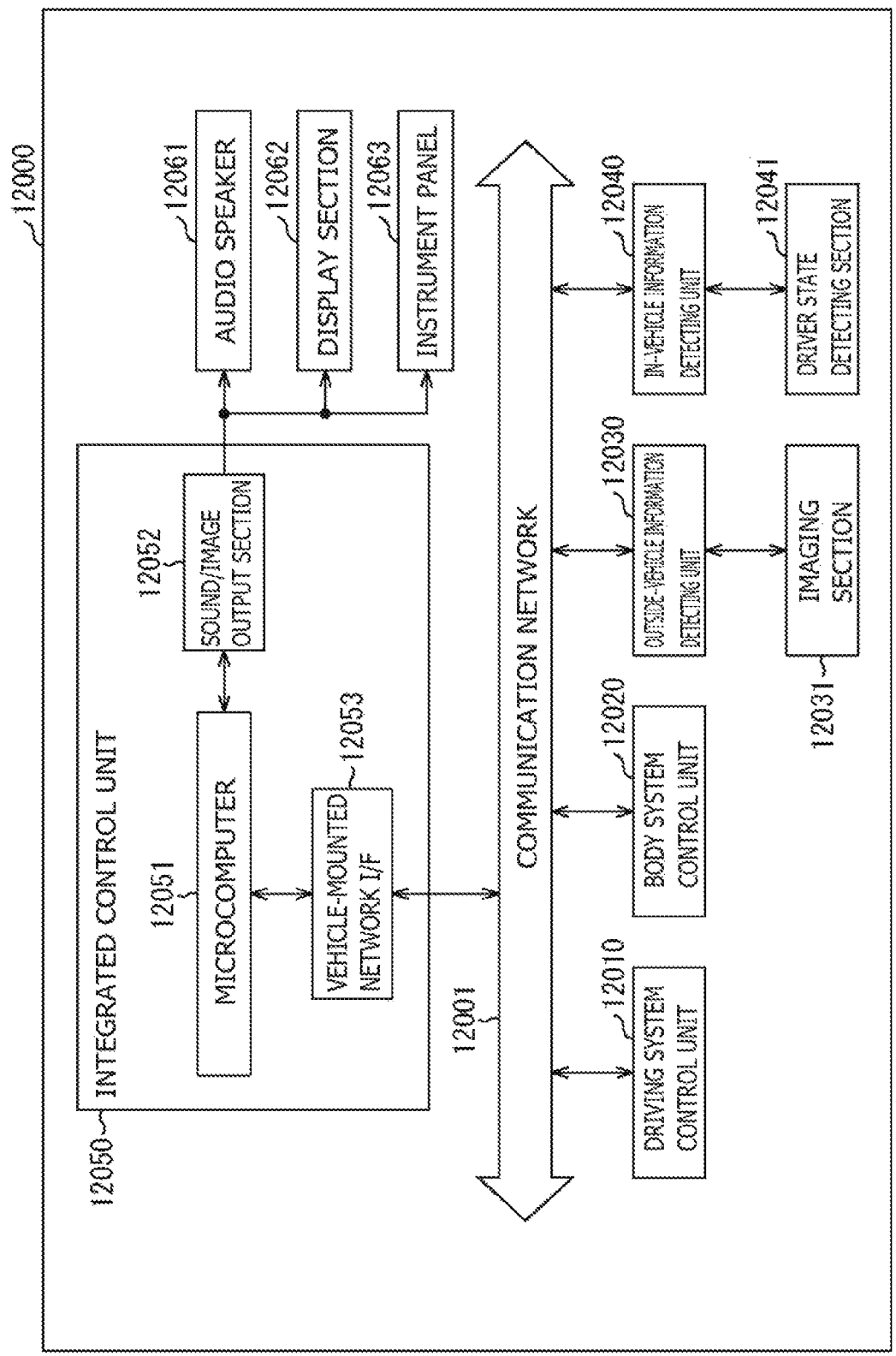
[FIG. 43]

[FIG. 44]
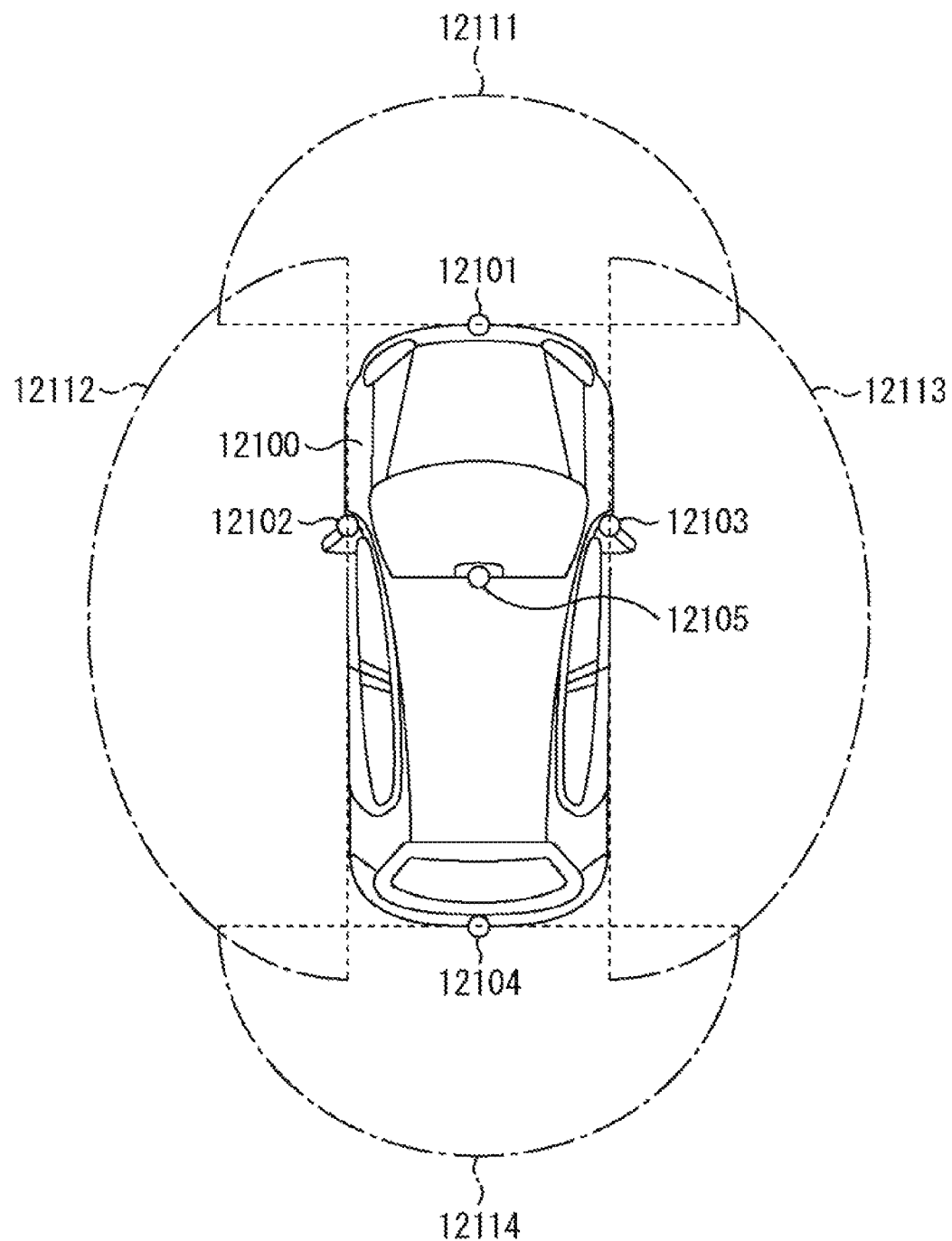

SEMICONDUCTOR ELEMENT

CROSS REFERENCE TO RELATED APPLICATIONS

This application is a U.S. National Phase of International Patent Application No. PCT/JP2019/045726 filed on Nov. 22, 2019, which claims priority benefit of Japanese Patent Application No. JP 2018-245180 filed in the Japan Patent Office on Dec. 27, 2018. Each of the above-referenced applications is hereby incorporated herein by reference in its entirety.

TECHNICAL FIELD

The present disclosure relates to a semiconductor element used in, for example, an infrared sensor or the like.

BACKGROUND ART

An image sensor having sensitivity in an infrared region (an infrared sensor) has been commercialized in recent years. A semiconductor element used in the infrared sensor has a photoelectric conversion layer that includes a group III-V semiconductor such as, for example, InGaAs (indium gallium arsenide). Such a photoelectric conversion layer generates electrical charges through absorption of infrared light (performs photoelectric conversion).

In PTL 1, InGaAs epitaxially grown on a growth substrate including InP (indium phosphide) is used as the photoelectric conversion layer.

CITATION LIST

Patent Literature

PTL 1: Japanese Unexamined Patent Application Publication (Published Japanese Translation of PCT Application) No. JP2014-521216

SUMMARY OF THE INVENTION

Meanwhile, improvement in manufacturing yield is demanded of such a semiconductor element.

It is desirable to provide a semiconductor element that makes it possible to improve the manufacturing yield.

A first semiconductor element according to an embodiment of the present disclosure includes: an element substrate including an element region in which a wiring layer and a first semiconductor layer including a compound semiconductor material are provided as a stack, and a peripheral region outside the element region; a readout circuit substrate opposed to the first semiconductor layer with the wiring layer interposed therebetween, and electrically coupled to the first semiconductor layer with the wiring layer interposed therebetween; a first electrode provided in the wiring layer and electrically coupled to the first semiconductor layer; a second electrode opposed to the first electrode with the first semiconductor layer interposed therebetween; and an insulating layer provided on the second electrode and having a non-reducing property.

In the first semiconductor element according to the embodiment of the present disclosure, the insulating layer having a non-reducing property is provided on the second electrode having a light-transmitting property. This improves adhesion between the second electrode and the insulating layer.

A second semiconductor element according to an embodiment of the present disclosure includes: an element substrate including an element region in which a wiring layer and a first semiconductor layer including a compound semiconductor material are provided as a stack, and a peripheral region outside the element region; a readout circuit substrate opposed to the first semiconductor layer with the wiring layer interposed therebetween, and electrically coupled to the first semiconductor layer with the wiring layer interposed therebetween; a first electrode provided in the wiring layer and electrically coupled to the first semiconductor layer; a second electrode opposed to the first electrode with the first semiconductor layer interposed therebetween; an insulating layer provided on the second electrode and having an opening in the vicinity of the peripheral region in the element region; and an electrically-conductive film including aluminum (Al), provided above the insulating layer and electrically coupled to the second electrode via the opening.

In the second semiconductor element according to the embodiment of the present disclosure, the electrically-conductive film that is to be provided on the insulating layer and electrically coupled to the second electrode via the opening provided in the vicinity of the peripheral region in the element region is formed using aluminum (Al). This allows the electrically-conductive film to be reduced in thickness.

A third semiconductor element according to an embodiment of the present disclosure includes: an element substrate including an element region in which a wiring layer and a first semiconductor layer including a compound semiconductor material are provided as a stack, and a peripheral region outside the element region; a readout circuit substrate opposed to the first semiconductor layer with the wiring layer interposed therebetween, and electrically coupled to the first semiconductor layer with the wiring layer interposed therebetween; a first electrode provided in the wiring layer and electrically coupled to the first semiconductor layer; a second electrode opposed to the first electrode with the first semiconductor layer interposed therebetween; an insulating layer provided on the second electrode and having an opening in the vicinity of the peripheral region in the element region; an electrically-conductive film provided above the insulating layer and electrically coupled to the second electrode via the opening; and a light-blocking film provided on the electrically-conductive film and including a black resist.

In the third semiconductor element according to the embodiment of the present disclosure, the light-blocking film including a black resist is further provided on the electrically-conductive film provided on the insulating layer and electrically coupled to the second electrode via the opening provided in the vicinity of the peripheral region in the element region. This allows the electrically-conductive film to be reduced in thickness.

BRIEF DESCRIPTION OF THE DRAWINGS

FIG. 1 is a schematic cross-sectional diagram illustrating an example of a configuration of a light-receiving element according to a first embodiment of the present disclosure.

FIG. 2 is a schematic planar diagram illustrating an overall outline configuration of the light-receiving element illustrated in FIG. 1.

FIG. 3 is a schematic cross-sectional diagram illustrating another example of the configuration of the light-receiving element according to the first embodiment of the present disclosure.

FIG. 4 is a schematic cross-sectional diagram illustrating another configuration example of the configuration of the light-receiving element illustrated in FIG. 3.

FIG. 5 is a schematic cross-sectional diagram illustrating another example of the configuration of the light-receiving element according to the first embodiment of the present disclosure.

FIG. 6 is a schematic cross-sectional diagram illustrating another example of the configuration of the light-receiving element according to the first embodiment of the present disclosure.

FIG. 7A is a schematic cross-sectional diagram for describing a step of a method of manufacturing the light-receiving element illustrated in FIG. 1.

FIG. 7B is a schematic cross-sectional diagram illustrating a step subsequent to FIG. 7A.

FIG. 7C is a schematic cross-sectional diagram illustrating a step subsequent to FIG. 7B.

FIG. 8 is a schematic planar diagram illustrating an example of the step of FIG. 7C.

FIG. 9 is a schematic planar diagram illustrating another example (1) of a configuration of a semiconductor layer illustrated in FIG. 8.

FIG. 10A is a schematic planar diagram illustrating another example (2) of the configuration of the semiconductor layer illustrated in FIG. 8.

FIG. 10B is a schematic diagram illustrating a cross-sectional configuration along line B-B illustrated in FIG. 10A.

FIG. 11A is a schematic cross-sectional diagram illustrating a step subsequent to FIG. 7C.

FIG. 11B is a schematic cross-sectional diagram illustrating a step subsequent to FIG. 11A.

FIG. 12A is a schematic diagram illustrating an example of a planar configuration of the step illustrated in FIG. 11A.

FIG. 12B is a schematic diagram illustrating an example of a planar configuration of the step illustrated in FIG. 11B.

FIG. 13A is a schematic diagram illustrating another example (1) of the planar configuration of the step illustrated in FIG. 11A.

FIG. 13B is a schematic diagram illustrating another example (1) of the planar configuration of the step illustrated in FIG. 11B.

FIG. 14A is a schematic diagram illustrating another example (2) of the planar configuration of the step illustrated in FIG. 11A.

FIG. 14B is a schematic diagram illustrating another example (2) of the planar configuration of the step illustrated in FIG. 11B.

FIG. 15 is a schematic cross-sectional diagram illustrating another example (1) of the step illustrated in FIG. 11B.

FIG. 16 is a schematic cross-sectional diagram illustrating another example (2) of the step illustrated in FIG. 11B.

FIG. 17A is a schematic cross-sectional diagram illustrating a step subsequent to FIG. 11B.

FIG. 17B is a schematic cross-sectional diagram illustrating a step subsequent to FIG. 17A.

FIG. 17C is a schematic cross-sectional diagram illustrating a step subsequent to FIG. 17B.

FIG. 17D is a schematic cross-sectional diagram illustrating a step subsequent to FIG. 17C.

FIG. 17E is a schematic cross-sectional diagram illustrating a step subsequent to FIG. 17D.

FIG. 17F is a schematic cross-sectional diagram illustrating a step subsequent to FIG. 17E.

FIG. 17G is a schematic cross-sectional diagram illustrating a step subsequent to FIG. 17F.

FIG. 17H is a schematic cross-sectional diagram illustrating a step subsequent to FIG. 17G.

FIG. 17I is a schematic cross-sectional diagram illustrating a step subsequent to FIG. 17H.

FIG. 17J is a schematic cross-sectional diagram illustrating a step subsequent to FIG. 17I.

FIG. 18 is a schematic cross-sectional diagram illustrating a configuration of a light-receiving element according to a second embodiment of the present disclosure.

FIG. 19 is a characteristic diagram illustrating a relationship between wavelength and transmittance in each of metals.

FIG. 20 is a characteristic diagram illustrating relationships between wavelength and reflectance in various electrically-conductive films.

FIG. 21 is a characteristic diagram illustrating relationships between film thicknesses of various electrically-conductive films and warpage amounts of a Si substrate.

FIG. 22 is a schematic cross-sectional diagram illustrating an example of a configuration of a light-receiving element according to a third embodiment of the present disclosure.

FIG. 23 is a schematic cross-sectional diagram illustrating another example of the configuration of the light-receiving element according to the third embodiment of the present disclosure.

FIG. 24 is a schematic cross-sectional diagram illustrating another example of the configuration of the light-receiving element according to the third embodiment of the present disclosure.

FIG. 25 is a schematic cross-sectional diagram illustrating another example of the configuration of the light-receiving element according to the third embodiment of the present disclosure.

FIG. 26 is a schematic cross-sectional diagram illustrating another example of a configuration of a light-receiving element according to Modification Example 1 of the present disclosure.

FIG. 27A is a schematic cross-sectional diagram for describing a step of a method of manufacturing the light-receiving element illustrated in FIG. 26.

FIG. 27B is a schematic cross-sectional diagram illustrating a step subsequent to FIG. 27A.

FIG. 28 is a schematic cross-sectional diagram illustrating another example (1) of the step illustrated in FIG. 27B.

FIG. 29 is a schematic cross-sectional diagram illustrating another example (2) of the step illustrated in FIG. 27B.

FIG. 30A is a schematic cross-sectional diagram illustrating a step subsequent to FIG. 27B.

FIG. 30B is a schematic cross-sectional diagram illustrating a step subsequent to FIG. 30A.

FIG. 31 is a schematic cross-sectional diagram illustrating an outline configuration of a light-receiving element according to Modification Example 2 of the present disclosure.

FIG. 32A is a schematic cross-sectional diagram for describing a step of a method of manufacturing a light-receiving element according to Modification Example 3 of the present disclosure.

FIG. 32B is a schematic cross-sectional diagram illustrating a step subsequent to FIG. 32A.

FIG. 32C is a schematic cross-sectional diagram illustrating a step subsequent to FIG. 32B.

FIG. 32D is a schematic cross-sectional diagram illustrating a step subsequent to FIG. 32C.

FIG. 32E is a schematic cross-sectional diagram illustrating a step subsequent to FIG. 32D.

FIG. 33 is a schematic cross-sectional diagram illustrating a configuration of a main part of the light-receiving element completed through a step subsequent to FIG. 32E.

FIG. 34A is an enlarged schematic cross-sectional view (1) of a portion illustrated in FIG. 32E.

FIG. 34B is an enlarged schematic cross-sectional view (1) of a portion illustrated in FIG. 33.

FIG. 34C is a schematic cross-sectional diagram illustrating another example of a shape of an opening illustrated in FIG. 34A.

FIG. 35A is an enlarged schematic cross-sectional view (2) of a portion illustrated in FIG. 32E.

FIG. 35B is an enlarged schematic cross-sectional view (2) of a portion illustrated in FIG. 33.

FIG. 35C is a schematic cross-sectional diagram illustrating another example of the shape of the opening illustrated in FIG. 35A.

FIG. 36A is an enlarged schematic cross-sectional view (3) of a portion illustrated in FIG. 32E.

FIG. 36B is an enlarged schematic cross-sectional view (3) of a portion illustrated in FIG. 33.

FIG. 36C is a schematic cross-sectional diagram illustrating another example of the shape of the opening illustrated in FIG. 36A.

FIG. 36D is an enlarged schematic cross-sectional view (4) of a portion illustrated in FIG. 32E.

FIG. 37 is a schematic cross-sectional diagram illustrating an example of a configuration of a light-receiving element according to Modification Example 4 of the present disclosure.

FIG. 38 is a schematic cross-sectional diagram illustrating another example of the configuration of the light-receiving element according to Modification Example 4 of the present disclosure.

FIG. 39 is a schematic cross-sectional diagram illustrating an example of a configuration of a light-receiving element according to Modification Example 5 of the present disclosure.

FIG. 40 is a functional block diagram illustrating an example of an electronic apparatus (a camera) that uses an imaging element.

FIG. 41 is a view depicting an example of a schematic configuration of an endoscopic surgery system.

FIG. 42 is a block diagram depicting an example of a functional configuration of a camera head and a camera control unit (CCU).

FIG. 43 is a block diagram depicting an example of schematic configuration of a vehicle control system.

FIG. 44 is a diagram of assistance in explaining an example of installation positions of an outside-vehicle information detecting section and an imaging section.

MODES FOR CARRYING OUT THE INVENTION

In the following, description is given in detail of embodiments of the present disclosure with reference to the drawings. The following description is directed to specific examples of the present disclosure, and the present disclosure is not limited to the following embodiments. In addition, the present disclosure is not limited to the arrangement, dimensions, dimensional ratios, and the like of respective components illustrated in the drawings. It is to be noted that description is given in the following order.

1. First Embodiment (an example of a light-receiving element including a non-reducing layer on a second electrode)
   1-1. Configuration of Light-Receiving Element
   1-2. Method of Manufacturing Light-Receiving Element
   1-3. Operation of Light-Receiving Element
   1-4. Workings and Effects
2. Second Embodiment (an example of formation of an electrically-conductive film using an electrically-conductive material including Al)
3. Third Embodiment (an example of providing a black resist on the electrically-conductive film)
4. Modification Example 1
5. Modification Example 2
6. Modification Example 3
7. Modification Example 4
8. Modification Example 5
9. Application Example 1 (an example of an imaging element)
10. Applicable Example 2 (an example of an electronic apparatus)
11. Practical Application Example 1 (an example of practical application to an endoscopic surgery system)
12. Practical Application Example 2 (an example of practical application to a mobile body)

1. First Embodiment

FIG. 1 schematically illustrates an example of a cross-sectional configuration of a semiconductor element (a light-receiving element 1) according to a first embodiment of the present disclosure. FIG. 2 schematically illustrates an overall planar configuration of the light-receiving element 1 illustrated in FIG. 1. It is to be noted that FIG. 1 illustrates a cross-sectional configuration along line I-I illustrated in FIG. 2. The light-receiving element 1 is to be applied to, for example, an infrared sensor or the like that uses a compound semiconductor material such as a group III-V semiconductor, and has a photoelectric conversion function, for example, for light of a wavelength ranging from a visible region (e.g., 380 nm or more and less than 780 nm) to a short infrared region (e.g., 780 nm or more and less than 2400 nm). The light-receiving element 1 is provided with a plurality of light-receiving unit regions (pixels P) arranged two-dimensionally, for example. FIG. 1 illustrates the cross-sectional configuration of a portion corresponding to three pixels P.

(1-1. Configuration of Light-Receiving Element)

As illustrated in FIG. 2, the light-receiving element 1 includes an element region R1 at a middle part and a peripheral region R2 provided outside the element region R1 and surrounding the element region R1. The light-receiving element 1 includes an electrically-conductive film 15B provided to extend from the element region R1 to the peripheral region R2. The electrically-conductive film 15B has an opening in a region facing the middle part of the element region R1.

As illustrated in FIG. 1, the light-receiving element 1 has a stacked structure of an element substrate 10 and a readout circuit substrate 20. One surface of the element substrate 10 is a light entrance surface (a light entrance surface S1), and a surface (another surface) opposite to the light entrance surface S1 is a bonding surface (a bonding surface S2) to the readout circuit substrate 20.

The element substrate 10 includes a wiring layer 10W, a first electrode 11, a semiconductor layer 10S (a first semiconductor layer), a second electrode 15, and passivation films 16A and 16B in this order from a position close to the readout circuit substrate 20. A surface of the semiconductor layer 10S opposed to the wiring layer 10W and an end surface (a side surface) of the semiconductor layer 10S are covered with an insulating film 17. The readout circuit substrate 20 is a so-called ROIC (Readout integrated circuit), and includes a wiring layer 20W in contact with the bonding surface S2 of the element substrate 10, a multilayer wiring layer 22C, and a semiconductor substrate 21 opposed to the element substrate 10 with the wiring layer 20W and the multilayer wiring layer 22C interposed therebetween.

The element substrate 10 includes the semiconductor layer 10S in the element region R1. In other words, a region provided with the semiconductor layer 10S is the element region R1 of the light-receiving element 1. Of the element region R1, a region exposed from the electrically-conductive film 15B (a region facing the opening of the electrically-conductive film 15B) is a light-receiving region. Of the element region R1, a region located in the vicinity of the peripheral region R2 and covered with the electrically-conductive film 15B is an OPB (Optical Black) region R1B. The OPB region R1B is provided to surround the light-receiving region. The OPB region R1B is used to obtain a black-level pixel signal. The element substrate 10 includes an embedded layer 18 together with the insulating film 17 in the peripheral region R2. The peripheral region R2 is provided with through holes H1 and H2 that penetrate the element substrate 10 to reach the readout circuit substrate 20. In the light-receiving element 1, light enters the semiconductor layer 10S from the light entrance surface S1 of the element substrate 10, through the passivation films 16A and 16B, the second electrode 15, and a second contact layer 14. Signal charges photoelectrically converted in the semiconductor layer 10S migrate through the first electrode 11 and the wiring layer 10W, and are read at the readout circuit substrate 20. In the following, description is given of a configuration of each component.

The wiring layer 10W is provided over the element region R1 and the peripheral region R2, and includes the bonding surface S2 to the readout circuit substrate 20. In the light-receiving element 1, the bonding surface S2 of the element substrate 10 is provided in the element region R1 and the peripheral region R2. For example, the bonding surface S2 in the element region R1 and the bonding surface S2 in the peripheral region R2 are coplanar. As described later, in the light-receiving element 1, providing the embedded layer 18 allows for formation of the bonding surface S2 in the peripheral region R2.

The wiring layer 10W includes, for example, a contact electrode 19E and a dummy electrode 19ED in interlayer insulating films 19A and 19B. For example, the interlayer insulating film 19B is disposed on the side of the readout circuit substrate 20, and the interlayer insulating film 19A is disposed on the side of a first contact layer 12; these interlayer insulating films 19A and 19B are provided as a stack. The interlayer insulating films 19A and 19B each include, for example, an inorganic insulating material. Examples of the inorganic insulating material include silicon nitride (SiN), aluminum oxide ($Al_2O_3$), silicon oxide ($SiO_2$), and hafnium oxide ($HfO_2$). The interlayer insulating films 19A and 19B may include the same inorganic insulating material.

The contact electrode 19E is provided in the element region R1, for example. The contact electrode 19E serves to electrically couple the first electrode 11 and the readout circuit substrate 20 to each other, and is provided for each of the pixels P in the element region R1. Every adjacent contact electrodes 19E are electrically separated from each other by the embedded layer 18 and the interlayer insulating films 19A and 19B. The contact electrode 19E includes, for example, a copper (Cu) pad, and is exposed in the bonding surface S2. The dummy electrode 19ED is provided, for example, in the peripheral region R2. The dummy electrode 19ED is coupled to a dummy electrode 22ED of the wiring layer 20W described later. Providing the dummy electrode 19ED and the dummy electrode 22ED makes it possible to improve strength of the peripheral region R2. The dummy electrode 19ED is formed in the same step as that of the contact electrode 19E, for example. The dummy electrode 19ED includes, for example, a copper (Cu) pad, and is exposed in the bonding surface S2.

The first electrode 11 provided between the contact electrode 19E and the semiconductor layer 10S is an electrode (anode) to be supplied with a voltage for reading signal charges (holes or electrons; in the following, description is given with the signal charges assumed as holes for convenience in description) generated in a photoelectric conversion layer 13, and is provided for each of the pixels P in the element region R1. The first electrode 11 is provided to fill an opening of the insulating film 17, and is in contact with the semiconductor layer 10S (more specifically, a diffusion region 12A described later). The first electrode 11 is larger than the opening of the insulating film 17, for example, and a portion of the first electrode 11 is provided in the embedded layer 18. That is, a top surface (a surface on the side of the semiconductor layer 10S) of the first electrode 11 is in contact with the diffusion region 12A, and a bottom surface and a portion of a side surface of the first electrode 11 are in contact with the embedded layer 18. Every adjacent first electrodes 11 are electrically separated from each other by the insulating film 17 and the embedded layer 18.

The first electrode 11 includes, for example, any one of titanium (Ti), tungsten (W), titanium nitride (TiN), platinum (Pt), gold (Au), germanium (Ge), palladium (Pd), zinc (Zn), nickel (Ni), and aluminum (Al), as a single element, or an alloy containing at least one of them. The first electrode 11 may be a single film of such a constituent material, or may be a stacked film including two or more of the materials in combination. For example, the first electrode 11 includes a stacked film of titanium and tungsten. The first electrode 11 has a thickness of, for example, several tens of nm to several hundreds of nm.

The semiconductor layer 10S includes, for example, the first contact layer 12, the photoelectric conversion layer 13, and the second contact layer 14 from a position close to the wiring layer 10W. The first contact layer 12, the photoelectric conversion layer 13, and the second contact layer 14 have the same planar shape as each other, and respective end surfaces are disposed at the same position in a plan view.

The first contact layer 12 is provided to be shared by all of the pixels P, for example, and is disposed between the insulating film 17 and the photoelectric conversion layer 13. The first contact layer 12 serves to electrically separate every adjacent pixels P from each other, and a plurality of diffusion regions 12A, for example, is provided in the first contact layer 12. Using, for the first contact layer 12, a compound semiconductor material having a band gap larger than a band gap of a compound semiconductor material constituting the photoelectric conversion layer 13 makes it possible to suppress a dark current. For example, n-type InP (indium phosphide) may be used for the first contact layer 12.

The diffusion regions 12A provided in the first contact layer 12 are spaced apart from each other. Each of the pixels P is provided with a corresponding one of the diffusion regions 12A, and the first electrode 11 is coupled to a corresponding one of the diffusion regions 12A. The diffusion regions 12A are also provided in the OPB region R1B. The diffusion regions 12A each serve to read, from a corresponding one of the pixels P, signal charges generated in the photoelectric conversion layer 13, and include p-type impurities, for example. Examples of the p-type impurities include Zn (zinc). In this way, a p-n junction interface is formed between each of the diffusion regions 12A and the first contact layer 12 other than the diffusion regions 12A, thus allowing every adjacent pixels P to be electrically separated from each other. The diffusion regions 12A are provided, for example, in a thickness direction of the first contact layer 12, and are also provided in a portion of a thickness direction of the photoelectric conversion layer 13.

The photoelectric conversion layer 13 between the first electrode 11 and the second electrode 15, more specifically, between the first contact layer 12 and the second contact layer 14, is provided to be shared by all of the pixels P, for example. The photoelectric conversion layer 13 absorbs light of a predetermined wavelength to generate signal charges, and includes a compound semiconductor material such as an i-type group III-V semiconductor, for example. Examples of the compound semiconductor material included in the photoelectric conversion layer 13 include InGaAs (indium gallium arsenide), InAsSb (indium arsenide antimonide), InAs (indium arsenide), InSb (indium antimonide), and HgCdTe (mercury cadmium tellurium). The photoelectric conversion layer 13 may include Ge (germanium). The photoelectric conversion layer 13 performs photoelectric conversion of light of a wavelength ranging from a visible region to a short-infrared region, for example.

The second contact layer 14 is provided to be shared by all of the pixels P, for example. The second contact layer 14 is provided between the photoelectric conversion layer 13 and the second electrode 15, and is in contact with both of them. The second contact layer 14 is a region through which electrical charges discharged from the second electrode 15 migrate, and includes, for example, a compound semiconductor containing n-type impurities. For example, n-type InP (indium phosphide) may be used for the second contact layer 14.

The second electrode 15 serves as an electrode shared by the pixels P, for example, and is so provided on the second contact layer 14 (on light entrance side) as to be in contact with the second contact layer 14. The second electrode 15 (a cathode) serves to discharge electrical charges that are not used as signal charges among the electrical charges generated in the photoelectric conversion layer 13. It is possible to discharge, for example, electrons through the second electrode 15 in a case where holes are to be read from the first electrode 11 as the signal charges, for example. The second electrode 15 includes, for example, an electrically-conductive film that is able to transmit entering light such as infrared rays. For example, ITO (Indium Tin Oxide), ITiO ($In_2O_3$—$TiO_2$), or the like may be used for the second electrode 15. The second electrode 15 may be provided in a lattice shape to partition every adjacent pixels P, for example, as in Modification Example 4 to be described later. In such a case, an electrically-conductive material having low light-transmissivity may be used for the second electrode 15.

The passivation films 16A and 16B cover the second electrode 15 from the side of the light entrance surface S1. The passivation films 16A and 16B is preferably formed using a material that does not absorb light of a wavelength ranging from the visible region (e.g., 380 nm or more and less than 780 nm) to the short-infrared region (e.g., 780 nm or more and less than 2400 nm). The passivation films 16A and 16B may be formed using the same material or different materials. Further, the passivation films 16A and 16B may have an antireflection function. The passivation films 16A and 16B may be formed by, for example, an ALD (Atomic Layer Deposition) method, a CVD (Chemical Vapor Deposition) method, a PVD (Physical Vapor deposition) method, an application method, or the like.

The passivation film 16A is provided on the second electrode 15 as described above, and extends to a chip end E of the peripheral region R2, for example. The passivation film 16A has an opening 16H in the OPB region R1B. As illustrated in FIG. 2, the opening 16H is provided in a frame shape surrounding the light-receiving region, for example. The opening 16H may be, for example, a hole having a quadrangular shape or a circular shape in a plan view. The opening 16H of the passivation film 16A allows the electrically-conductive film 15B described later to be electrically coupled to the second electrode 15.

The passivation film 16A is preferably formed using a material having a non-reducing property. Examples of the material having a non-reducing property include oxides ($M_xO_y$), nitrides ($M_xN_y$), and oxynitrides ($M_xO_yN_z$). M may be silicon (Si), titanium (Ti), hafnium (Hf), zirconium (Zr), or yttrium (Y). The letters x, y, and z represent integers of 1 or greater. It is to be noted that, for silicon nitride (SiN), a film-forming method that does not use any reducing gas is desirably used. Examples of such a film-forming method include a sputtering method and an application method. The passivation film 16A may be formed as a single-layer film of any one of the above-described materials, for example. In a case of providing the passivation film 16A as a single-layer film, it is preferable that the single-layer film have a film density of 2.0 g/cm$^3$ or higher. For example, the film density is not higher than 8.0 g/cm$^3$, although no particular upper limit thereof is specified. It is to be noted that the film density is defined by mass divided by volume (g/cm$^3$) for a thin film, and is obtained through XRR measurements, for example. A sealing function is thereby added to the passivation film 16A. The passivation film 16A may be formed as a stacked film in which a film 16A1 and a film 16A2 as illustrated in FIG. 3 are stacked in this order, for example. In a case of forming the passivation film 16A as the stacked film, the film 16A1 to be in direct contact with the second electrode 15 is preferably formed using any one of the above-described materials. The film 16A1 has a thickness of, for example, 0.5 nm or more. For the film 16A2, it is preferable to use a material having a high sealing property, such as silicon nitride (SiN) or aluminum oxide ($Al_2O_3$), for example. Further, the passivation film 16A may be provided as a multilayer film in which three or more films 16A1, 16A2, 16A3, 16A4, . . . and 16AX are stacked on the second electrode 15, as illustrated in FIG. 4.

The passivation film 16B is provided to cover the passivation film 16A and the electrically-conductive film 15B, and extends, for example, to the chip end E of the peripheral region R2, similarly to the passivation film 16A. For the passivation film 16B, it is possible to use, for example, silicon nitride (SiN), aluminum oxide ($Al_2O_3$), silicon oxide ($SiO_2$), tantalum oxide ($Ta_2O_3$), or the like. It is to be noted that regarding the passivation film 16B, there is no particular limitation to a film-forming method for silicon nitride (SiN), and a silicon nitride (SiN) film formed through a plasma CVD method using a reducing gas, instead of the sputtering method or the application method, may be used.

The insulating film 17 is provided between the first contact layer 12 and the embedded layer 18, and covers the end surface of the first contact layer 12, an end surface of the photoelectric conversion layer 13, the end surface of the second contact layer 14, and an end surface of the second electrode 15, being in contact with the passivation film 16 in the peripheral region R2. The insulating film 17 includes, for example, an oxide such as silicon oxide ($SiO_X$) or aluminum oxide ($Al_2O_3$). The insulating film 17 may be configured by a stacked structure including a plurality of films. The insulating film 17 may include, for example, a silicon (Si)-based insulating material such as silicon oxynitride (SiON), carbon-containing silicon oxide (SiOC), silicon nitride (SiN), or silicon carbide (SiC). The insulating film 17 has a thickness of several tens of nm to several hundreds of nm, for example.

The electrically-conductive film 15B is provided to extend from the OPB region R1B to the through hole H1 in the peripheral region R2. The electrically-conductive film 15B is in contact with the second electrode 15 at the opening 16H of the passivation film 16A provided in the OPB region R1B, and is in contact with a wiring line (a wiring line 22CB described later) of the readout circuit substrate 20 via the through hole H1. This allows a voltage to be supplied from the readout circuit substrate 20 to the second electrode 15 via the electrically-conductive film 15B. The electrically-conductive film 15B functions as a voltage-supply path to the second electrode 15, and also has a function as a light-blocking film to form the OPB region RIB. The electrically-conductive film 15B includes, for example, a metal material including tungsten (W), aluminum (Al), titanium (Ti), molybdenum (Mo), tantalum (Ta), or copper (Cu). The passivation film 16B may be provided on the electrically-conductive film 15B.

An adhesive layer B may be provided between an end part of the second contact layer 14 and the second electrode 15. As described later, the adhesive layer B is used in forming the light-receiving element 1, and plays a role of bonding the semiconductor layer 10S to a temporary substrate (a temporary substrate 33 in FIG. 7C described later). The adhesive layer B includes, for example, tetraethoxysilane (TEOS), silicon oxide ($SiO_2$), or the like. The adhesive layer B is provided to have an increased width with respect to the end surface of the semiconductor layer 10S, for example, and is covered with the embedded layer 18 together with the semiconductor layer 10S. The insulating film 17 is provided between the adhesive layer B and the embedded layer 18.

FIGS. 5 and 6 each illustrate another example of the configuration of the adhesive layer B. The adhesive layer B may be provided over a wide region in the peripheral region R2, and may extend, for example, from the vicinity of an edge of the semiconductor layer 10S (the element region R1) to a location between the through hole H1 and the through hole H2 (FIG. 5). Alternatively, the adhesive layer B may extend from the vicinity of the edge of the semiconductor layer 10S (the element region R1) to the chip end (the chip end E) (FIG. 6).

The embedded layer 18 serves to fill a level difference between the temporary substrate (the temporary substrate 33 in FIG. 7C described later) and the semiconductor layer 10S in a manufacturing step of the light-receiving element 1. The formation of the embedded layer 18 suppresses the occurrence of a defect in the manufacturing steps resulting from the level difference between the semiconductor layer 10S and the temporary substrate 33, which will be described in detail later.

The embedded layer 18 in the peripheral region R2 is provided between the wiring layer 10W and the insulating film 17 and between the wiring layer 10W and the passivation film 16, and has a thickness equal to or larger than a thickness of the semiconductor layer 10S, for example. Here, the embedded layer 18 is provided to surround the semiconductor layer 10S, thereby forming a region (the peripheral region R2) around the semiconductor layer 10S. This enables the bonding surface S2 to the readout circuit substrate 20 to be provided in the peripheral region R2. In a case where the bonding surface S2 is formed in the peripheral region R2, the thickness of the embedded layer 18 may be reduced; however, it is preferable that the embedded layer 18 cover the semiconductor layer 10S in the thickness direction and that the entire end surface of the semiconductor layer 10S be covered with the embedded layer 18. By allowing the entire end surface of the semiconductor layer 10S to be covered with the embedded layer 18 with the insulating film 17 interposed therebetween, it is possible to effectively suppress entry of water into the semiconductor layer 10S. The embedded layer 18 in the element region R1 is provided between the semiconductor layer 10S and the wiring layer 10W to cover the first electrode 11.

A surface of the embedded layer 18 on the side of the bonding surface S2 is planarized, and the wiring layer 10W is provided on the planarized surface of the embedded layer 18 in the peripheral region R2. For the embedded layer 18, an inorganic insulating material such as silicon oxide ($SiO_X$), silicon nitride (SiN), silicon oxynitride (SiON), carbon-containing silicon oxide (SiOC), or silicon carbide (SiC) may be used, for example.

As described later, in the step of manufacturing the light-receiving element 1, the embedded layer 18 is formed, and thereafter the wiring layer 10W including the interlayer insulating films 19A and 19B and the contact electrode 19E is formed above the embedded layer 18 (FIG. 17D described later). The readout circuit substrate 20 including the wiring layer 20W is attached to the element substrate 10 including the wiring layer 10W (FIG. 17E described later) to form the light-receiving element 1. At this time, the contact electrode 19E of the wiring layer 10W and a contact electrode 22E of the wiring layer 20W are coupled to each other. The contact electrodes 19E and 22E each include, for example, a Cu pad; this direct bonding of the Cu pads allows the contact electrodes 19E and 22E to be coupled to each other. In forming the contact electrode 19E by means of a CMP (Chemical Mechanical Polishing) method, it is demanded that the embedded layer 18 disposed below a copper film to be polished have enough hardness to withstand stress during the polishing. In addition, in order to directly bond the Cu pads of the contact electrodes 19E and 22E to each other, it is necessary to form the element substrate 10 and the readout circuit substrate 20 to be extremely planar. For this reason, it is preferable that the embedded layer 18 disposed below the copper film have enough hardness to withstand stress during the polishing. Specifically, a constituent material of the embedded layer 18 is preferably a material having a hardness higher than that of a sealant or an organic material to be disposed around a die in a typical semiconductor package. Examples of the material having such a high hardness include an inorganic insulating material. Forming a film of the inorganic insulating material by a CVD (Chemical Vapor Deposition) method, a sputtering method, or a coating method, for example, makes it possible to form the embedded layer 18.

The embedded layer 18 is provided with the through holes H1 and H2 that penetrate the embedded layer 18. The through holes H1 and H2 penetrate the wiring layer 10W in addition to the embedded layer 18 to reach the readout circuit substrate 20. The through holes H1 and H2 have a quadrangular planar shape, for example, and respective pluralities of through holes H1 and H2 are provided to surround the element region R1 (FIG. 1A). The through holes H1 are provided at positions closer to the element region R1 than the through holes H2, and a side wall and a bottom surface of each of the through holes H1 are covered with the electrically-conductive film 15B. The through holes H1 serve to couple the second electrode 15 (the electrically-conductive film 15B) and the wiring line (the wiring line 22CB described later) of the readout circuit substrate 20 to each other, and are provided to penetrate the passivation film 16, the embedded layer 18, and the wiring layer 10W.

The through holes H2 are provided at positions closer to the chip end E than the through holes H1, for example. The through holes H2 penetrate the passivation film 16, the embedded layer 18, and the wiring layer 10W to reach a pad electrode (a pad electrode 22P described later) of the readout circuit substrate 20. The through holes H2 allow the light-receiving element 1 to be electrically coupled to the outside. Neither the through holes H1 nor the through holes H2 may reach the readout circuit substrate 20. For example, the through holes H1 and H2 may reach a wiring line of the wiring layer 10W, and the wiring line may be coupled to the wiring line 22CB and the pad electrode 22P of the readout circuit substrate 20. The through holes H1 and H2 may penetrate the adhesive layer B (FIGS. 5 and 6).

Holes and electrons generated at the photoelectric conversion layer 13 are read from the first electrode 11 and the second electrode 15. In order to perform the reading operation at high speed, the distance between the first electrode 11 and the second electrode 15 is preferably set to a distance that is enough for photoelectric conversion but is not too far. That is, it is preferable to reduce a thickness of the element substrate 10. For example, the distance between the first electrode 11 and the second electrode 15 or the thickness of the element substrate 10 is 10 μm or less, further 7 μm or less, and furthermore 5 μm or less.

The semiconductor substrate 21 of the readout circuit substrate 20 is opposed to the element substrate 10, with the wiring layer 20W and the multilayer wiring layer 22C interposed therebetween. The semiconductor substrate 21 includes, for example, silicon (Si). A plurality of transistors is provided in the vicinity of a surface of the semiconductor substrate 21 (a surface on the side of the wiring layer 20W). For example, the plurality of transistors is used to constitute a readout circuit (Read Out Circuit) for each of the pixels P. The wiring layer 20W includes, for example, an interlayer insulating film 22A and an interlayer insulating film 22B in this order from the side of the element substrate 10, and these interlayer insulating films 22A and 22B are provided as a stack. For example, the contact electrode 22E and the dummy electrode 22ED are provided in the interlayer insulating film 22A. The multilayer wiring layer 22C is provided to be opposed to the element substrate 10 with the wiring layer 20W interposed therebetween. For example, the pad electrode 22P and a plurality of wiring lines 22CB are provided in the multilayer wiring layer 22C. The interlayer insulating films 22A and 22B each include, for example, an inorganic insulating material. Examples of the inorganic insulating material include silicon nitride (SiN), aluminum oxide ($Al_2O_3$), silicon oxide ($SiO_2$), and hafnium oxide ($HfO_2$).

The contact electrode 22E serves to electrically couple the first electrode 11 and the wiring line 22CB to each other, and is provided for each of the pixels P in the element region R1. The contact electrode 22E is in contact with the contact electrode 19E at the bonding surface S2 of the element substrate 10. Every adjacent contact electrodes 22E are electrically separated from each other by the interlayer insulating film 22A.

The dummy electrode 22ED provided in the peripheral region R2 is in contact with the dummy electrode 19ED at the bonding surface S2 of the element substrate 10. The dummy electrode 22ED is formed in the same step as that of the contact electrode 22E, for example. The contact electrode 22E and the dummy electrode 22ED each include, for example, a copper (Cu) pad, and are exposed in a surface of the readout circuit substrate 20 facing the element substrate 10. That is, for example, Cu—Cu bonding is established between the contact electrode 19E and the contact electrode 22E and between the dummy electrode 19ED and the dummy electrode 22ED. This enables miniaturization of the pixels P, which will be described in detail later.

The wiring line 22CB coupled to the contact electrode 19E is coupled to a transistor provided in the vicinity of the surface of the semiconductor substrate 21, thus allowing the first electrode 11 and a readout circuit to be coupled to each other for each of the pixels P. The wiring line 22CB coupled to the electrically-conductive film 15B via the through hole H1 is coupled to a predetermined potential, for example. In this manner, one of the electrical charges generated in the photoelectric conversion layer 13 (e.g., holes) are read at the readout circuit from the first electrode 11 via the contact electrodes 19E and 22E. The other of the electrical charges generated in the photoelectric conversion layer 13 (e.g., electrons) are discharged to a predetermined potential from the second electrode 15 via the electrically-conductive film 15B.

The pad electrode 22P provided in the peripheral region R2 serves to allow for electrical coupling to the outside. The through hole H2 that penetrates the element substrate 10 to reach the pad electrode 22P is provided in the vicinity of the chip end E of the light-receiving element 1, and the through hole H2 allows for electrical coupling to the outside. The coupling is established by a method such as wire bonding or bump, for example. For example, a predetermined potential may be supplied to the second electrode 15 from an external terminal disposed in the through hole H2 via the wiring line 22CB of the through hole H2 readout circuit substrate 20 and the electrically-conductive film 15B. As a result of the photoelectric conversion in the photoelectric conversion layer 13, a signal voltage read from the first electrode 11 may be read at the readout circuit of the semiconductor substrate 21 via the contact electrodes 19E and 22E, and the signal voltage may be outputted to the external terminal disposed in the through hole H2 via the readout circuit. The signal voltage may be outputted to the external terminal via other circuits, in addition to the readout circuit, included in the readout circuit substrate 20, for example. Other circuits refer to a signal processing circuit, an output circuit, and the like, for example.

A thickness of the readout circuit substrate 20 is preferably larger than the thickness of the element substrate 10. For example, the thickness of the readout circuit substrate 20 is preferably two times or more larger than the thickness of the element substrate 10, more preferably five times or more, and still more preferably ten times or more. Alternatively, the thickness of the readout circuit substrate 20 is, for example, 100 μm or more, 150 μm or more, or 200 μm or more. The readout circuit substrate 20 having such a large thickness ensures mechanical strength of the light-receiving element 1. It is to be noted that the readout circuit substrate 20 may include only one layer of the semiconductor substrate 21 forming the circuit, or may further include a substrate such as a support substrate, in addition to the semiconductor substrate 21 forming the circuit.

(1-2. Method of Manufacturing Light-Receiving Element)

The light-receiving element 1 may be manufactured in the following manner, for example. FIGS. 7A, 7B, 7C, 8, 9, 10A, 10B, 11A, 11B, 12A, 12B, 13A, 13B, 14A, 14B, 15, 16, 17A, 17B, 17C, 17D, 17E, 17F, 17G, 17H, 17I, and 17J illustrate manufacturing steps of the light-receiving element 1 in the order of steps.

First, as illustrated in FIG. 7A, the semiconductor layer 10S is epitaxially grown on a growth substrate 31 including InP, for example. The growth substrate 31 has a thickness of several hundreds of μm, for example, and the semiconductor layer 10S has a thickness of several μm, for example. Thereafter, the adhesive layer B is deposited on the semiconductor layer 10S, as illustrated in FIG. 7B. The growth substrate 31 has a diameter of six inches or less, for example. The formation of the semiconductor layer 10S is performed, for example, by epitaxially growing n-type InP to configure the first contact layer 12, i-type InGaAs to configure the photoelectric conversion layer 13, and n-type InP to configure the second contact layer 14 in this order. For example, the semiconductor layer 10S may be formed after forming a buffer layer and a stopper layer on the growth substrate 31.

Next, as illustrated in FIG. 7C, the growth substrate 31 on which the semiconductor layer 10S is formed is bonded to the temporary substrate 33 with the adhesive layer B interposed therebetween. The temporary substrate 33 includes, for example, an insulating layer (an insulating layer 33IA) and a substrate 33S. The insulating layer 33IA is disposed, for example, between the adhesive layer B and the substrate 33S. A substrate having a diameter larger than that of the growth substrate 31 is used as the temporary substrate 33, and a silicon (Si) substrate is used as the substrate 33S, for example. The temporary substrate 33 has a diameter of, for example, eight inches to twelve inches. Bonding the growth substrate 31 of a small diameter to the temporary substrate 33 of a large diameter enables use of various devices for a substrate of a large diameter in forming the element substrate 10. This makes it possible to use, for example, Cu—Cu bonding for bonding of the readout circuit substrate 20 and the element substrate 10 to each other, thus allowing for miniaturization of the pixels P. The bonding of the growth substrate 31 to the temporary substrate 33 may be performed by plasma-activated bonding, normal temperature bonding, bonding using an adhesive (adhesive bonding), or the like. In this way, the semiconductor layer 10S in a wafer shape, for example, is bonded to the temporary substrate 33. The temporary substrate 33 has a thickness of several hundreds of μm, for example.

FIGS. 8 and 9 each illustrate an example of a planar configuration of the temporary substrate 33 and the semiconductor layer 10S (the growth substrate 31). To the temporary substrate 33 in a wafer state, the semiconductor layer 10S in a wafer state smaller than the temporary substrate 33 may be bonded (FIG. 8), or a plurality of semiconductor layers 10S in a state of chips separated from one another may be bonded to the temporary substrate 33 in a wafer state (FIG. 9).

Alternatively, as illustrated in FIGS. 10A and 10B, to the temporary substrate 33 in a wafer state, the semiconductor layer 10S in a wafer state of the same size as that of the temporary substrate 33 may be bonded. FIG. 10A illustrates a planar configuration of the temporary substrate 33 and the semiconductor layer 10S (the growth substrate 31), and FIG. 10B illustrates a cross-sectional configuration along line B-B of FIG. 10A.

After the growth substrate 31 on which the semiconductor layer 10S is formed is bonded to the temporary substrate 33, the growth substrate 31 is removed as illustrated in FIG. 11A. The removal of the growth substrate 31 may be performed by mechanical grinding, CMP (Chemical Mechanical Polishing: chemical mechanical polishing), wet etching, dry etching, or the like. At this time, a portion of the growth substrate 31 may remain. In addition, the semiconductor layer 10S may be partially etched.

Subsequently, as illustrated in FIG. 11B, for example, the semiconductor layer 10S is etched to a predetermined size in accordance with marking of the temporary substrate 33. This allows for formation of semiconductor layers 10S in a state of a plurality of chips. FIG. 11B and subsequent drawings illustrate two semiconductor layers 10S among the semiconductor layers 10S in the state of a plurality of chips.

FIG. 12A illustrates an example of a planar configuration of the semiconductor layer 10S prior to molding, and FIG. 12B illustrates an example of a planar configuration of the semiconductor layer 10S after the molding subsequent to FIG. 12A. FIG. 13A illustrates another example of the planar configuration of the semiconductor layer 10S prior to the molding, and FIG. 13B illustrates another example of the planar configuration of the semiconductor layer 10S after the molding subsequent to FIG. 13A. Thus, the semiconductor layer 10S in a wafer state smaller than the temporary substrate 33 (FIG. 12A) or the same size as the temporary substrate 33 (FIG. 13A) is molded into the semiconductor layers 10S in a state of a plurality of chips.

Alternatively, as illustrated in FIGS. 14A and 14B, a plurality of semiconductor layers 10S in a chip state may be molded into a plurality of semiconductor layers 10S in a smaller chip state.

In etching the semiconductor layer 10S, the adhesive layer B is etched together with the semiconductor layer 10S, for example. The adhesive layer B may remain to have increased width as compared with the semiconductor layer 10S, and the adhesive layer B may extend around the semiconductor layer 10S (FIG. 11B).

Alternatively, as illustrated in FIG. 15, the adhesive layer B may be narrower than the semiconductor layer 10S, and there may be a gap between the semiconductor layer 10S and the temporary substrate 33. The adhesive layer B may be etched to have the same size as that of the semiconductor layer 10S.

As illustrated in FIG. 16, the adhesive layer B may not be etched in etching the semiconductor layer 10S.

After the molding of the semiconductor layer 10S, the diffusion region 12A is formed in the semiconductor layer 10S for each of the pixels P as illustrated in FIG. 17A. This allows for element separation. For the formation of the diffusion region 12A, for example, the insulating film 17 is used as a hard mask. Specifically, the insulating film 17 is formed to cover a top surface of the semiconductor layer 10S (a surface opposite to a bonding surface to the temporary substrate 33) and a side surface thereof, and thereafter an opening is formed by etching in the insulating film 17 covering the top surface of the semiconductor layer 10S. Thereafter, gas phase diffusion of p-type impurities is performed using the insulating film 17 as a hard mask. This allows for formation of the diffusion region 12A in a selective region. A diffusion depth is, for example, several hundreds of nm, and substantially isotropic diffusion is performed. The diffusion region 12A may be formed by ion implantation or the like using a resist mask. Here, the diffusion region 12A is formed in the semiconductor layer 10S provided on the temporary substrate 33 of a large diameter, thus making it possible to miniaturize the pixels P.

After providing the diffusion region 12A in the semiconductor layer 10S, the first electrode 11 is formed on the semiconductor layer 10S as illustrated in FIG. 17B. For example, the first electrode 11 is formed by forming, in the opening provided in the insulating film 17, a stacked film of titanium (Ti)/tungsten (W) by means of a CVD method, a PVD method, an ALD method, a vapor deposition method, or the like, and thereafter patterning the stacked film using photolithography and etching.

After the formation of the first electrode 11, the embedded layer 18 is formed over the entire surface of the temporary substrate 33 as illustrated in FIG. 17C. The embedded layer 18 is formed by, for example, forming a film of an insulating material so as to embed the semiconductor layer 10S over the entire surface of the temporary substrate 33 and thereafter planarizing the film of the insulating material by CMP (Chemical Mechanical Polishing). This allows for formation of the embedded layer 18 covering the circumference (the peripheral region R2) of the semiconductor layer 10S and the top surface (a surface farthest from the temporary substrate 33) of the semiconductor layer 10S. In the present embodiment, the embedded layer 18 is formed to fill a step difference between the semiconductor layer 10S and the temporary substrate 33, thus suppressing the occurrence of a defect in the manufacturing steps resulting from the level difference, which will be described in detail later.

After the formation of the embedded layer 18, the wiring layer 10W is formed that is opposed to the semiconductor layer 10S with the embedded layer 18 interposed therebetween, as illustrated in FIG. 17D. For example, the interlayer insulating film 19A and the interlayer insulating film 19B are formed in this order on the embedded layer 18, and thereafter an opening is formed in a region of the interlayer insulating films 19A and 19B facing the first electrode 11. A copper (Cu) film is formed in the opening of the interlayer insulating films 19A and 19B by means of a vapor deposition method, a PVD method, a plating method, or the like, and thereafter a surface of the copper film is polished by means of a CMP method, for example, to thereby form the contact electrode 19E. For example, the dummy electrode 19ED is formed in the peripheral region R2 in the same step as the step of forming the contact electrode 19E. Here, the wiring layer 10W is formed over the temporary substrate 33 of a large diameter, thus making it possible to use various devices for a substrate of a large diameter.

After the formation of the wiring layer 10W, the readout circuit substrate 20 is attached to the temporary substrate 33 with the wiring layer 10W interposed therebetween, as illustrated in FIG. 17E. At this time, the wiring layer 20W is formed in advance in the readout circuit substrate 20. The wiring layer 20W of the readout circuit substrate 20 includes the contact electrode 22E and the dummy electrode 22ED. In attaching the readout circuit substrate 20 to the temporary substrate 33, for example, Cu—Cu bonding is established between the contact electrode 22E as well as the dummy electrode 22ED of the wiring layer 20W and the contact electrode 19E as well as the dummy electrode 19ED of the wiring layer 10W. More specifically, the bonding surface S2 at which the contact electrode 19E and the contact electrode 22E are bonded to each other is formed in the element region R1, and the bonding surface S2 at which the dummy electrode 19ED and the dummy electrode 22ED are bonded to each other is formed in the peripheral region R2. Here, the peripheral region R2 of the element substrate 10 is also bonded to the readout circuit substrate 20.

After the attachment of the readout circuit substrate 20 to the temporary substrate 33, the temporary substrate 33 is removed as illustrated in FIG. 17F. The temporary substrate 33 may be removed by using, for example, mechanical grinding, wet etching, dry etching, or the like.

After the removal of the temporary substrate 33, the adhesive layer B or the like is also removed to expose the surface of the semiconductor layer 10S as illustrated in FIG. 17G. At this time, an unnecessary layer of the semiconductor layer 10S may be removed. In addition, the insulating layer 331A or the insulating film 17 may partially be allowed to remain in a region other than the opening of the semiconductor layer 10S, or the embedded layer 18 may be dug halfway.

Subsequently, as illustrated in FIG. 17H, the second electrode 15 and the passivation film 16A are formed in this order on a surface of the semiconductor layer 10S exposed by the removal of the temporary substrate 33 (a surface opposite to the surface provided with the wiring layer 10W). Thereafter, as illustrated in FIG. 17I, the through hole H1, the electrically-conductive film 15B, and the passivation film 16B are formed in this order. This allows the second electrode 15 and the readout circuit substrate 20 to be electrically coupled to each other.

Finally, as illustrated in FIG. 17J, the through hole H2 is formed that penetrates the element substrate 10 to reach the pad electrode 22P of the readout circuit substrate 20. The light-receiving element 1 illustrated in FIG. 1 is thereby completed.

(1-3. Operation of Light-Receiving Element)

In the light-receiving element 1, when light (e.g., light of wavelengths in the visible region and the infrared region) enters the photoelectric conversion layer 13 via the passivation films 16A and 16B, the second electrode 15, and the second contact layer 14, the light is absorbed in the photoelectric conversion layer 13. This generates pairs of holes (holes) and electrons (photoelectrical conversion is performed) in the photoelectric conversion layer 13. At this time, for example, upon application of a predetermined voltage to the first electrode 11, a potential gradient occurs in the photoelectric conversion layer 13, causing one of generated electrical charges (e.g., holes) to migrate as signal charges to the diffusion region 12A and to be collected from the diffusion region 12A to the first electrode 11. The signal charges migrate to the semiconductor substrate 21 through the contact electrodes 19E and 22E and are read for each of the pixels P.

(1-4. Workings and Effects of Light-Receiving Element)

In the light-receiving element 1 of the present embodiment, the passivation film 16A provided on the second electrode 15 that is provided on the side of the light entrance surface (the surface S1) of the semiconductor layer 10S is formed using a material having a non-reducing property. By forming the passivation film 16A using a material having a non-reducing property, adhesion between the second electrode 15 and the passivation film 16A is improved. This will be described below.

On the passivation film 16A, a wiring line (the electrically-conductive film 15B) for supplying a voltage from the readout circuit substrate 20 to the second electrode 15 is formed that also serves as a light-blocking film of the OPB (Optical Black) region R1B. However, the electrically-conductive film 15B can give rise to peeling at an interface between the second electrode 15 and the passivation film 16A due to a stress upon the formation thereof, thus causing a decrease in manufacturing yield. For a typical light-receiving element, the second electrode 15 is formed using an oxide transparent electrode material such as ITO, and the passivation film 16A is formed using silicon nitride (SiN). A cause of peeling at the interface between the second electrode 15 and the passivation film 16A is considered to be low adhesion due to poor reaction between a film surface of ITO and SiN.

In contrast, for the light-receiving element 1 of the present embodiment, the passivation film 16A formed directly on the second electrode 15 is formed using a material having a non-reducing property, specifically, an oxide, a nitride, or an oxynitride of Si, Ti, Hf, Zr, Y, or the like. Thus, reactivity between the second electrode 15 and the passivation film 16A is increased, and adhesion is improved. This reduces the occurrence of peeling at the interface between the second electrode 15 and the passivation film 16A caused by the stress upon the formation of the electrically-conductive film 15B. That is, it becomes possible to improve the manufacturing yield.

Further, the stress upon the formation of the electrically-conductive film 15B can cause distortion in the semiconductor layer 10S (specifically, the photoelectric conversion layer 13) to deteriorate dark-time characteristics. However, the formation of the passivation film 16A using a material having high adhesion to the second electrode 15 as described above makes it possible to prevent the deterioration in dark-time characteristics.

As described above, according to the light-receiving element 1 of the present embodiment, adhesion between the second electrode 15 and the passivation film 16A is improved because the passivation film 16A provided directly on the second electrode 15 is formed using a material having a non-reducing property. Therefore, the occurrence of peeling at the interface between the second electrode 15 and the passivation film 16A is reduced to make it possible to improve the manufacturing yield. Further, it is possible to prevent the deterioration in dark-time characteristics.

Description is given below of second and third embodiments and modification examples of the first to third embodiments. In the following description, the same constituent parts as those of the foregoing first embodiment are denoted by the same reference numerals, and descriptions thereof are omitted where appropriate.

2. Second Embodiment

FIG. 18 schematically illustrates a cross-sectional configuration of a light-receiving element 2 according to a second embodiment of the present disclosure. As with the foregoing first embodiment, the light-receiving element 2 is to be applied to, for example, an infrared sensor or the like that uses a compound semiconductor material such as a group III-V semiconductor, and has a photoelectric conversion function, for example, for light of a wavelength ranging from the visible region (e.g., 380 nm or more and less than 780 nm) to the short-infrared region (e.g., 780 nm or more and less than 2400 nm). For the light-receiving element 2, an electrically-conductive film 35B for supplying a voltage from the readout circuit substrate 20 to the second electrode 15 is formed using aluminum (Al).

The electrically-conductive film 35B is provided to extend from the OPB region R1B to the through hole H1 in the peripheral region R2. The electrically-conductive film 35B is in contact with the second electrode 15 at the opening 16H of a passivation film 16 provided in the OPB region R1B, and is in contact with a wiring line (the wiring line 22CB described later) of the readout circuit substrate 20 via the through hole H1. This allows a voltage to be supplied from the readout circuit substrate 20 to the second electrode 15 via the electrically-conductive film 35B. The electrically-conductive film 35B functions as a voltage-supply path to the second electrode 15, and also has a function as a light-blocking film to form the OPB region R1B.

The electrically-conductive film 35B includes, for example, a material that is low in film stress and is higher in light-blocking performance in the infrared region than tungsten (W), for example. Specifically, the electrically-conductive film 35B includes aluminum (Al). It is preferable that the electrically-conductive film 35B be formed as a stacked film of a barrier metal and an Al film. This makes it possible to prevent oxidation of Al in the opening 16H in contact with the second electrode 15. Examples of the barrier metal include a single-layer film of titanium (Ti) or titanium nitride (TiN), and a stacked film of Ti/TiN. In addition, tantalum (Ta), tungsten (W), or molybdenum (Mo), or a nitride or the like thereof may be used as a material of the barrier metal.

It is preferable that the electrically-conductive film 35B further have an antireflection structure on its surface. Specifically, it is preferable that a W film having a thickness of, for example, 30 nm be stacked on the Al film constituting the electrically-conductive film 35B. By stacking the W film on the Al film, the generation of ghosts is suppressed. In a case where it is difficult to process a stacked film of Al/W, a silicon oxide (SiOx) film or a silicon nitride (SiN) film may be formed between the Al film and the W film. It is to be noted that the antireflection structure may be omitted in a case where it is possible to attain the intended purpose by using a technique other than a metal film, such as the provision of a light-blocking film 37 including a black resist on the electrically-conductive film 15B, as in a third embodiment described later.

The passivation film 36 covers the second electrode 15 from the side of the light entrance surface S1, similarly to the passivation films 16A and 16B described above. The passivation film 36 may have an antireflection function. For the passivation film 36, for example, silicon nitride (SiN), aluminum oxide ($Al_2O_3$), silicon oxide ($SiO_2$), tantalum oxide ($Ta_2O_3$), or the like may be used.

In the light-receiving element 2 of the present embodiment, the electrically-conductive film 35B that is electrically coupled to the second electrode via the opening 16H formed in the passivation film 16 in the vicinity of the peripheral region R2 in the element region R1 is formed using Al. Forming the electrically-conductive film 35B using Al makes it possible to reduce a thickness of the electrically-conductive film 35B. This will be described below.

FIG. 19 illustrates relationships between wavelength and transmittance in various metal films obtained by transmission spectroscopic measurement of the metal films. The light-blocking performance expected of the electrically-conductive film 35B serving also as a light-blocking film is obtained as follows.

(Math. 1) Necessary light-blocking performance $N$ $$[dB]=d\,[nm] \times A\,[dB/nm] \quad (1)$$

(d: film thickness; A: light-blocking performance; dB=20 log T (T: transmittance)).

For example, assume that the necessary light-blocking performance in the near-infrared region (a design wavelength: 1.5 μm) is −120 dB. Determining necessary film thicknesses for the case of using the various metal films as the electrically-conductive film 35B from the above equation (1) indicates that, at a wavelength of 1500 nm, for example, a W film of a thickness of 60 nm has light-blocking performance of −31 dB, and therefore it is necessary for the W film to have a thickness of 240 nm to obtain light-blocking performance of −120 dB. In contrast, an Al film of a thickness of 60 nm has light-blocking performance of −81 dB at a wavelength of 1500 nm, and therefore it is necessary for the Al film to have a thickness of 90 nm to obtain light-blocking performance of −120 dB. Thus, as compared with the W film, the Al film is able to achieve light-blocking performance of the same level with a smaller thickness.

As described above, according to the light-receiving element 2 of the present embodiment, the electrically-conductive film 35B is formed using Al. This allows the electrically-conductive film 35B to be reduced in thickness as compared with the case where the electrically-conductive film 15B is formed using W as in the foregoing first embodiment. That is, the occurrence of stress upon the formation of the electrically-conductive film 35B is reduced. Accordingly, it is possible to improve the manufacturing yield. Further, it is possible to prevent the deterioration in dark-time characteristics.

Further, in the present embodiment, in order to prevent oxidation of Al constituting the electrically-conductive film 35B, the barrier metal is formed between the second electrode 15 and the electrically-conductive film 35B in the opening 16H in contact with the second electrode 15. This prevents Al from being oxidized by, for example, the ITO film constituting the second electrode 15, thus allowing stable and low-resistance electrical coupling between the second electrode 15 and the electrically-conductive film 35B.

Further, in the present embodiment, a W film is stacked as the antireflection structure on the Al film constituting the electrically-conductive film 35B. FIG. 20 illustrates absolute reflectances of a single-layer film of Al, a single-layer film of W, and a stacked film of Al/W. It is seen that as compared with the single-layer film of Al, stacking a 30-nm-thick W film on the Al film into the stacked film of Al/W provides a reflectance that is at the same level as that of the single-layer film of W. This makes it possible to suppress the generation of ghosts due to stray light reflected by the electrically-conductive film 35B.

Table 1 summarizes sputtering film formation conditions and film stresses of various metal films. Table 2 summarizes parameters in the case of using various electrically-conductive films as the electrically-conductive film 35B. FIG. 21 illustrates relationships between the film thicknesses of the various electrically-conductive films and warpage amounts of a Si substrate based on Table 2.

TABLE 1

| Kind of metal film | Sputtering film formation condition | Film stress |
|---|---|---|
| W | Substrate temperature: 200° C.; DC power: 2 kW; Ar flow rate: 100 scmm | −200 MPa |
| Al | Substrate temperature: 25° C.; DC power: 1 kW; Ar flow rate: 60 sccm | −10 MPa |
| TiN | Substrate temperature: 200° C.; DC power: 1 kW; Ar flow rate: 80 scmm | −1500 MPa |

TABLE 1-continued

| Kind of metal film | Sputtering film formation condition | Film stress |
|---|---|---|
| Ti | Substrate temperature: 200° C.; DC power: 6.5 kW; Ar/N2 flow rate: 45/80 sccm | −60 MPa |

TABLE 2

| | Sample 1 | Sample 2 | Sample 3 | Sample 4 | Sample 5 |
|---|---|---|---|---|---|
| Structure of electrically-conductive film (Lower layer / Upper layer) | W | Ti/W | Al | Ti/Al | Ti/Al/SiO$_2$/W |
| Each film thickness | 240 nm | 30/200 nm | 90 nm | 5/90 nm | 5/80/10/30 nm |
| Total film thickness | 240 nm | 230 nm | 90 nm | 95 nm | 125 nm |
| Light-blocking characteristic | −124 dB | −122 dB | −121 dB | −124 dB | Conform to standard |
| Stress | −6.1 | −5.6 | −0.1 | −0.2 | −0.9 |

Samples 1 and 2 are ones using W as comparative examples, and samples 3 to 5 are ones corresponding to the electrically-conductive film 35B of the present embodiment. In the electrically-conductive films including a barrier metal (Ti) (Samples 2, 4, and 5), the film thicknesses of W and Al are adjusted to allow the total light-blocking performance to exceed −120 dB. The stress is expressed in a value obtained in the case of forming each of the electrically-conductive films by sputtering using the conditions in Table 1, and is represented by a warpage amount of an Si substrate of a wafer size of ϕ200 mm generated by a synthesis from the stress values of the electrically-conductive films. The stress and the warpage amount represent a direction of compression when both of them have negative values, and represent a direction of expansion when both of them have positive values. It is recognizable that the stress is greatly reduced in samples 3 to 5 using Al, as compared with the electrically-conductive films of samples 1 and 2 using W.

3. Third Embodiment

FIG. 22 schematically illustrates a cross-sectional configuration of a light-receiving element (a light-receiving element 3) according to a third embodiment of the present disclosure. As with the first embodiment described above, the light-receiving element 3 is to be applied to, for example, an infrared sensor or the like that uses a compound semiconductor material such as a group III-V semiconductor, and has a photoelectric conversion function, for example, for light of a wavelength ranging from the visible region (e.g., 380 nm or more and less than 780 nm) to the short-infrared region (e.g., 780 nm or more and less than 2400 nm). In the light-receiving element 3, a light-blocking film 37 including a black resist, for example, is provided on the electrically-conductive film 15B.

The light-blocking film 37 forms the OPB region R1B together with the electrically-conductive film 15B. The light-blocking film 37 is formed using a black resist, for example. An end surface (a surface 37S) of the light-blocking film 37 on the side of the element region R1 extends more forward into the element region R1 than an end surface (a surface 15S) of the electrically-conductive film 15B on the side of the element region R1, for example. In other words, the end surface (the surface 15S) of the electrically-conductive film 15B on the side of the element region R1 is covered by the light-blocking film 37. The end surface structure of the electrically-conductive film 15B and the light-blocking film 37 on the side of the element region is not limited thereto. For example, as illustrated in FIG. 23, the end surface (the surface 37S) of the light-blocking film 37 on the side of the element region R1 and the end surface (the surface 15S) of the electrically-conductive film 15B on the side of the element region R1 may be coplanar. Alternatively, as illustrated in FIG. 24, the end surface (the surface 15S) of the electrically-conductive film 15B on the side of the element region R1 may protrude more forward into the element region R1 than the end surface (the surface 37S) of the light-blocking film 37 on the side of the element region R1. Further, the light-blocking film 37 may not necessarily be formed directly on the electrically-conductive film 15B. For example, as illustrated in FIG. 25, a passivation film 36B may be formed between the electrically-conductive film 15B and the light-blocking film 37.

As described above, in the light-receiving element 3 of the present embodiment, the light-blocking film 37 including a black resist, for example, is provided above the electrically-conductive film 15B. This makes it possible to reduce the thickness of the electrically-conductive film 15B. That is, the generation of stress upon the formation of the electrically-conductive film 35B is reduced. Accordingly, it is possible to improve the manufacturing yield. Further, it is possible to prevent the deterioration in dark-time characteristics. Furthermore, it is possible to reduce the occurrence of flare.

It is to be noted that although the second embodiment and the third embodiment have been described with reference to an example in which the passivation film 36 is formed using, for example, silicon nitride (SiN), aluminum oxide ($Al_2O_3$), silicon oxide ($SiO_2$), tantalum oxide ($Ta_2O_3$), or the like, this is non-limiting. The light-receiving element 2 and the light-receiving element 3 may each use an oxide, a nitride, or an oxynitride of Si, Ti, Hf, Zr, Y, or the like for the formation thereof, like the passivation film 16A in the foregoing first embodiment. Further, for example, the light-receiving element 3 may have a configuration in which the passivation film 16 constituting the light-receiving element 1 and the electrically-conductive film 35B constituting the light-receiving element 2 are combined. By combining the configurations of the foregoing first to third embodiments with each other, it is possible to further improve the manufacturing yield. Further, it is possible to better prevent the deterioration in dark-time characteristics.

4. Modification Example 1

FIG. 26 illustrates a cross-sectional configuration of a main part of a light-receiving element (a light-receiving element 4) according to Modification Example 1 of the first to third embodiments described above. In the light-receiving element 4, the embedded layer 18 includes a first embedded layer 18A and a second embedded layer 18B that are stacked. Except for this point, the light-receiving element 4 has a configuration and effects similar to those of the light-receiving element 1. It is to be noted that in FIG. 26, a cross-sectional configuration based on the light-receiving element 1 illustrated in FIG. 1 is illustrated by way of example. Further, in FIG. 26, the passivation films 16A and 16B are illustrated collectively as a passivation film 16 for the sake of simplification.

The first embedded layer 18A is disposed in the peripheral region R2, and is provided on the side of the light entrance surface S1 relative to the second embedded layer 18B. Specifically, the first embedded layer 18A is disposed between the second embedded layer 18B and the passivation film 16, and covers the end surface of the semiconductor layer 10S.

The second embedded layer 18B is provided to extend over the element region R1 and the peripheral region R2. The second embedded layer 18B in the element region R1 is disposed between the wiring layer 10W and the semiconductor layer 10S, and covers a bottom surface (a surface facing the readout circuit substrate 20) of the semiconductor layer 10S as well as the bottom surface and the side surface of the first electrode 11. The second embedded layer 18B in the peripheral region R2 is disposed between the wiring layer 10W and the first embedded layer 18A. A constituent material of the first embedded layer 18A and a constituent material of the second embedded layer 18B may be the same or different. A thickness of the first embedded layer 18A and a thickness of the second embedded layer 18B may be the same or different.

The insulating film 17 is provided in substantially one plane over the element region R1 and the peripheral region R2. The insulating film 17 is disposed between the semiconductor layer 10S and the second embedded layer 18B in the element region R1, and between the first embedded layer 18A and the second embedded layer 18B in the peripheral region R2.

It is possible to manufacture such a light-receiving element 4 in the following manner, for example. FIGS. 27A, 27B, 28, 29, 30A, and 30B illustrate manufacturing steps of the light-receiving element 4 in the order of steps.

First, in a manner similar to that described for the first embodiment above, the semiconductor layer 10S on the temporary substrate 33 is molded into the shape of a plurality of chips (FIG. 14B).

Next, as illustrated in FIG. 27A, the first embedded layer 18A is formed over the entire surface of the temporary substrate 33. The first embedded layer 18A is formed by, for example, forming a film of an insulating material so as to embed the semiconductor layer 10S over the entire surface of the temporary substrate 33 and thereafter planarizing the film of the insulating material by CMP. The first embedded layer 18A covering the periphery of the semiconductor layer 10S is thereby formed. At this time, the top surface of the semiconductor layer 10S may be exposed from the first embedded layer 18A.

After the first embedded layer 18A is formed, as illustrated in FIG. 27B, the diffusion regions 12A are formed in the semiconductor layer 10S using, for example, a mask formed of the insulating film 17. The insulating film 17 is formed on the first embedded layer 18A.

The mask for forming the diffusion regions 12A may be formed of the first embedded layer 18A as illustrated in FIG. 28, or may be formed of the first embedded layer 18A and the insulating film 17 as illustrated in FIG. 29.

After the diffusion regions 12A are formed in the semiconductor layer 10S, the first electrode 11 is formed in the opening of the insulating layer 17 as illustrated in FIG. 30A.

After the first electrode 11 is formed, as illustrated in FIG. 30B, the second embedded layer 18B is formed on the first embedded layer 18A to cover the first electrode 11. The second embedded layer 18B is formed by forming a film of an insulating material over the entire surface of the temporary substrate 33 and thereafter planarizing the film of the insulating material by CMP. The subsequent steps are performed in a manner similar to that described for the first embodiment above (FIGS. 28D, 28E, 28F, 28G, 28H, 28I, and 28J) to complete the light-receiving element 4.

As in the present modification example, the embedded layer 18 may be configured by a stacked structure of the first embedded layer 18A and the second embedded layer 18B. In this case also, it is possible to obtain effects similar to those of the first embodiment described above.

5. Modification Example 2

FIG. 31 illustrates a cross-sectional configuration of a main part of a light-receiving element (a light-receiving element 5) according to Modification Example 2 of the first to third embodiments described above. The light-receiving element 5 includes a color filter layer 41 and an on-chip lens (a condenser lens) 42 on the light entrance surface S1 (a surface opposite to the surface facing the readout circuit substrate 20) of the element substrate 10. Except for this point, the light-receiving element 5 has a configuration and effects similar to those of the light-receiving element 1. It is to be noted that in FIG. 31, a cross-sectional configuration based on the light-receiving element 1 illustrated in FIG. 1 is illustrated by way of example. Further, in FIG. 31, the passivation films 16A and 16B are illustrated collectively as a passivation film 16 for the sake of simplification.

For example, in the light-receiving element 5, the color filter layer 41 and the on-chip lens 42 are provided in this order on the passivation film 16 of the element substrate 10, with a planarization film 16C interposed therebetween. The color filter layer 41 may include an IR (Infrared) filter. Providing the color filter layer 41 makes it possible to obtain light reception data for a corresponding wavelength for each of the pixels P.

The on-chip lens 42 serves to condense light having entered the light-receiving element 1 to the photoelectric conversion layer 13. The on-chip lens 42 includes, for example, an organic material, silicon oxide (SiO$_2$), or the like. In the light-receiving element 5, the embedded layer 18 is provided in the peripheral region R2, and thus a step difference of the element substrate 10 between the element region R1 and the peripheral region R2 is reduced or eliminated, thus allowing for formation of the light entrance surface S1 that is planar. This enables formation of the on-chip lens 42 with high accuracy by using a photolithography step, for example. For example, the color filter layer 41 and the on-chip lens 42 are terminated in the element region R1. The planarization film 16C disposed between the passivation film 16 and the color filter layer 41 is provided, for example, from the element region R1 to the peripheral region R2, and is terminated in the peripheral region R2. The color filter layer 41, the on-chip lens 42, and the planarization film 16C may each be terminated at any position within the element region R1 or within the peripheral region R2.

As in the present modification example, the color filter layer 41 and the on-chip lens 42 may be provided on the light entrance surface S1 of the element substrate 10. In this case also, it is possible to obtain effects similar to those of the first embodiment described above. In addition, it is possible to easily form the on-chip lens 42 with high accuracy on the light entrance surface S1 planarized by the embedded layer 18.

6. Modification Example 3

FIGS. 32A, 32B, 32C, 32D, and 32E illustrate manufacturing steps of a light-receiving element (a light-receiving element 6 in FIG. 33) according to Modification Example 3 of the foregoing first to third embodiments in the order of steps. The light-receiving element 6 is manufactured by forming a cap layer (a cap layer 35 in FIG. 32A) for protecting the semiconductor layer 10S and thereafter bonding the semiconductor layer 10S to the temporary substrate 33 with the cap layer interposed therebetween. Except for this point, the light-receiving element 6 has a configuration similar to that of the light-receiving element 1, and workings and effects thereof are also similar to those of the light-receiving element 1. It is to be noted that in FIG. 33, a cross-sectional configuration based on the light-receiving element 1 illustrated in FIG. 1 is illustrated by way of example. Further, in FIG. 33, the passivation films 16A and 16B are illustrated collectively as a passivation film 16 for the sake of simplification.

It is possible to manufacture the light-receiving element 6 by using the cap layer 35 in the following manner, for example.

First, as illustrated in FIG. 32A, the semiconductor layer 10S and the cap layer 35 including i-type InGaAs, for example, are formed in this order by epitaxial growth on the growth substrate 31. As the semiconductor layer 10S, for example, the first contact layer 12 including n-type InP, the photoelectric conversion layer 13 including i-type or n-type InGaAs, and the second contact layer 14 including n-type InP are formed in this order.

The cap layer 35 serves to prevent the semiconductor layer 10S and the adhesive layer B for bonding the semiconductor layer 10S to the temporary substrate 33 from being in direct contact with each other. If the steps proceed while the adhesive layer B remains in contact with the semiconductor layer 10S, the characteristics of the semiconductor layer 10S can deteriorate. Alternatively, the semiconductor layer 10S can peel off from the temporary substrate 33. The semiconductor layer 10S can also peel off from the adhesive layer B. Providing the cap layer 35 between the semiconductor layer 10S and the adhesive layer B makes it possible to suppress the occurrence of such deterioration in characteristics, such film peeling, and the like. For the cap layer 35, any semiconductor material that is able to be epitaxially grown on the semiconductor layer 10S (more specifically, the second contact layer 14) may be used. For example, InGaAs, InAsSb, or the like may be used.

After the cap layer 35 is formed on the semiconductor layer 10S, the adhesive layer B including silicon oxide (SiO$_2$), for example, is formed on the cap layer 35.

Subsequently, as illustrated in FIG. 32B, the growth substrate 31 is bonded to the temporary substrate 33 having a large diameter with the adhesive layer B interposed therebetween. At this time, the cap layer 35 is interposed between the adhesive layer B and the second contact layer 14. For the adhesive layer B, for example, tetraethoxysilane (TEOS), silicon oxide (SiO$_2$), or the like may be used.

Next, removal of the growth substrate 31, molding of the semiconductor layer 10S, formation of the diffusion regions 12A by impurity diffusion, formation of the first electrode 11, and formation of the embedded layer 18 are performed in this order in a manner similar to that described for the first embodiment above (see FIGS. 11A, 11B, 12A, 12B, 13A, 13B, 14A, 14B, 15, 16, 17A, 17B, and, 17C). Thereafter, as illustrated in FIG. 32C, the wiring layer 10W is formed on the embedded layer 18. In the present embodiment, the embedded layer 18 is formed to fill a step difference between the semiconductor layer 10S and the temporary substrate 33. This makes it possible to suppress the occurrence of a defect in the manufacturing steps resulting from the level difference, as with the light-receiving element 1. Further, the cap layer 35 is interposed between the adhesive layer B and the second contact layer 14 while the steps of removal of the growth substrate 31, formation of the diffusion regions 12A, formation of the wiring layer 10W, and the like are performed. This makes it possible to suppress the occurrence of deterioration in characteristics of the semiconductor layer 10S, film peeling, and the like.

After the wiring layer 10W is formed, the temporary substrate 33 is attached to the readout circuit substrate 20 with the wiring layer 10W interposed therebetween (FIG. 32D) in a manner similar to that described for the first embodiment above.

Next, as illustrated in FIG. 32E, the temporary substrate 33, the adhesive layer B, and the cap layer 35 are removed in this order to expose the second contact layer 14. The removal of the temporary substrate 33 is performed in a manner similar to that described for the first embodiment above. The adhesive layer B and the cap layer 35 may be removed by, for example, wet etching. For wet etching of the adhesive layer B, for example, HF (Hydrogen Fluoride), BHF (Buffered Hydrogen Fluoride), or the like may be used. For wet etching of the cap layer 35, for example, a mixed solution of an acid and an oxidizer may be used. As the acid, for example, HF, hydrochloric acid (HCl), a phosphoric acid ($H_3PO_4$), or the like may be used. As the oxidizer, for example, hydrogen peroxide water, ozone water, or the like may be used. The adhesive layer B and the cap layer 35 may be removed by dry etching; however, it is preferable to remove them by wet etching (described later).

FIG. 34A is an example of an enlarged view of a portion R illustrated in FIG. 32E. For example, a region where the adhesive layer B and the cap layer 35 are to be removed is smaller in area than the semiconductor layer 10S in a plan view. Accordingly, the cap layer 35 and the adhesive layer B remain on a peripheral edge on the side of the light entrance surface S1 (the surface opposite to the surface facing the readout circuit substrate 20) of the semiconductor layer 10S, more specifically, on the end part of the second contact layer 14. It is to be noted that the cap layer 35 may be recessed or protrude with respect to the adhesive layer B.

Steps after the removal of the cap layer 35 are performed in a manner similar to that described for the first embodiment above (see FIGS. 17H, 17I, and 17J) to complete the light-receiving element 6.

FIG. 33 illustrates an example of a cross-sectional configuration of a main part of the light-receiving element 6 manufactured in this manner.

FIG. 34B is an example of an enlarged view of the portion R illustrated in FIG. 33. As illustrated, the second electrode 15 and the passivation film 16 may be formed under the condition where the cap layer 35 and the adhesive layer B remain. At this time, the second electrode 15 is in contact with the second contact layer 14 and in contact with the cap layer 35 and the adhesive layer B. The embedded layer 18 protrudes on the side of the light entrance surface S1 (opposite to the readout circuit substrate 20) relative to the semiconductor layer 10S by an amount corresponding to thicknesses of the cap layer 35 and the adhesive layer 13.

An opening formed by removing the adhesive layer B and the cap layer 35, that is, an opening that exposes the second contact layer 14 preferably has a tapered shape as illustrated in FIG. 34C. Forming the second electrode 15 in the opening having such a tapered shape improves the coverage of the second electrode 15. For example, removing the adhesive layer B and the cap layer 35 by wet etching forms the opening having a tapered shape. It is therefore preferable that the adhesive layer B and the cap layer 35 be removed by wet etching.

FIG. 35A is another example of an enlarged view of the portion R illustrated in FIG. 32E, and FIG. 35B is another example of an enlarged view of the portion R illustrated in FIG. 33. As illustrated, an area of the region where the adhesive layer B and the cap layer 35 are to be removed may be equal to the area of the semiconductor layer 10S in a plan view, for example. The cap layer 35 on the end part of the second contact layer 14 is thus removed. In the light-receiving element 6 thus formed, there is a displacement between a top surface (a surface on the side of the light entrance surface S1) of the second contact layer 14 and a bottom surface (a surface on the side of the readout circuit substrate 20) of the adhesive layer B to form a level difference therebetween due to the cap layer 35. Moreover, the second electrode 15 is in contact with the second contact layer 14 and in contact with the adhesive layer B.

The opening formed by removing the adhesive layer B and the cap layer 35, that is, the opening in which the second contact layer 14 is exposed preferably has a tapered shape as illustrated in FIG. 35C.

FIG. 36A is another example of an enlarged view of the portion R illustrated in FIG. 32E, and FIG. 36B is another example of an enlarged view of the portion R illustrated in FIG. 33. As illustrated, the area of the region where the adhesive layer B and the cap layer 35 are to be removed may be larger than the area of the semiconductor layer 10S in a plan view, for example. The cap layer 35 on the end part of the second contact layer 14 is thus removed. In the light-receiving element 6 thus formed, a recess 18R resulting from etching is formed between the end surface of the semiconductor layer 10S and the embedded layer 18. Moreover, the second electrode 15 is in contact with the second contact layer 14 and fills the recess 18R, and the second electrode 15 is also in contact with the adhesive layer B.

The opening formed by removing the adhesive layer B and the cap layer 35, that is, the opening in which the second contact layer 14 is exposed preferably has a tapered shape as illustrated in FIG. 36C.

The region where the adhesive layer B and the cap layer 35 are to be removed may be further made larger to remove the adhesive layer B together with the cap layer 35, as illustrated in FIG. 36D.

In the light-receiving element 6 formed by such a method also, the embedded layer 18 is formed in a manner similar to that described for the light-receiving element 1 above, and it is thus possible to suppress the occurrence of a defect in the manufacturing steps resulting from the level difference between the semiconductor layer 10S and the temporary substrate 33. Moreover, the formation of the cap layer 35 makes it possible to prevent the semiconductor layer 10S (the second contact layer 14) from being in contact with the adhesive layer B.

In the light-receiving element 6, the cap layer 35 may remain on the end part of the second contact layer 14 (FIGS. 34A, 34B, and 34C), or the cap layer 35 may be completely removed. In the light-receiving element 6 in which the cap layer 35 is completely removed, for example, either the level difference between the top surface of the second contact layer 14 and the bottom surface of the adhesive layer B (FIGS. 35A, 35B, and 35C) or the recess 18R between the end surface of the semiconductor layer 10S and the embedded layer 18 (FIGS. 36A, 36B, and 36D) is provided. In the light-receiving element 6, the embedded layer 18 protrudes on the side of the light entrance surface S1 relative to the semiconductor layer 10S by the amount corresponding to the thicknesses of the cap layer 35 and the adhesive layer B.

7. Modification Example 4

FIGS. 37 and 38 schematically illustrate cross-sectional configurations of light-receiving elements (light-receiving elements 7A and 7B) according to Modification Example 4 of the second and third embodiments described above. In the light-receiving elements 7A and 7B, a first contact layer 52, a photoelectric conversion layer 53, and a second contact layer 54 constitute a semiconductor layer 50S shared by a plurality of pixels P, and a second electrode 55 having a light-blocking property is provided between every adjacent pixels P on the side of the light entrance surface S1 of the semiconductor substrate 50S. Except for this point, the light-receiving elements 7A and 7B each have a configuration similar to that of the light-receiving element 1, and workings and effects thereof are also similar to those of the light-receiving element 1.

An element substrate 50 includes interlayer insulating films 58B and 58A, the first contact layer 52, the photoelectric conversion layer 53, the second contact layer 54, and the second electrode 55 in this order from a position close to a readout circuit substrate 60, as with the first embodiment described above. Further, a passivation film 59 is provided over the second contact layer 54, the second electrode 55, an embedded layer 57, and a through electrode 57V. The interlayer insulating films 58 are provided with a wiring layer 50W including a first electrode 51. The wiring layer 50W includes contact electrodes 58EA and 58EB and a dummy electrode 58ED in the interlayer insulating films 58A and 58B. A surface of the semiconductor layer 50S opposed to the wiring layer 50W and an end surface (a side surface) of the semiconductor layer 50S are covered with an insulating film 56. The readout circuit substrate 60 includes a wiring layer 60W in contact with the bonding surface S2 of the element substrate 50 and a semiconductor substrate 61 opposed to the element substrate 50 with the wiring layer 60W interposed therebetween.

The second electrode 55 has a structure in which a cap layer 55A and a light-blocking film 55B are stacked in this order, and is provided, for example, in a lattice shape between the pixels P adjacent to each other and provided over the second contact layer 54 (the light entrance surface side). By providing the second electrode 55 in the lattice shape, the resistance of the extraction of electrons is reduced, the demand for reduction in resistance of the second contact layer 54 is reduced, and it becomes possible to reduce the thickness of the second contact layer 54. Like the electrically-conductive film 35B of the second embodiment described above, the light-blocking film 55B may be formed using an aluminum (Al) film, for example. Alternatively, a tungsten (W) film, a copper (Cu) film, a silver (Ag) film, or the like may be used. It is preferable that the light-blocking film 55B be stacked on the cap layer 55A with a barrier metal film such as a titanium (Ti) film, a titanium nitride (TiN) film, or the like interposed therebetween, for example. As a result, an ohmic contact is formed between the cap layer 55A and the light-blocking film 55B.

For example, the light-blocking film 37 including a black resist may be stacked on the light-blocking film 55B in the vicinity of the peripheral region R2 in the element region R1, as illustrated in FIG. 38.

The second electrode 55 is formed by, for example, patterning the light-blocking film 55B by dry etching and thereafter patterning the cap layer 55A by wet etching using the light-blocking film 55B as a metal mask. In a case where the cap layer 55A is patterned by wet etching as described above, the cross-sectional shape of the cap layer 55A (for example, an N+InGaAs layer) patterned into a lattice shape has characteristics that vary depending on crystallographic plane orientations. Typically, an InGaAs/InP crystal in a 100 plane is processed into an inverse taper in a (011) plane cross-sectional direction, and into a forward taper in the direction rotated 90° with respect to the (011) plane.

As with the first embodiment described above, the readout circuit substrate 60 is a so-called ROIC (Readout integrated circuit), and includes the wiring layer 60W in contact with the bonding surface S2 of the element substrate 50, and the semiconductor substrate 61 opposed to the element substrate 50 with the wiring layer 60W interposed therebetween. The semiconductor substrate 61 serves to support the wiring layer 60W, and includes, for example, silicon (Si). The wiring layer 60W includes, for example, contact electrodes 62EA and 62EB, a dummy electrode 62ED, a pixel circuit 62CA, a wiring line 62CB, and a pad electrode 62P in interlayer insulating films 62 (62A and 62B). The interlayer insulating films 62A and 62B each include, for example, an inorganic insulating material. Examples of the inorganic insulating material include silicon nitride (SiN), aluminum oxide ($Al_2O_3$), silicon oxide ($SiO_2$), and hafnium oxide ($HfO_2$). The interlayer insulating films 62A and 62B may be formed using inorganic insulating materials different from each other or the same inorganic insulating material.

As described above, by forming the second electrode having a light-blocking property between the pixels P adjacent to each other, it is possible to reduce leakage of light from the adjacent pixel region, in addition to achieving the effects of the second embodiment described above. Further, the second electrode 55 has a stacked structure of the cap layer 55A and the light-blocking film 55B that is formed using, for example, a metal film. By providing the configuration in which the cap layer 55A and the light-blocking film 55B are stacked in this order as described above, it becomes unnecessary to form a transparent electrode or to increase a thickness of the second contact layer 54. Further, damage to a photoelectric conversion section (specifically, the second contact layer 54) in patterning the light-blocking film 55B is reduced. Accordingly, it is possible to improve sensitivity.

8. Modification Example 5

FIG. 39 schematically illustrates a cross-sectional configuration of a light-receiving element (a light-receiving element 8) according to Modification Example 5 of the first to third embodiments described above. The light-receiving element 8 has a stacked structure of the element substrate 10 including a compound semiconductor material and semiconductor layers (a semiconductor layer 71S and a second semiconductor layer) including silicon (Si). Except for this point, the light-receiving element 8 has a configuration similar to that of the light-receiving element 1, and workings and effects thereof are also similar to those of the light-receiving element 1. It is to be noted that in FIG. 39, a cross-sectional configuration based on the light-receiving element 1 illustrated in FIG. 1 is illustrated by way of example. Further, in FIG. 39, the passivation films 16A and 16B are illustrated collectively as a passivation film 16 for the sake of simplification.

The light-receiving element 8 includes a wiring layer 71W electrically coupled to the semiconductor layer 71S, the semiconductor layer 71S, the color filter layer 41, and an on-chip lens in this order on the light entrance surface S1 of the element substrate 10.

The semiconductor layer 71S is provided with a photodiode PD having a p-n junction for each of the pixels P. The wiring layer 71W includes a plurality of wiring lines. The wiring layer 71W allows, for example, signal charges generated in the photodiode PD to migrate to the readout circuit substrate 20 for each of the pixels P.

The light-receiving element 8 performs photoelectric conversion of light of wavelengths in, for example, the visible region and the infrared region. For example, light of a wavelength in the visible region enters the semiconductor layer 71S via the on-chip lens 42 and the color filter layer 41, and is photoelectrically converted in the photodiode PD. Meanwhile, light of a wavelength in the infrared region is transmitted through the semiconductor layer 71S, and is photoelectrically converted in the photoelectric conversion layer 13 of the element substrate 10. Signal charges generated in the photodiode PD and signal charges generated in the photoelectric conversion layer 13 are read at the readout circuit substrate 20.

In the light-receiving element 8 of the present embodiment also, the embedded layer 18 is formed in a manner similar to that described for the light-receiving elements 1 and 2 above, and this makes it possible to suppress the occurrence of a defect in the manufacturing steps resulting from the step difference between the semiconductor layer 10S and the temporary substrate 33. In addition, because of the semiconductor layer 71S being stacked over the element substrate 10, it is possible to perform photoelectric conversion of light of wavelengths in the visible region and the infrared region in a single pixel P. This allows a larger amount of information to be obtainable from the single pixel P.

9. Application Example 1

The light-receiving element 1 (or the light-receiving element 1, 2, 3, 4, 5, 6, 7A, 7B, or 8; hereinafter collectively referred to as the light-receiving element 1) described in any of the embodiments and the like above is to be applied to an imaging element, for example. The imaging element is, for example, an infrared image sensor.

10. Application Example 2

The imaging element described above is applicable to various types of electronic apparatuses such as a camera that allows for imaging of the infrared region, for example. FIG. 40 illustrates a schematic configuration of an electronic apparatus 9 (a camera) as an example thereof. The electronic apparatus 9 is a camera that allows for shooting of a still image or a moving image, for example. The electronic apparatus 9 includes an imaging element 9A configured by the light-receiving element 1, an optical system (an optical lens) 310, a shutter device 311, a driver 313, and a signal processor 312. The driver 313 drives the imaging element 9A and the shutter device 311.

The optical system 310 guides image light (entering light) from a subject to the imaging element 9A. The optical system 310 may include a plurality of optical lenses. The shutter device 311 controls a period in which the imaging element 9A is irradiated with the light and a period in which the light is blocked. The driver 313 controls a transfer operation of the imaging element 9A and a shutter operation of the shutter device 311. The signal processor 312 performs various types of signal processing on a signal outputted from the imaging element 9A. An image signal Dout having been subjected to the signal processing is stored in a storage medium such as a memory, or is outputted to a monitor or the like.

Further, the light-receiving element 1 described in the present embodiment and the like is also applicable to the following electronic apparatuses (a capsule endoscope and a mobile body such as a vehicle).

11. Practical Application Example 1 (Endoscopic Surgery System)

The technology according to the present disclosure is applicable to various products. For example, the technology according to the present disclosure may be applied to an endoscopic surgery system.

FIG. 41 is a view depicting an example of a schematic configuration of an endoscopic surgery system to which the technology according to an embodiment of the present disclosure (present technology) can be applied.

In FIG. 41, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated timedivisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 42 is a block diagram depicting an example of a functional configuration of the camera head 11102 and the CCU 11201 depicted in FIG. 41.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of one example of the endoscopic surgery system to which the technology according to the present disclosure may be applied. The technology according to the present disclosure may be applied to the image pickup unit 11402 among the components of the configuration described above. Applying the technology according to the present disclosure to the image pickup unit 11402 makes it possible to obtain a clearer image of the surgical region. Hence, it is possible for the surgeon to confirm the surgical region with certainty.

Note that the description has been given above of the endoscopic surgery system as one example. The technology according to the present disclosure may also be applied to, for example, a micrographic surgery system and the like.

12. Practical Application Example 2 (Mobile Body)

The technology according to the present disclosure is applicable to various products. For example, the technology according to the present disclosure may be achieved in the form of an apparatus to be mounted to a mobile body of any kind. Examples of the mobile body may include an automobile, an electric vehicle, a hybrid electric vehicle, a motorcycle, a bicycle, a personal mobility, an airplane, a drone, a vessel, and a robot.

FIG. 43 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 43, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 43, an audio speaker 12061, a display section 12062, and an instrument panel 12063 are illustrated as the output device. The display section 12062 may, for example, include at least one of an on-board display and a head-up display.

FIG. 44 is a diagram depicting an example of the installation position of the imaging section 12031.

In FIG. 44, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 44 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system to which the technology according to the present disclosure may be applied. The technology according to the present disclosure may be applied to the imaging section 12031 among the components of the configuration described above. Applying the technology according to the present disclosure to the imaging section 12031 makes it possible to obtain a captured image that is easier to see. Hence, it is possible to reduce the fatigue of the driver.

Moreover, the light-receiving element 1 described in the present embodiment and the like may also be applicable to electronic apparatuses including a surveillance camera, a biometric authentication system, a thermograph, and the like. Examples of the surveillance camera may include night vision systems (night scopes). Application of the light-receiving element 1 to the surveillance camera makes it possible to recognize a pedestrian, an animal, and the like at night from a distance. Moreover, application of the light-receiving element 1 to a vehicle-mounted camera reduces influences of a headlight and weather. For example, it is possible to capture an image by shooting without influences of smoke, fog, and the like. Further, it is possible to recognize a shape of an object. Furthermore, the thermograph allows for contactless temperature measurement. The thermograph allows for detection of a temperature distribution and heat generation. In addition, the light-receiving element 1 may be applicable to electronic apparatuses that detect, for example, fire, water, gas, or the like.

Although the description has been given with reference to the first to third embodiments, Modification Examples 1 to 5, the application examples, and the practical application examples, the contents of the present disclosure are not limited to the foregoing embodiments and the like, and may be modified in a variety of ways. For example, Modification Examples 1 to 3 and 5 above, which have been described as modification examples of the foregoing first embodiment, are also applicable as modification examples of each of the second embodiment and the third embodiment.

Further, the layer configuration of any of the light-receiving elements described in the foregoing embodiments and the like is illustrative, and may further include any other layer. The materials and thicknesses of the respective layers are also illustrative and are not limited to those described above. For example, the foregoing embodiments and the like have been described with reference to an example in which the first contact layer 12, the photoelectric conversion layer 13, and the second contact layer 14 constitute the semiconductor layer 10S. However, it suffices that the semiconductor layer 10S includes the photoelectric conversion layer 13. For example, the first contact layer 12 and the second contact layer 14 may not be provided, or alternatively any other layer may be included.

Further, the foregoing embodiments and the like have been described with reference to an example in which the signal charges are holes for the sake of convenience; however, the signal charges may be electrons. For example, the diffusion regions may include n-type impurities.

In addition, the foregoing embodiments and the like have been described with reference to the light-receiving element that is a specific example of the semiconductor element according to the present technology; however, the semiconductor element according to the present technology may be other than the light-receiving element. For example, the semiconductor element according to the present technology may be a light-emitting element.

Further, the effects described in the foregoing embodiments and the like are illustrative and non-limiting. Other effects may be achieved, or other effects may further be included.

It is to be noted that the present disclosure may have configurations as described below. According to a first semiconductor element of the present technology having the following configurations, the insulating layer having a non-reducing property is provided over the second electrode having a light-transmitting property. This improves adhesion between the second electrode and the insulating layer. According to a second semiconductor element of the present technology, the electrically-conductive film provided on the insulating layer and electrically coupled to the second electrode via the opening provided in the vicinity of the peripheral region in the element region is formed using aluminum (Al). This allows the electrically-conductive film to be reduced in thickness. According to a third semiconductor element of the present technology, the light-blocking film including a black resist is further provided on the electrically-conductive film provided on the insulating layer and electrically coupled to the second electrode via the opening provided in the vicinity of the peripheral region in the element region. This allows the electrically-conductive film to be reduced in thickness. Accordingly, it is possible to improve the manufacturing yield.

(1)

A semiconductor element including:
an element substrate including an element region in which a wiring layer and a first semiconductor layer including a compound semiconductor material are provided as a stack, and a peripheral region outside the element region;
a readout circuit substrate opposed to the first semiconductor layer with the wiring layer interposed therebetween, and electrically coupled to the first semiconductor layer with the wiring layer interposed therebetween;
a first electrode provided in the wiring layer and electrically coupled to the first semiconductor layer;
a second electrode opposed to the first electrode with the first semiconductor layer interposed therebetween; and
an insulating layer provided on the second electrode and having a non-reducing property.

(2)

The semiconductor element according to (1), in which the insulating layer includes any one of an oxide ($M_xO_y$), a nitride ($M_xN_y$), and an oxynitride ($M_xO_yN_z$)

(M is any one of silicon (Si), titanium (Ti), hafnium (Hf), zirconium (Zr), and yttrium (Y); x, y, and z are integers of 1 or greater).

(3)

The semiconductor element according to (1) or (2), in which the insulating layer includes an oxide film having a film density of higher than or equal to 2.0 g/cm³ and lower than or equal to 8.0 g/cm³.

(4)

The semiconductor element according to any one of (1) to (3), in which the insulating layer has a multilayer structure.

(5)

The semiconductor element according to any one of (1) to (4), in which the insulating layer has an opening in a vicinity of the peripheral region in the element region,
the semiconductor element further including an electrically-conductive film above the insulating layer in the vicinity of the peripheral region, the electrically-conductive film being electrically coupled to the second electrode via the opening.

(6)

The semiconductor element according to (5), in which the electrically-conductive film includes aluminum (Al).

(7)

The semiconductor element according to (6), further including a barrier metal between the second electrode and the electrically-conductive film in the opening.

(8)

The semiconductor element according to any one of (5) to (7), in which the electrically-conductive film is provided to extend from the vicinity of the peripheral region in the element region to the peripheral region.

(9)

The semiconductor element according to any one of (5) to (8), in which
the element substrate further includes a through hole in the peripheral region, the through hole penetrating the element substrate to reach the readout circuit substrate, and
the electrically-conductive film is electrically coupled to the readout circuit substrate via the through hole.

(10)

The semiconductor element according to any one of (5) to (9), in which the electrically-conductive film has a light-blocking property.

(11)

The semiconductor element according to any one of (5) to (10), further including a light-blocking film above the electrically-conductive film, the light-blocking film including a black resist.

(12)

The semiconductor element according to (11), in which an end surface of the light-blocking film on a side of the element region extends more forward into the element region than an end surface of the electrically-conductive film on the side of the element region.

(13)

The semiconductor element according to any one of (1) to (12), in which the peripheral region of the element substrate has a bonding surface to the readout circuit substrate.

(14)

The semiconductor element according to (13), in which the element region of the element substrate is bonded to the readout circuit substrate on a same plane as the bonding surface of the peripheral region.

(15)

The semiconductor element according to (13) or (14), in which the element substrate further includes an embedded layer in the peripheral region, the embedded layer surrounding the first semiconductor layer.

(16)

The semiconductor element according to any one of (1) to (15), in which the compound semiconductor material absorbs light of a wavelength in an infrared region.

(17)

The semiconductor element according to any one of (1) to (16), in which the compound semiconductor material includes any one of InGaAs, InAsSb, InAs, InSb, and HgCdTe.

(18)

The semiconductor element according to any one of (1) to (17), further including an on-chip lens on a side of a surface of the first semiconductor layer opposite to a surface thereof facing the readout circuit substrate.

(19)

A semiconductor element including:
an element substrate including an element region in which a wiring layer and a first semiconductor layer including a compound semiconductor material are provided as a stack, and a peripheral region outside the element region;
a readout circuit substrate opposed to the first semiconductor layer with the wiring layer interposed therebetween, and electrically coupled to the first semiconductor layer with the wiring layer interposed therebetween;
a first electrode provided in the wiring layer and electrically coupled to the first semiconductor layer;
a second electrode opposed to the first electrode with the first semiconductor layer interposed therebetween;
an insulating layer provided on the second electrode and having an opening in a vicinity of the peripheral region in the element region; and an electrically-conductive film including aluminum (Al), provided above the insulating layer and electrically coupled to the second electrode via the opening.

(20) A semiconductor element including:

an element substrate including an element region in which a wiring layer and a first semiconductor layer including a compound semiconductor material are provided as a stack, and a peripheral region outside the element region;

a readout circuit substrate opposed to the first semiconductor layer with the wiring layer interposed therebetween, and electrically coupled to the first semiconductor layer with the wiring layer interposed therebetween;

a first electrode provided in the wiring layer and electrically coupled to the first semiconductor layer;

a second electrode opposed to the first electrode with the first semiconductor layer interposed therebetween;

an insulating layer provided on the second electrode and having an opening in a vicinity of the peripheral region in the element region;

an electrically-conductive film provided above the insulating layer and electrically coupled to the second electrode via the opening; and a light-blocking film provided on the electrically-conductive film and including a black resist.

This application claims priority from Japanese Patent Application No. 2018-245180 filed with the Japan Patent Office on Dec. 27, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor element, comprising:
an element substrate including:
an element region including a wiring layer and a first semiconductor layer as a stack, wherein the first semiconductor layer includes a compound semiconductor material, and
a peripheral region outside the element region;
a readout circuit substrate opposed to the first semiconductor layer, wherein
the wiring layer is between the readout circuit substrate and the first semiconductor layer, and
the readout circuit substrate is electrically coupled to the first semiconductor layer with the wiring layer;
a first electrode in the wiring layer, wherein the first electrode is electrically coupled to the first semiconductor layer;
a second electrode opposed to the first electrode with the first semiconductor layer therebetween; and
an insulating layer on the second electrode, wherein
the insulating layer has a non-reducing property,
the insulating layer has a multilayer structure,
the multilayer structure comprises a first interlayer insulating film and a second interlayer insulating film,
the first interlayer insulating film is on a side of a first surface of the first semiconductor layer, and
the second interlayer insulating film is on a second surface of the readout circuit substrate.

2. The semiconductor element according to claim 1, wherein
the insulating layer includes one of an oxide (MxOy), a nitride (MxNy), or an oxynitride (MxOyNz),
M is one of silicon (Si), titanium (Ti), hafnium (Hf), zirconium (Zr), or yttrium (Y), and
x, y, and z are integers greater than or equal to 1.

3. The semiconductor element according to claim 1, wherein the insulating layer includes an oxide film having a film density of higher than or equal to 2.0 g/cm$^3$ and lower than or equal to 8.0 g/cm$^3$.

4. The semiconductor element according to claim 1, wherein
the insulating layer has an opening in a vicinity of the peripheral region in the element region,
the semiconductor element further comprises an electrically-conductive film above the insulating layer in the vicinity of the peripheral region, and
the electrically-conductive film is electrically coupled to the second electrode via the opening.

5. The semiconductor element according to claim 4, wherein the electrically-conductive film includes aluminum (Al).

6. The semiconductor element according to claim 5, further comprising a barrier metal between the second electrode and the electrically-conductive film in the opening.

7. The semiconductor element according to claim 4, wherein the electrically-conductive film extends from the vicinity of the peripheral region in the element region to the peripheral region.

8. The semiconductor element according to claim 4, wherein
the element substrate further includes a through hole in the peripheral region,
the through hole penetrates the element substrate to reach the readout circuit substrate, and
the electrically-conductive film is electrically coupled to the readout circuit substrate via the through hole.

9. The semiconductor element according to claim 4, wherein the electrically-conductive film has a light-blocking property.

10. The semiconductor element according to claim 4, further comprising a light-blocking film above the electrically-conductive film, wherein the light-blocking film includes a black resist.

11. The semiconductor element according to according claim 10, wherein an end surface of the light-blocking film on a side of the element region extends more forward into the element region than an end surface of the electrically-conductive film on the side of the element region.

12. The semiconductor element according to claim 1, wherein
the peripheral region of the element substrate has a bonding surface, and
the bonding surface is in contact with the readout circuit substrate.

13. The semiconductor element according to claim 12, wherein the element region of the element substrate is bonded to the readout circuit substrate on a same plane as the bonding surface of the peripheral region.

14. The semiconductor element according to claim 12, wherein
the element substrate further includes an embedded layer in the peripheral region, and
the embedded layer surrounds the first semiconductor layer.

15. The semiconductor element according to claim 1, wherein the compound semiconductor material absorbs light of a wavelength in an infrared region.

16. The semiconductor element according to claim 1, wherein the compound semiconductor material comprises one of InGaAs, InAsSb, InAs, InSb, or HgCdTe.

17. The semiconductor element according to claim 1, further comprising an on-chip lens on the side of the first surface of the first semiconductor layer opposite to the second surface of the readout circuit substrate.

18. A semiconductor element, comprising:
an element substrate including:
 an element region including a wiring layer and a first semiconductor layer as a stack, wherein the first semiconductor layer includes a compound semiconductor material, and
 a peripheral region outside the element region;
a readout circuit substrate opposed to the first semiconductor layer, wherein
 the wiring layer is between the readout circuit substrate and the first semiconductor layer, and
 the readout circuit substrate is electrically coupled to the first semiconductor layer with the wiring layer;
a first electrode in the wiring layer, wherein the first electrode is electrically coupled to the first semiconductor layer;
a second electrode opposed to the first electrode with the first semiconductor layer interposed therebetween;
an insulating layer on the second electrode, wherein
 the insulating layer has an opening in a vicinity of the peripheral region in the element region,
 the insulating layer has a multilayer structure,
 the multilayer structure comprises a first interlayer insulating film and a second interlayer insulating film,
 the first interlayer insulating film is on a side of a first surface of the first semiconductor layer, and
 the second interlayer insulating film is on a second surface of the readout circuit substrate; and
an electrically-conductive film above the insulating layer, wherein the electrically-conductive film includes aluminum (Al) and is electrically coupled to the second electrode via the opening.

19. A semiconductor element, comprising:
an element substrate including:
 an element region including a wiring layer and a first semiconductor layer as a stack, wherein the first semiconductor layer includes a compound semiconductor material, and
 a peripheral region outside the element region;
a readout circuit substrate opposed to the first semiconductor layer, wherein
 the wiring layer is between the readout circuit substrate and the first semiconductor layer, and
 the readout circuit substrate is electrically coupled to the first semiconductor layer with the wiring layer;
a first electrode in the wiring layer, wherein the first electrode is electrically coupled to the first semiconductor layer;
a second electrode opposed to the first electrode with the first semiconductor layer interposed therebetween;
an insulating layer on the second electrode, wherein
 the insulating layer has an opening in a vicinity of the peripheral region in the element region,
 the insulating layer has a multilayer structure,
 the multilayer structure comprises a first interlayer insulating film and a second interlayer insulating film,
 the first interlayer insulating film is on a side of a first surface of the first semiconductor layer, and
 the second interlayer insulating film is on a second surface of the readout circuit substrate;
an electrically-conductive film above the insulating layer, wherein the electrically-conductive film is electrically coupled to the second electrode via the opening; and
a light-blocking film on the electrically-conductive film, wherein the light-blocking film includes a black resist.

* * * * *